(12) United States Patent
Jung et al.

(10) Patent No.: US 9,741,949 B2
(45) Date of Patent: Aug. 22, 2017

(54) AMINE-BASED COMPOUND AND ORGANIC LIGHT EMITTING DIODE COMPRISING THE SAME

(71) Applicant: Samsung Display Co., Ltd., Gyeonggi-do (KR)

(72) Inventors: Hye-Jin Jung, Yongin (KR); Seok-Hwan Hwang, Yongin (KR); Young-Kook Kim, Yongin (KR); Jun-Ha Park, Yongin (KR); Eun-Young Lee, Yongin (KR); Jin-O Lim, Yongin (KR); Sang-Hyun Han, Yongin (KR); Eun-Jae Jeong, Yongin (KR); Soo-Yon Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 658 days.

(21) Appl. No.: 14/165,864

(22) Filed: Jan. 28, 2014

(65) Prior Publication Data

US 2014/0209878 A1   Jul. 31, 2014

(30) Foreign Application Priority Data

Jan. 30, 2013   (KR) .................. 10-2013-0010716

(51) Int. Cl.
*H01L 51/00* (2006.01)
*H01L 51/50* (2006.01)

(52) U.S. Cl.
CPC ...... *H01L 51/0094* (2013.01); *H01L 51/0059* (2013.01); *H01L 51/0072* (2013.01); *H01L 51/0081* (2013.01); *H01L 51/5012* (2013.01); *H01L 51/5056* (2013.01)

(58) Field of Classification Search
CPC ............ H01L 51/0094; H01L 51/0059; H01L 51/0072; H01L 51/0081; H01L 51/5012; H01L 51/5056
See application file for complete search history.

(56) References Cited

U.S. PATENT DOCUMENTS

| | | | |
|---|---|---|---|
| 7,053,255 B2 | 5/2006 | Ikeda et al. | |
| 7,233,019 B2 | 6/2007 | Ionkin et al. | |
| 7,571,894 B2 | 8/2009 | Sotoyama | |
| 8,846,213 B2 * | 9/2014 | Kim ..................... | C07D 209/56 313/504 |
| 2011/0084256 A1 | 4/2011 | Kim et al. | |
| 2012/0012826 A1 * | 1/2012 | Kim ..................... | C07D 209/56 257/40 |

FOREIGN PATENT DOCUMENTS

| | | |
|---|---|---|
| JP | 2010-073987 | 4/2010 |
| KR | 10-2006-0006760 | 1/2006 |
| KR | 10-2011-0034103 | 4/2011 |
| KR | 10-2011-0039108 | 4/2011 |
| KR | 10-2012-0006811 | 1/2012 |
| WO | WO-2011/037429 A2 | 3/2011 |

* cited by examiner

*Primary Examiner* — Alexander Kollias
(74) *Attorney, Agent, or Firm* — Lee & Morse, P.C.

(57) ABSTRACT

An amine-based compound and an organic light-emitting diode including the same are provided.

19 Claims, 1 Drawing Sheet

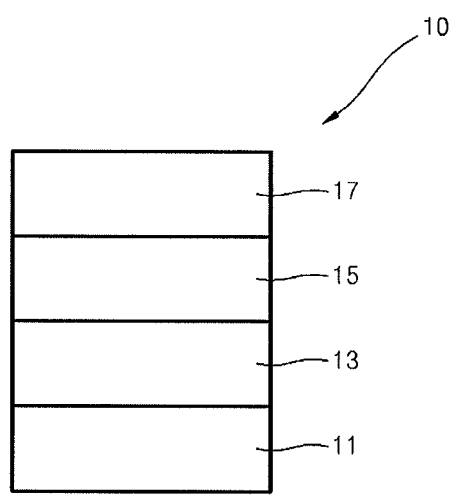

AMINE-BASED COMPOUND AND ORGANIC LIGHT EMITTING DIODE COMPRISING THE SAME

RELATED APPLICATIONS

This application claims the benefit of and priority under 35 U.S.C. §119 to Korean Patent Application No. 10-2013-0010716, filed on Jan. 30, 2013, in the Korean Intellectual Property Office, and entitled: "AMINE-BASED COMPOUND AND ORGANIC LIGHT EMITTING DIODE COMPRISING THE SAME," which is incorporated by reference herein in its entirety.

BACKGROUND

1. Field

Embodiments relate to a compound for organic light-emitting diode and an organic light-emitting diode including the same.

2. Description of the Related Art

Organic light-emitting diodes (OLEDs), which are self-emitting diodes, have advantages such as wide viewing angles, excellent contrast, quick response, high brightness, excellent driving voltage characteristics, and may provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

Holes injected from the anode move to the EML via the HTL, while electrons injected from the cathode move to the EML via the ETL. The holes and electrons recombine in the EML to generate excitons. When the excitons drop from an excited state to a ground state, light is emitted.

SUMMARY

Embodiments are directed to an amine-based compound represented by Formula 1 below:

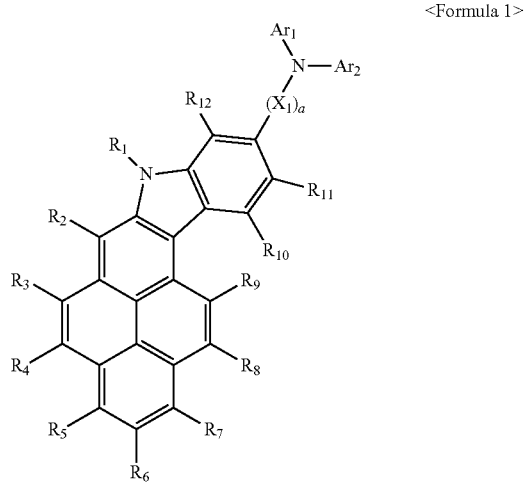

<Formula 1> wherein, in Formula 1, $X_1$ is selected from among a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

a is an integer of 1 to 5, wherein, when a is 2 or greater, the $X_1$s in a are identical to or differ from each other;

$Ar_1$, $Ar_2$, and $R_1$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group;

$R_2$ to $R_{12}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and $Si(Q_{11})(Q_{12})(Q_{13})$ (where $Q_{11}$ to $Q_{13}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, and the substituted $C_2$-$C_{60}$ heteroaryl group being selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group).

The amine-based compound may be a compound represented by Formula 1A below:

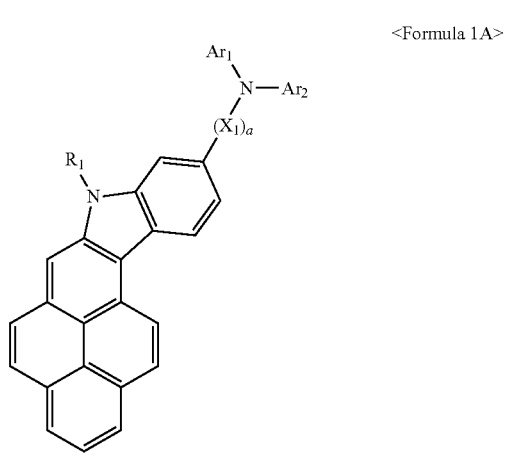

<Formula 1A> wherein, in Formula 1A, $X_1$, a, $Ar_1$, $Ar_2$, and $R_1$ may be the same as those defined above.

Embodiments are also directed to an organic light-emitting diode that includes: a first electrode; a second electrode disposed opposite to the first electrode; and an organic layer disposed between the first electrode and the second electrode and including an emission layer, wherein the organic layer includes at least one of the amine-based compounds of Formula 1.

BRIEF DESCRIPTION OF THE DRAWING

These and/or other aspects will become apparent and more readily appreciated from the following description of the example embodiments, taken in conjunction with the accompanying drawing in which:

The FIGURE is a schematic view of a structure of an organic light-emitting diode according to an example embodiment.

DETAILED DESCRIPTION

Reference will now be made in detail to example embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

According to an example embodiment, there is provided an amine-based compound represented by Formula 1 below:

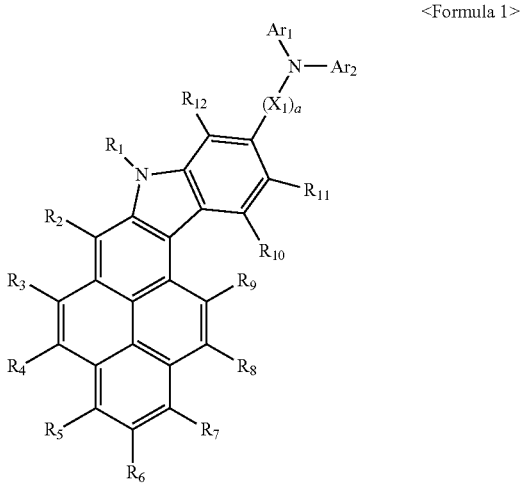

<Formula 1>

In Formula 1, $X_1$ is selected from among a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

a is an integer of 1 to 5, wherein, when a is 2 or greater, the $X_1$s in a are identical to or differ from each other;

$Ar_1$, $Ar_2$, and $R_1$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group;

$R_2$ to $R_{12}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{11}$)($Q_{12}$)($Q_{13}$) (where $Q_{11}$ to $Q_{13}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

At least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, and the substituted $C_2$-$C_{60}$ heteroaryl group may be selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group).

In Formula 1, $X_1$ is a linker between a pyrene-based core of Formula 1 and —N($Ar_1$)($Ar_2$). a is an integer of 1 to 5, thus at least one $X_1$ is in Formula 1.

In Formula 1, $X_1$ may be selected from among a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group.

For example, $X_1$ may be a group represented by one of Formulae 2-1 to 2-27 below, but is not limited thereto:

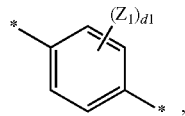

Formula 2-1

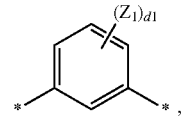

Formula 2-2

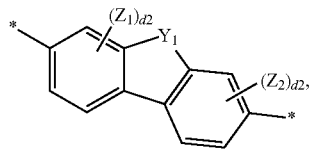

Formula 2-3

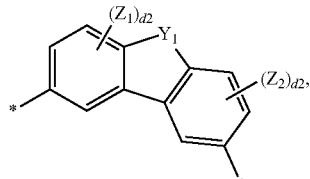

Formula 2-4

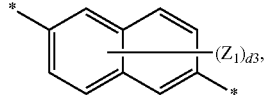

Formula 2-5

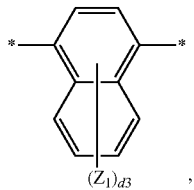

Formula 2-6

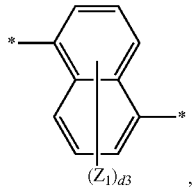

Formula 2-7

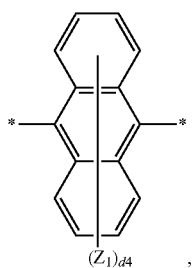

Formula 2-8

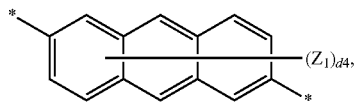

Formula 2-9

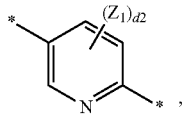

Formula 2-10

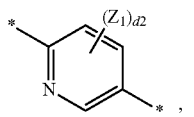

Formula 2-11

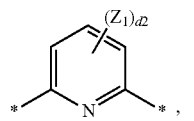

Formula 2-12

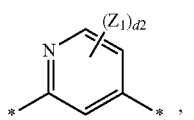

Formula 2-13

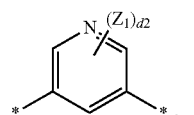

Formula 2-14

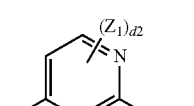

Formula 2-15

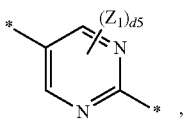
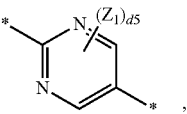
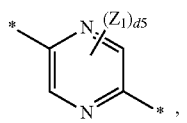
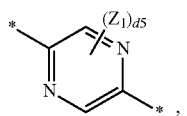
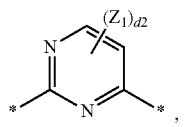
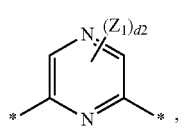
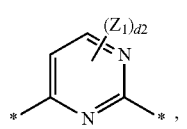
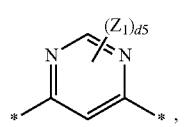
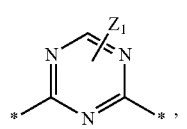
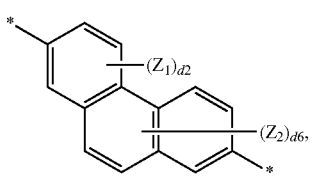
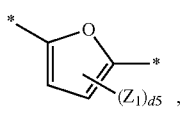
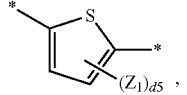

Formula 2-16
Formula 2-17
Formula 2-18
Formula 2-19
Formula 2-20
Formula 2-21
Formula 2-22
Formula 2-23
Formula 2-24
Formula 2-25
Formula 2-26
Formula 2-27

In Formulae 2-1 to 2-27, $Y_1$ may be O, S, a $C(R_{21})(R_{22})$, or $N(R_{23})$;

$Z_1$, $Z_2$, and $R_{21}$ to $R_{23}$ may each independently be selected from among, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group, and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{16}$)($Q_{17}$)($Q_{18}$) (where $Q_{16}$ to $Q_{18}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group;

d1 may be an integer of 1 to 4;

d2 may be an integer of 1 to 3;

d3 may be an integer of 1 to 6;

d4 may be an integer of 1 to 8;

d5 may be 1 or 2;

* may indicate a binding site of a pyrene-based core of Formula 1, or a binding site of adjacent $X_1$ of Formula 1; and

*' may indicate a binding site of "N" of Formula 1 or an adjacent $X_1$ of Formula 1.

In Formulae 2-1 to 2-27, $Z_1$, $Z_2$, and $R_{21}$ to $R_{23}$ may each independently be selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{16}$)($Q_{17}$)($Q_{18}$) (where $Q_{16}$ to $Q_{18}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some example embodiments, in Formulae 2-1 to 2-27, $Z_1$, $Z_2$, and $R_{21}$ to $R_{23}$ may each independently be selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, but are not limited thereto.

In some other example embodiments, $X_1$ in Formula 1 may be a group represented by one of Formulae 3-1 to 3-12 below:

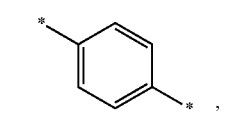
Formula 3-1

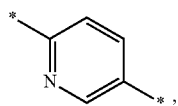
Formula 3-2

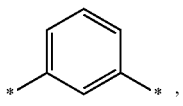
Formula 3-3

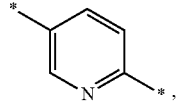
Formula 3-4

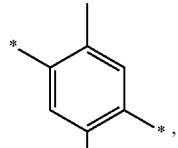
Formula 3-5

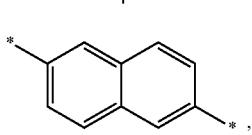
Formula 3-6

-continued

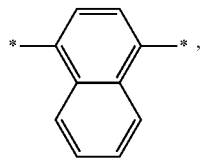
Formula 3-7

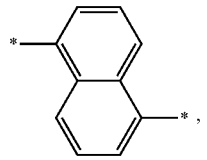
Formula 3-8

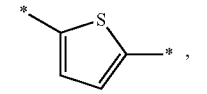
Formula 3-9

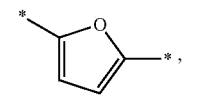
Formula 3-10

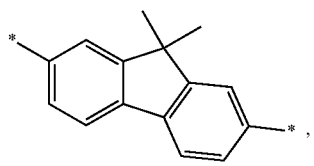
Formula 3-11

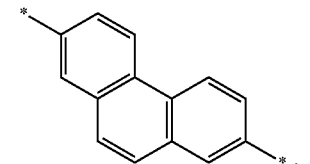
Formula 3-12

In Formulae 3-1 to 3-12, * indicates a binding site of a pyrene-based core of Formula 1 or a binding site of an adjacent $X_1$ of Formula 1, and *' indicates a binding site of "N" of Formula 1 or a binding site of an adjacent $X_1$ of Formula 1.

In Formula 1, a as a linker between the pyrene-based core of Formula 1 and —N($Ar_1$)($Ar_2$) is selected from among integers of 1 to 5. For example, a may be 1 or 2. When a is 2 or greater, the $X_1$s in a may be identical to or differ from each other.

In Formula 1, $Ar_1$, $Ar_2$, and $R_1$ may each independently be selected from among a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, and a substituted or unsubstituted benzocarbazolyl group.

For example, $Ar_1$ and $Ar_2$ may each independently be a group represented by one of Formulae 4-1 to 4-9:

Formula 4-1

Formula 4-2

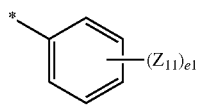

Formula 4-3

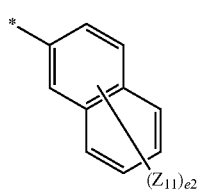

-continued

Formula 4-4

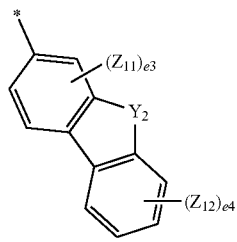

Formula 4-5

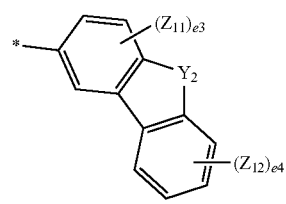

Formula 4-6

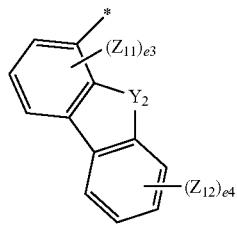

Formula 4-7

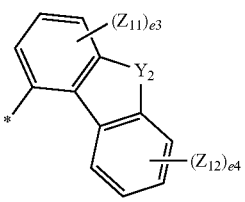

Formula 4-8

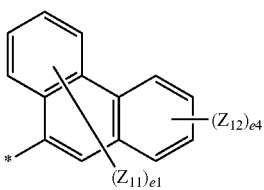

Formula 4-9

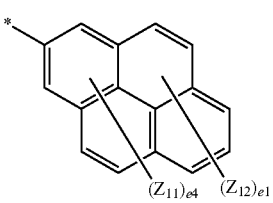

In Formulae 4-1 to 4-9, $Y_2$ may be O, S, a $C(R_{25})(R_{26})$, or $N(R_{27})$;

$Z_{11}$, $Z_{12}$, and $R_{25}$ to $R_{27}$ may each independently be selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

e1 may an integer of 1 to 5;
e2 may an integer of 1 to 7;
e3 may an integer of 1 to 3;
e4 may an integer of 1 to 4; and
* indicates a binding site of "N" of Formula 1.

For example, in Formulae 4-1 to 4-9, $Z_{11}$, $Z_{12}$, and $R_{25}$ to $R_{27}$ may each independently be selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

In some other example embodiments, $Ar_1$ and $Ar_2$ in Formula 1 may each independently a group represented by one of Formulae 5-1 to 5-7:

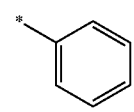

Formula 5-1

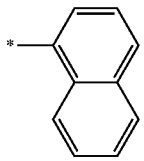

Formula 5-2

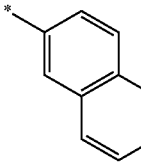

Formula 5-3

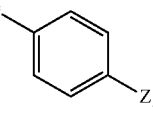

Formula 5-4

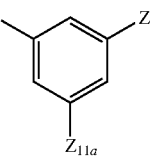

Formula 5-5

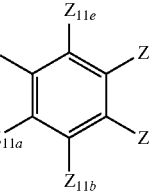

Formula 5-6

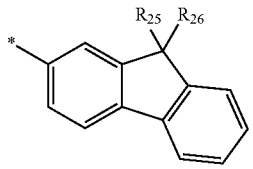

Formula 5-7

In Formulae 5-1 to 5-7, $Z_{11}$ and $Z_{11a}$ to $Z_{11e}$ may each independently be selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), but are not limited thereto.

In Formula 5-7, $R_{25}$ and $R_{26}$ may each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, but are not limited thereto.

In some other example embodiments, $R_1$ in Formula 1 may selected from among a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, and a hexacenyl group, and a phenyl group, a pentalenyl group, an indenylene group, a naphthyl group, an azulenyl group, a heptalenyl group, an indacenyl group, an acenaphthyl group, a fluorenyl group, a spiro-a fluorenyl group, a phenalenyl group, a phenanthrenyl group, an anthryl group, a fluoranthenyl group, a triphenylenyl group, a pyrenylene group, a chrysenyl group, a naphthacenyl group, a picenyl group, a perylenyl group, a pentaphenyl group, and a hexacenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, but are not limited thereto. For example, $R_1$ in Formula 1 may be a phenyl group.

In some example embodiments, $R_2$ to $R_{12}$ in Formula 1 may each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

For example, $R_2$ to $R_{12}$ in Formula 1 may each independently be selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group.

In some example embodiments, $R_2$ to $R_{12}$ in Formula 1 may all be hydrogen atoms. In some other example embodiments, there may be provided a compound represented by Formula 1A below:

<Formula 1A>

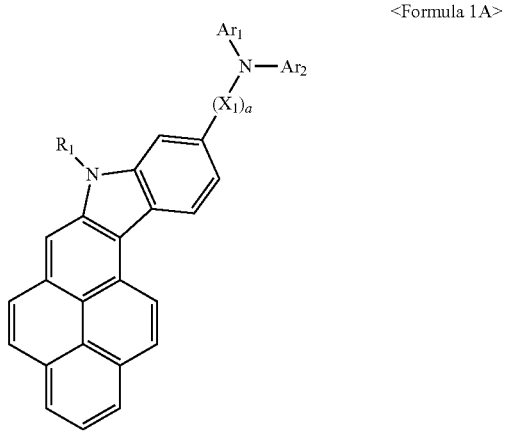

Detailed descriptions of 1A, $X_1$, a, $Ar_1$, $Ar_2$, and $R_1$ in Formula 1 are as defined above.

For example, in the amine-based compound of Formula 1A, $X_1$ may be a group represented by one of Formulae 2-1 to 2-27 above;

a may be 1 or 2; $Ar_1$ and $Ar_2$ may each independently be the groups represented by one of Formulae 4-1 to 4-9; and $R_1$ may be selected from among a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, and a hexacenyl group, and a phenyl group, a pentalenyl group, an indenylene group, a naphthyl group, an azulenyl group, a heptalenyl group, an indacenyl group, an acenaphthyl group, a fluorenyl group, a spiro-a fluorenyl group, a phenalenyl group, a phenanthrenyl group, an anthryl group, a fluoranthenyl group, a triphenylenyl group, a pyrenylene group, a chrysenyl group, a naphthacenyl group, a picenyl group, a perylenyl group, a pentaphenyl group, and a hexacenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group. The amine-based compound of Formula 1 may be a compound of Formula 1A, but is not limited thereto.

In some other example embodiments, in the amine-based compound of Formula 1A, $X_1$ may be a group represented by one of Formulae 3-1 to 3-12;

a may be 1 or 2;

$Ar_1$ and $Ar_2$ may each independently a group represented by Formulae 5-1 to 5-7; and $R_1$ may be selected from among a phenyl group, a pentalenyl group, an indenylene group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenylene group, a chrysenyl group, a naphthacenyl group, a picenyl group, a perylenyl group, a pentaphenyl group, and a hexacenyl group. The amine-based compound of Formula 1 may be a compound of Formula 1A, but is not limited thereto.

In some other example embodiments, the amine-based compound of Formula 1 may be one of Compounds 1 to 70 below:

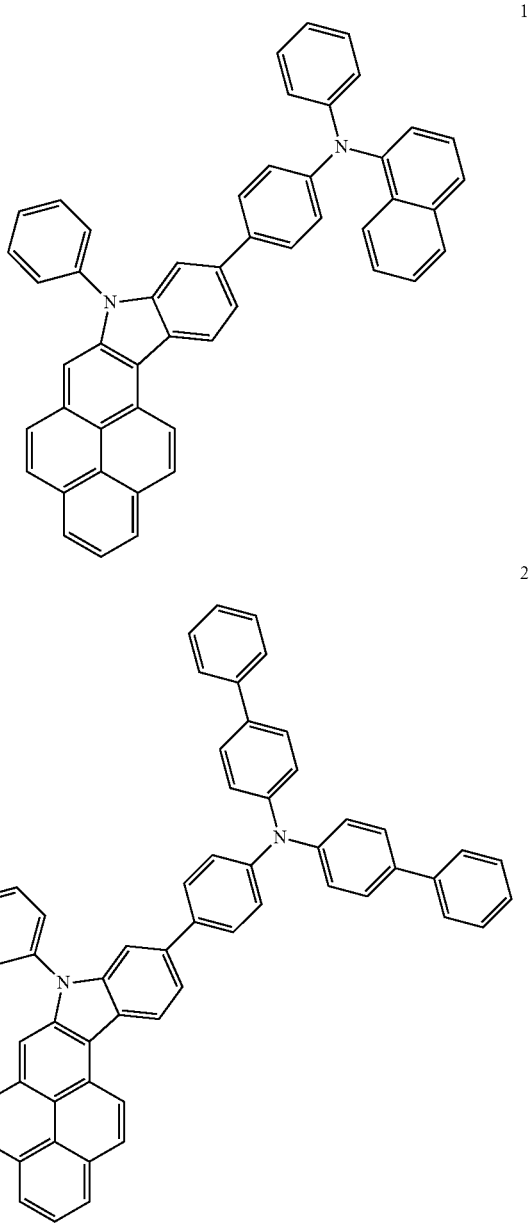

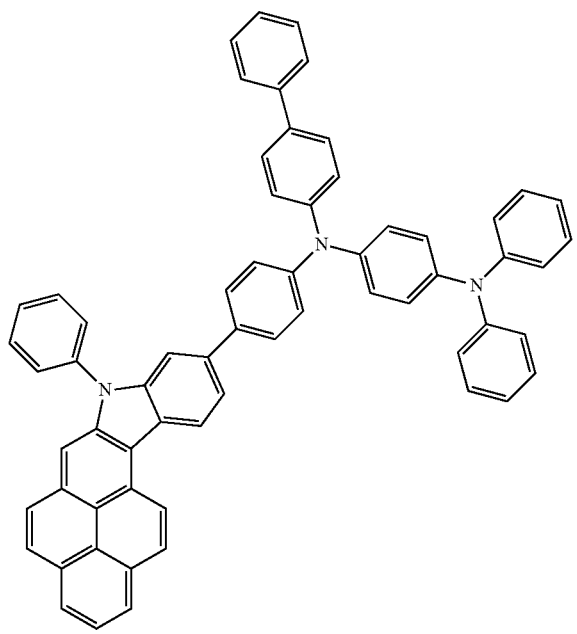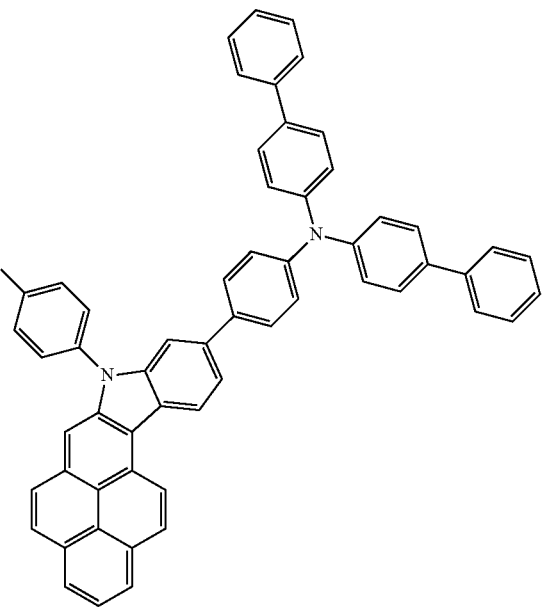

7
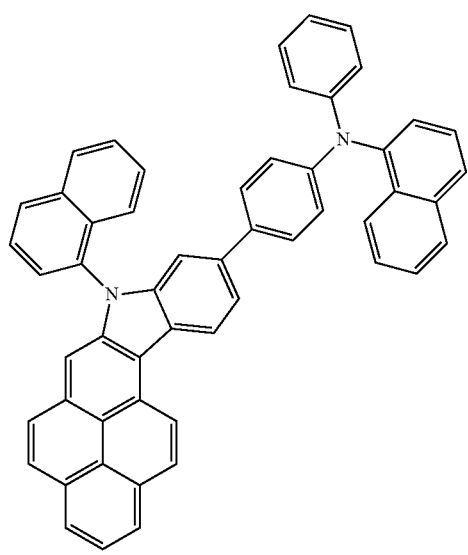
9
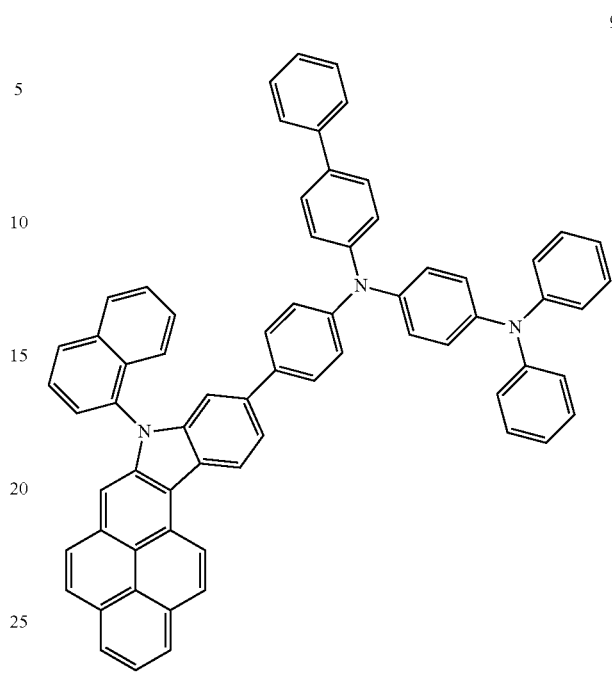
8
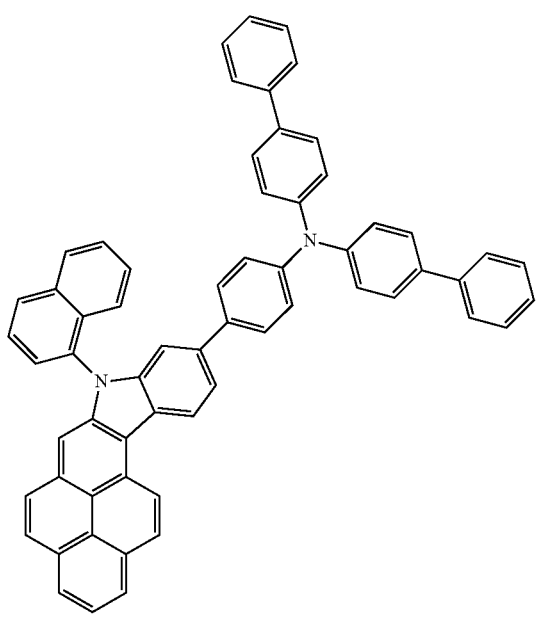
10
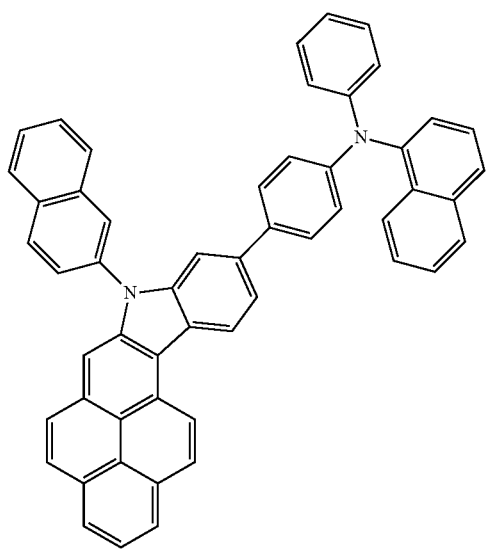

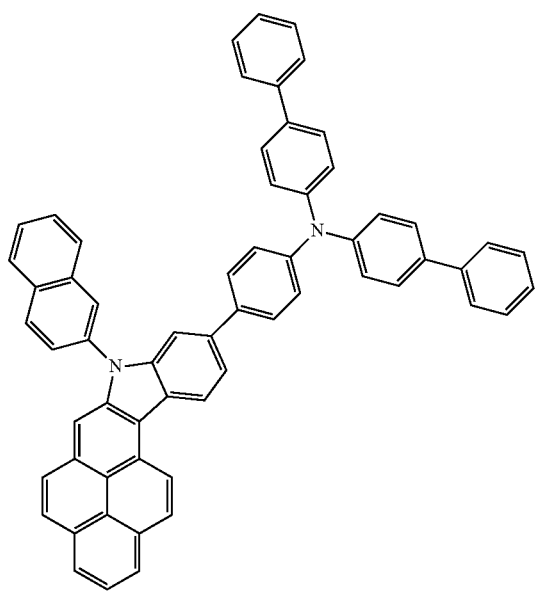
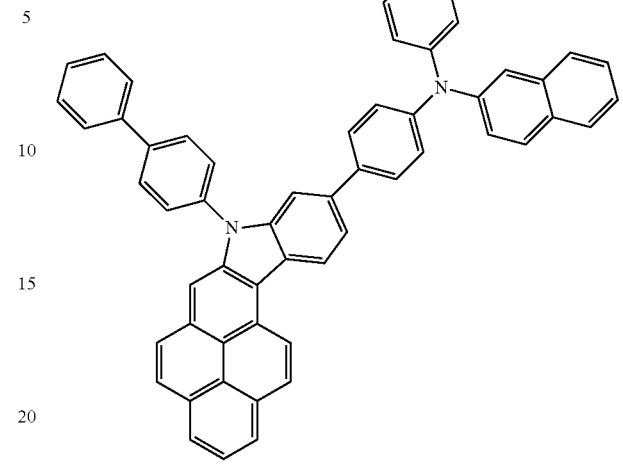
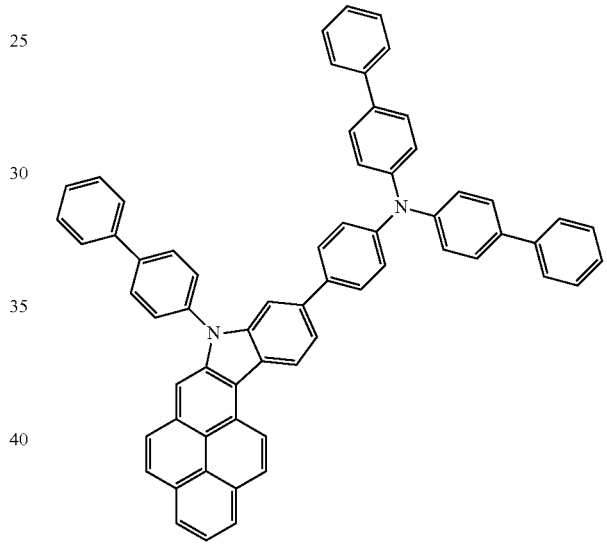
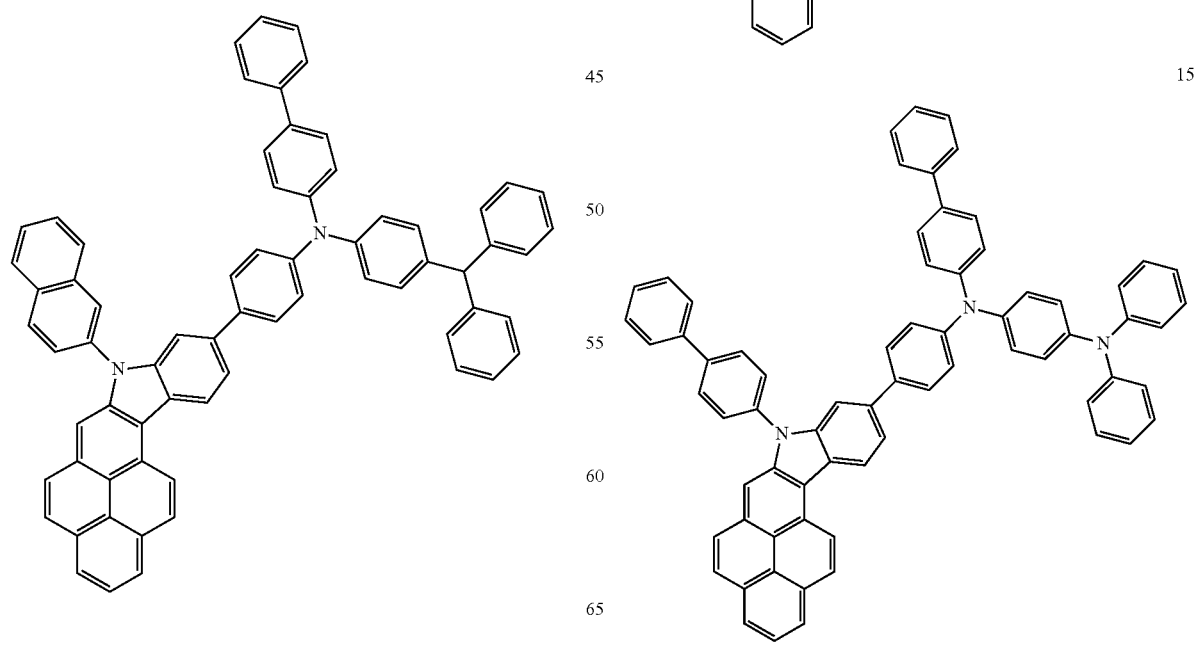

16
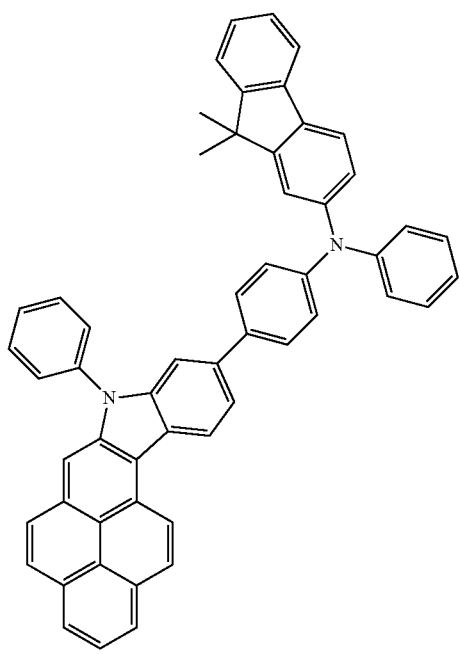
18
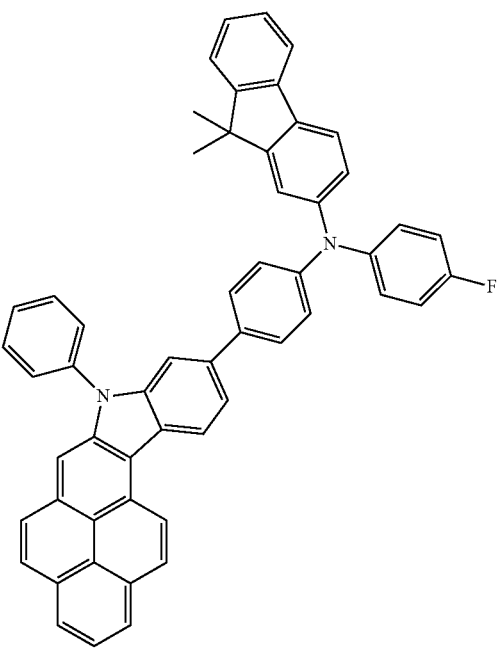
17
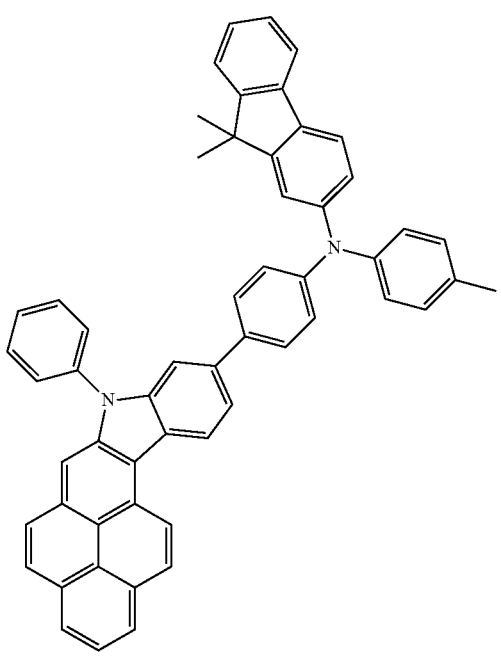
19
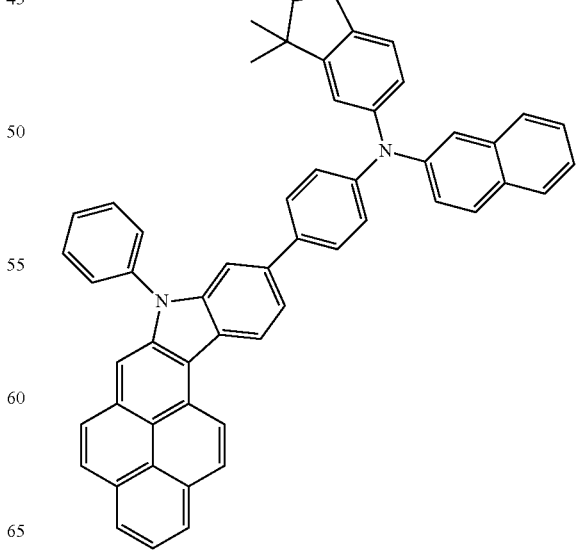

20
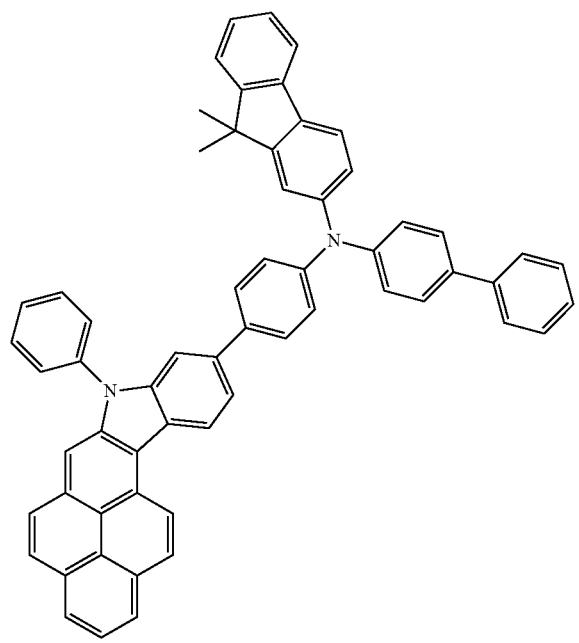
21
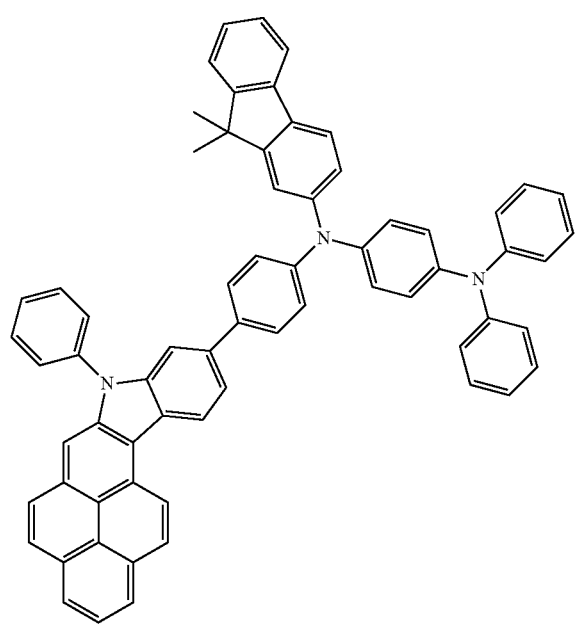
22
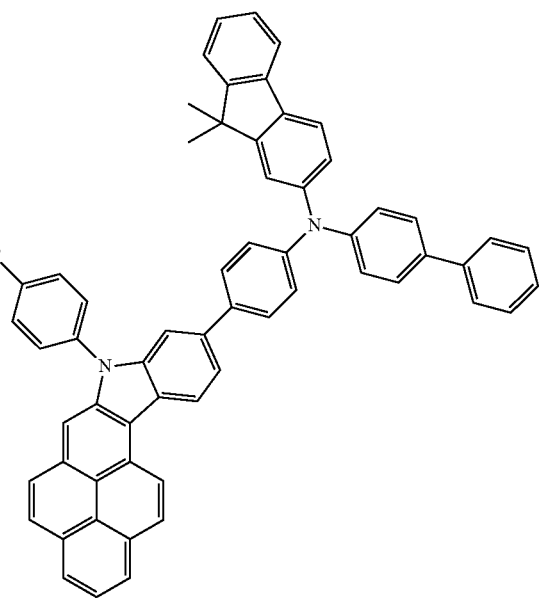
23
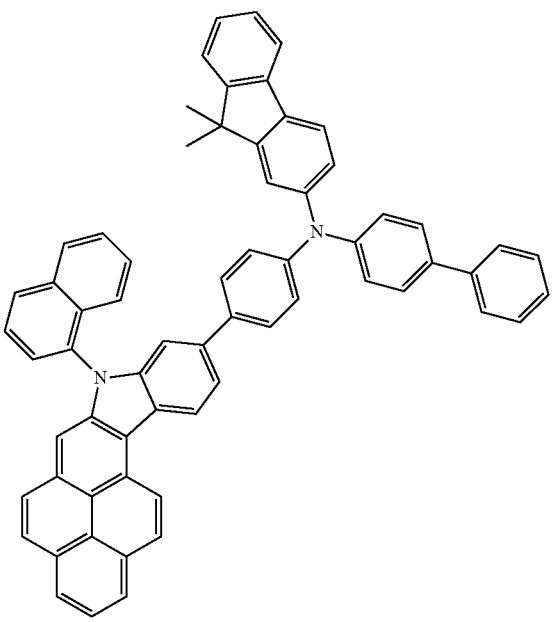

24
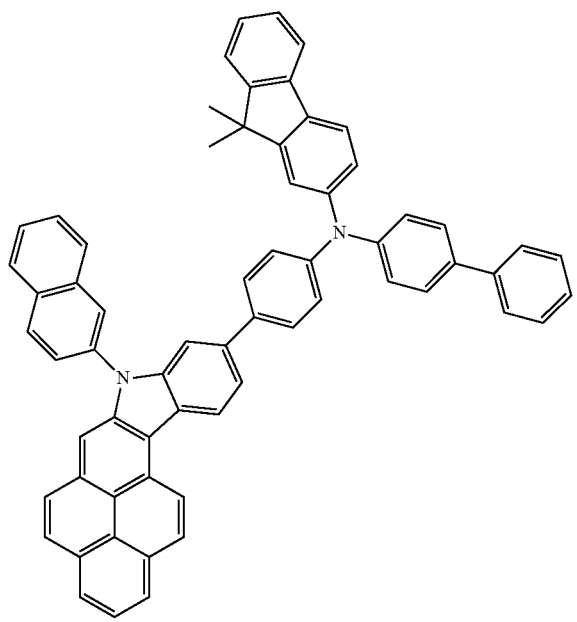
26
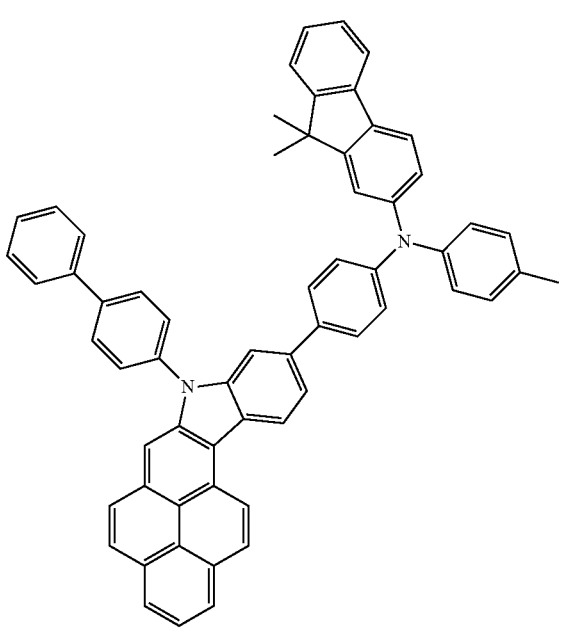
25
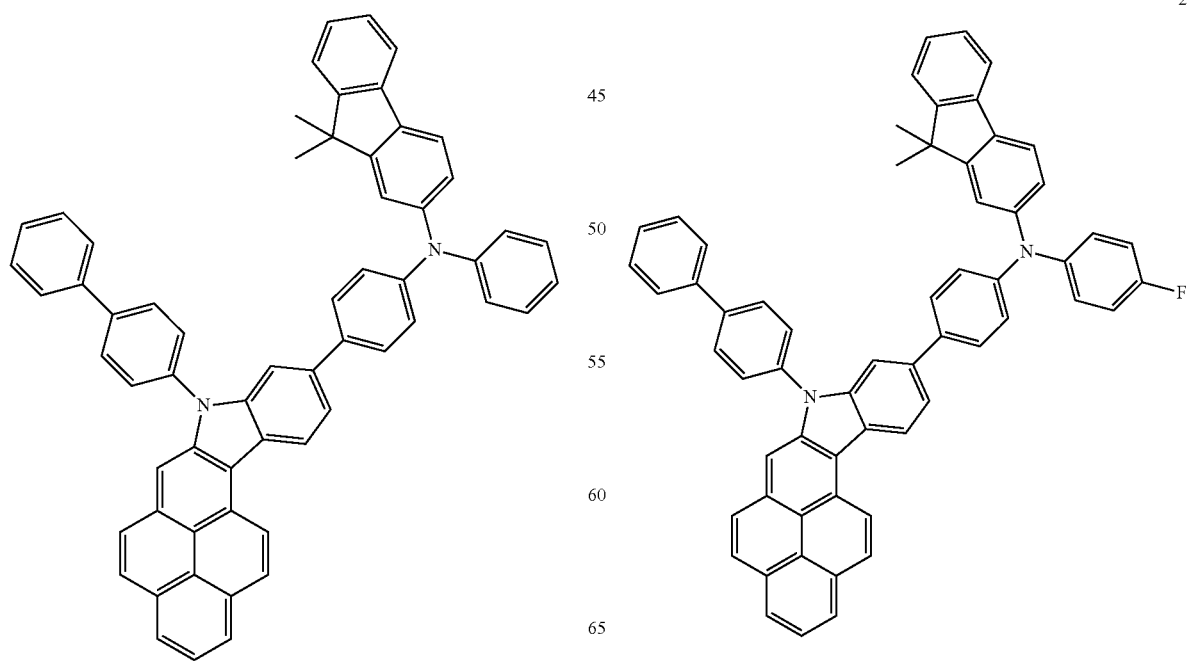
27

28
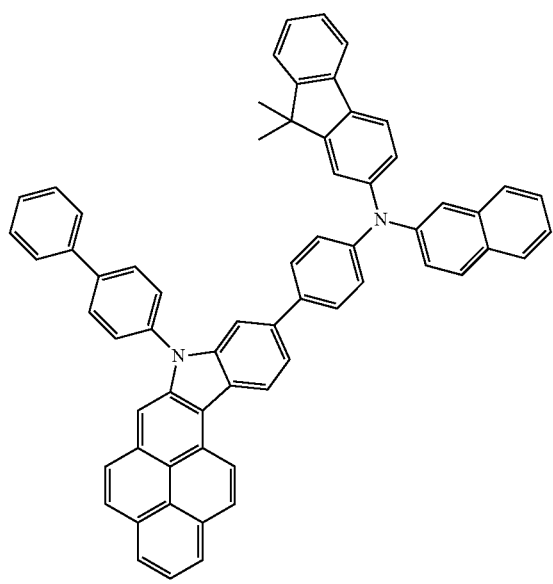
30
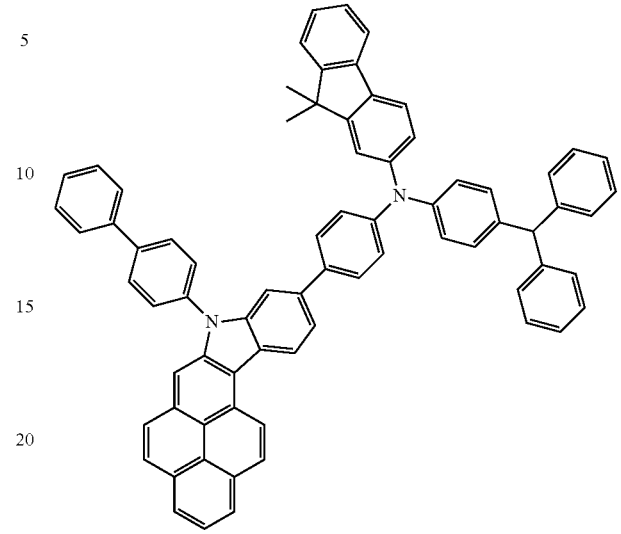
29
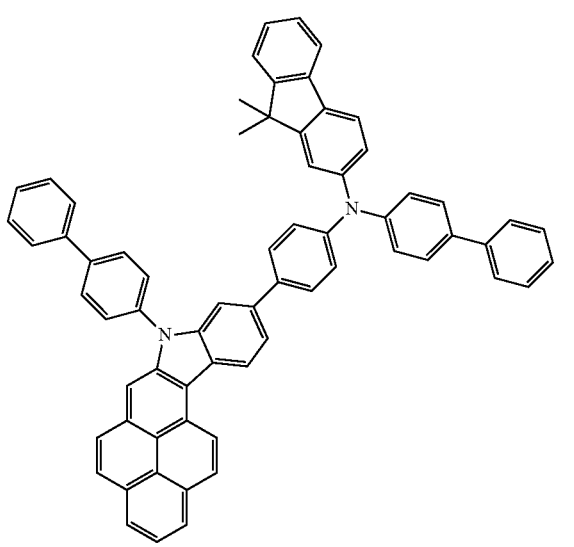
31
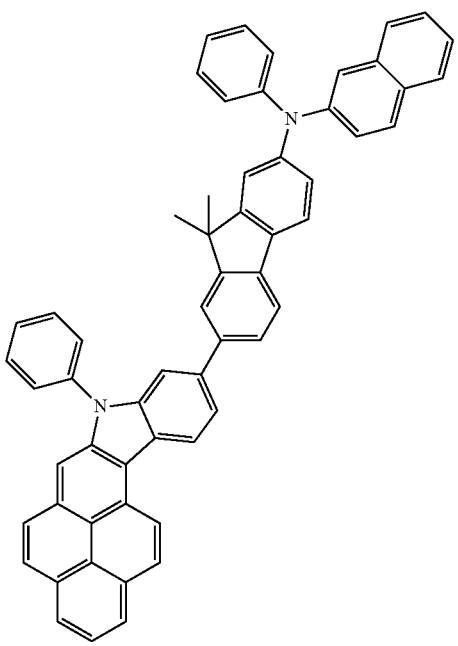

32
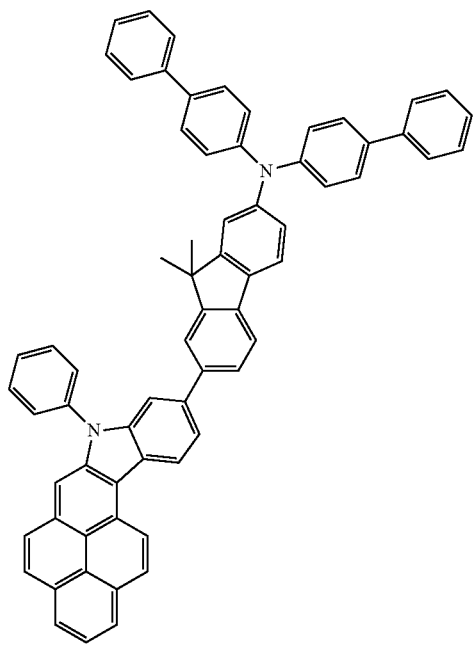
33
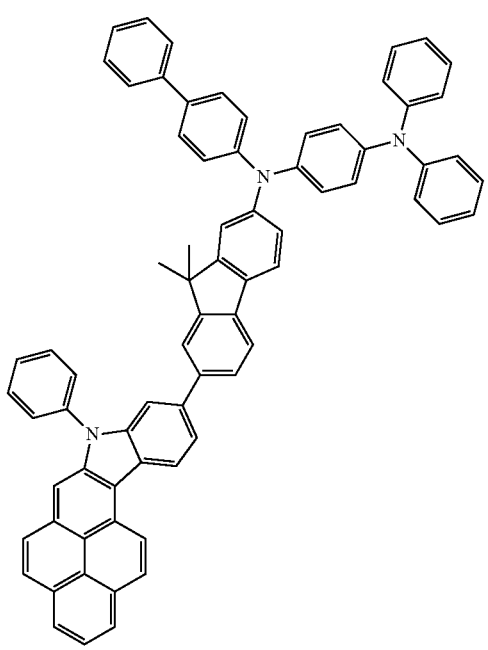
34
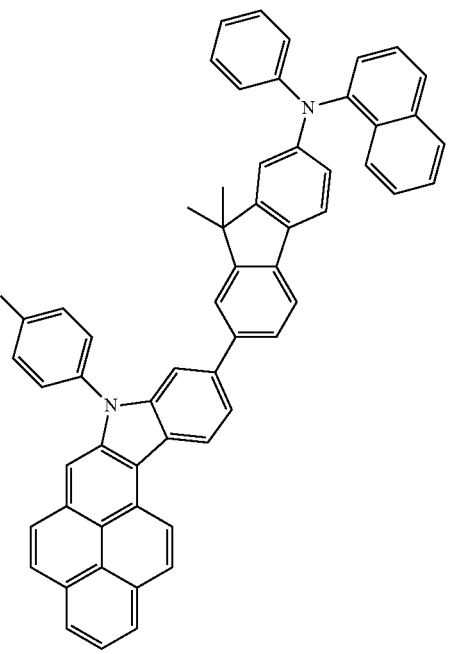
35
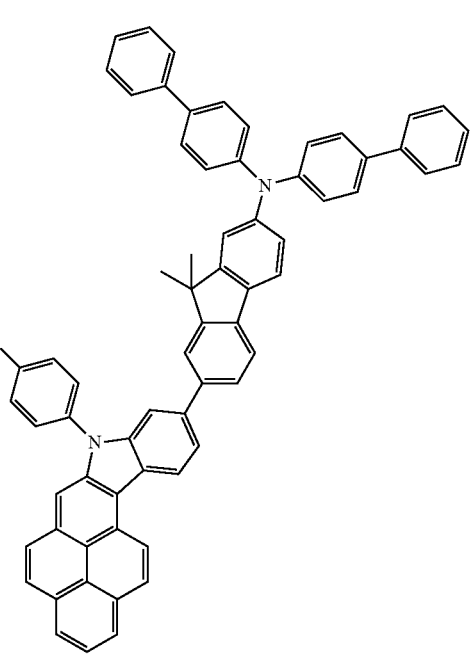

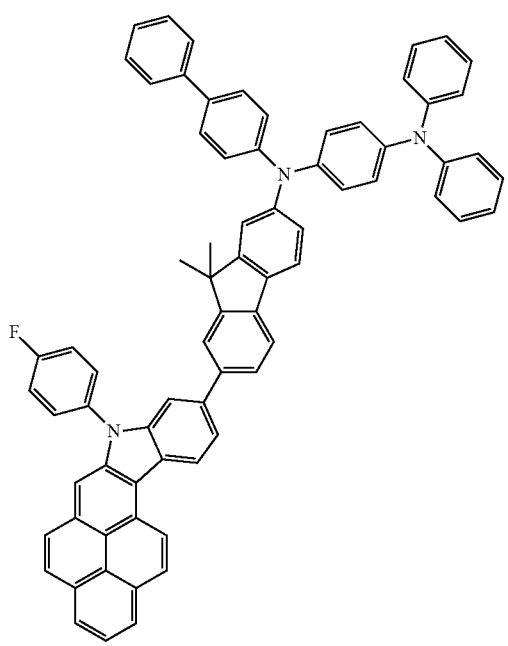
36
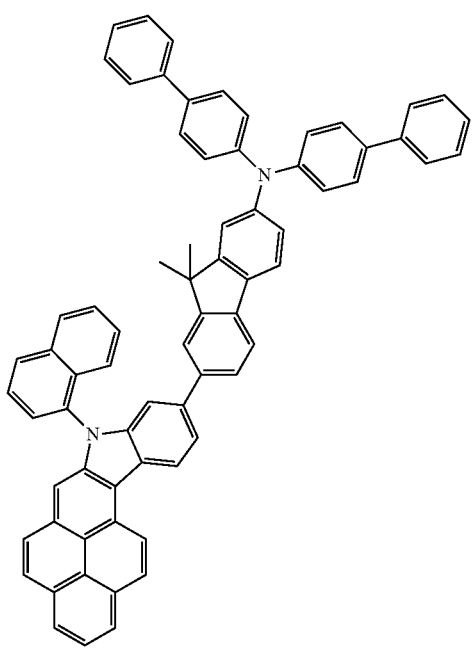
38
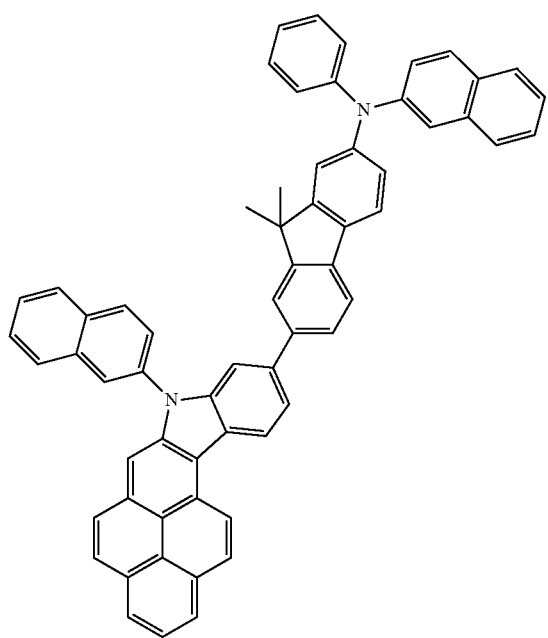
37
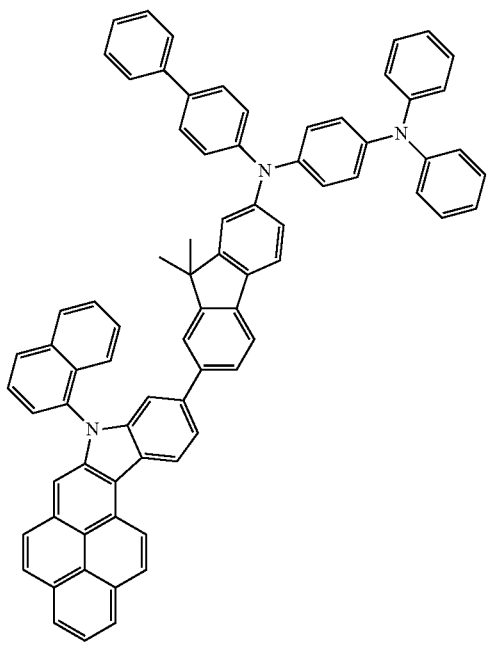
39

-continued
40
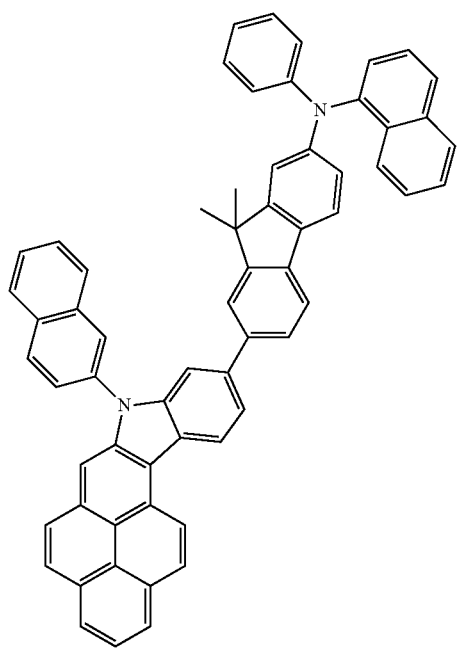
42
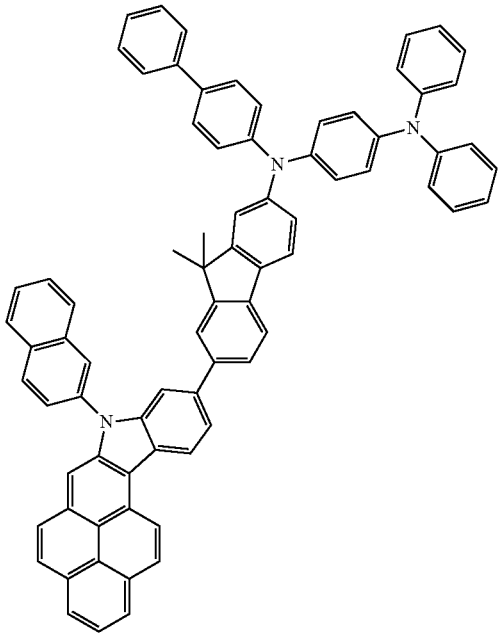
41
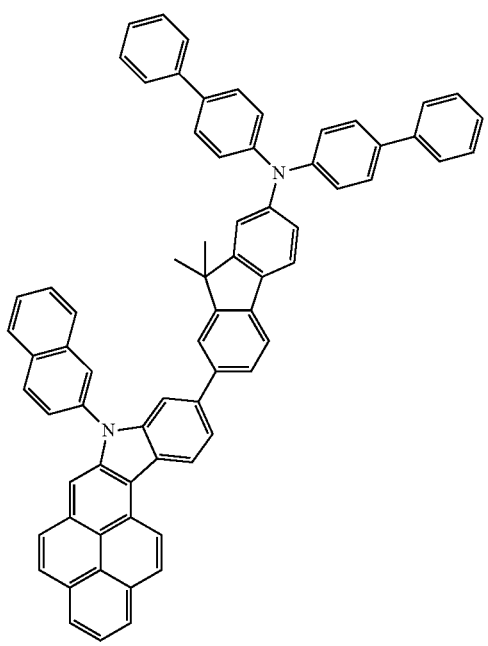
43
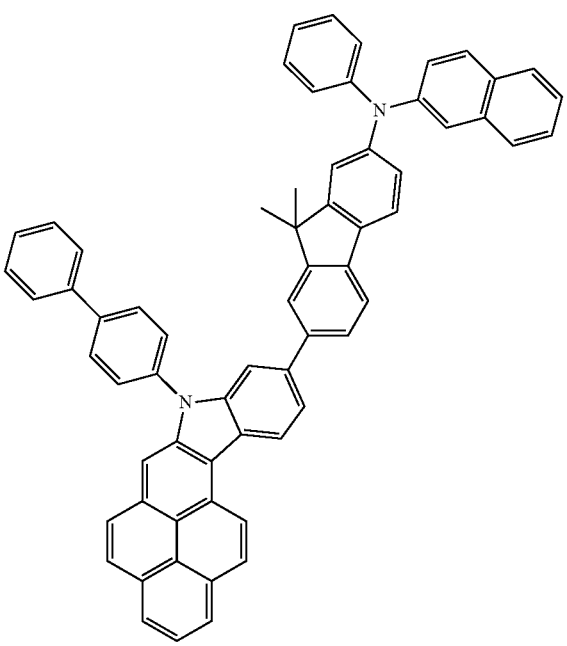

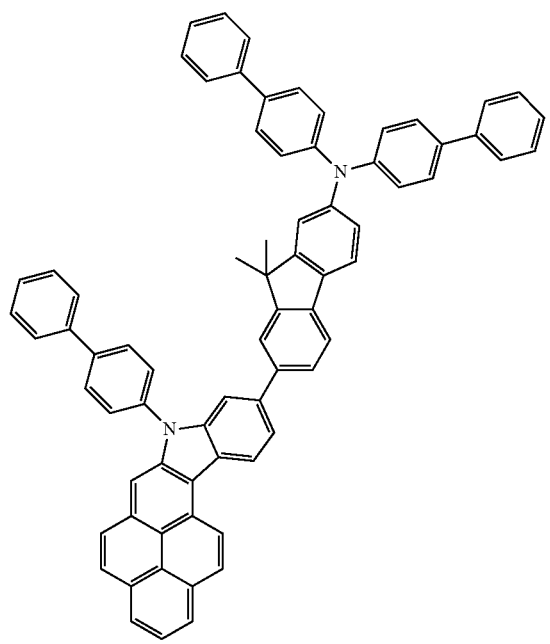
44
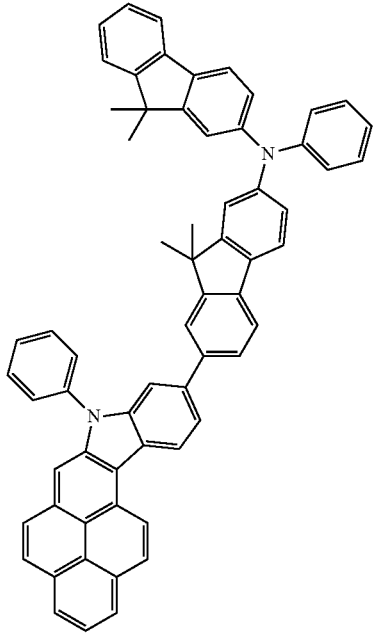
46
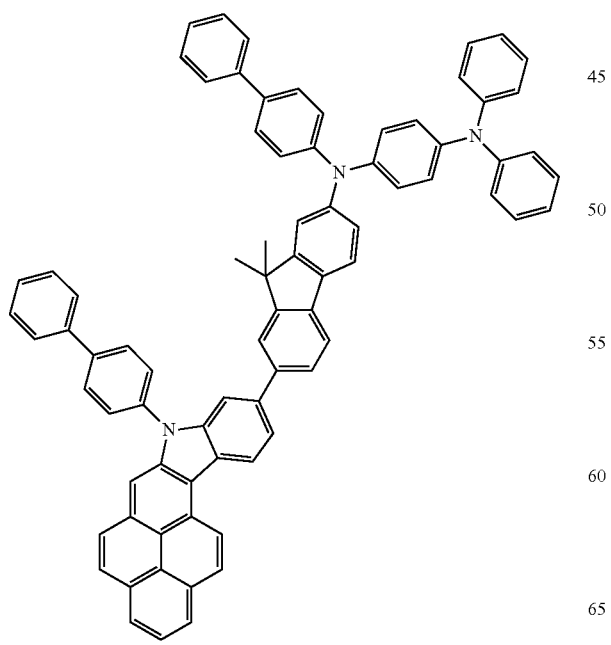
45
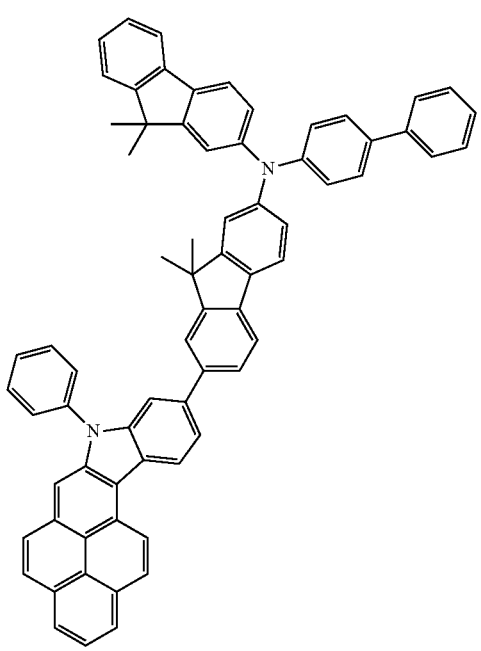
47

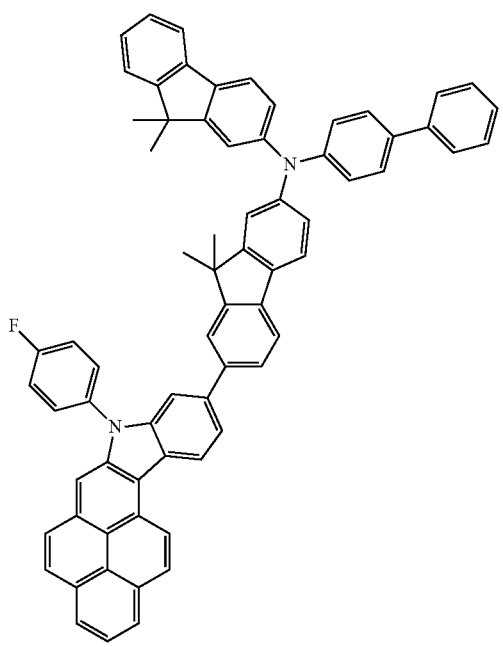
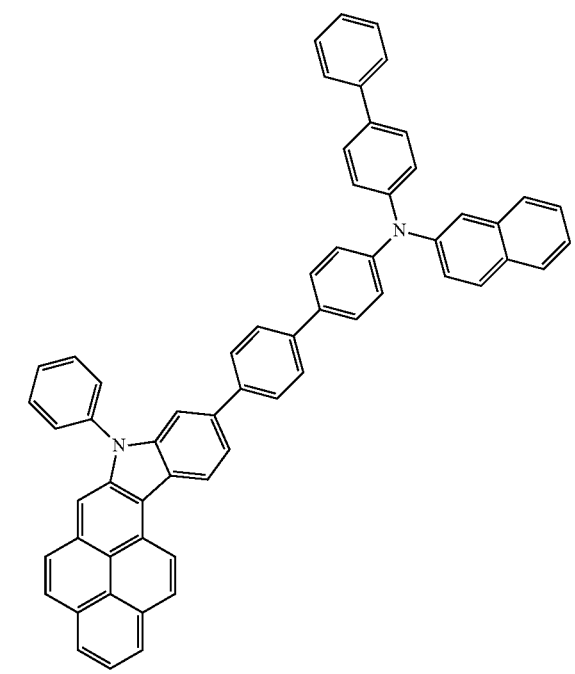

52
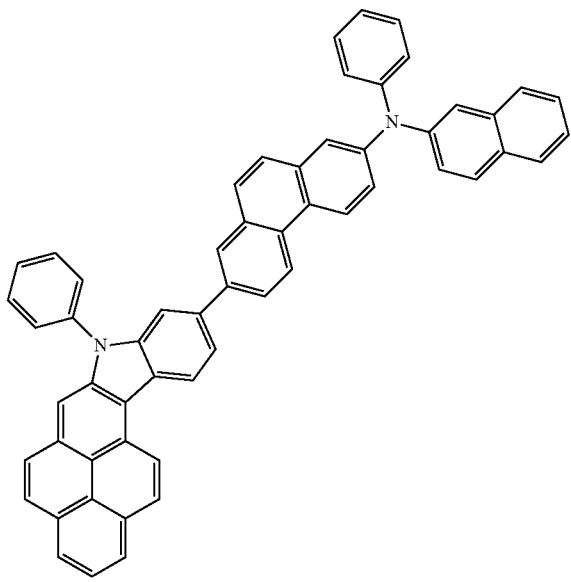
53
55
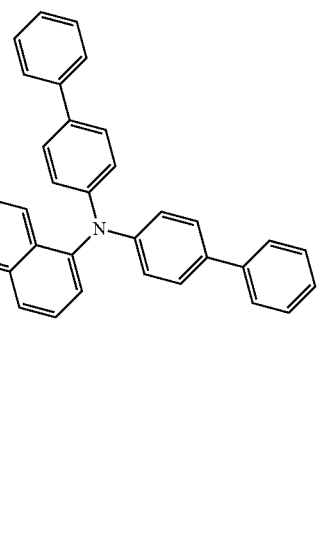
54
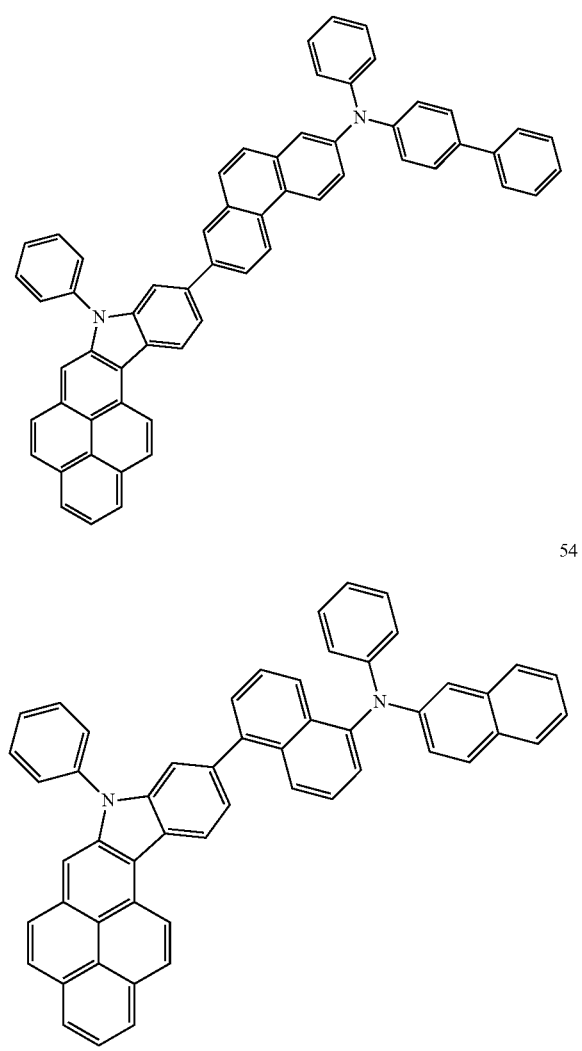
56
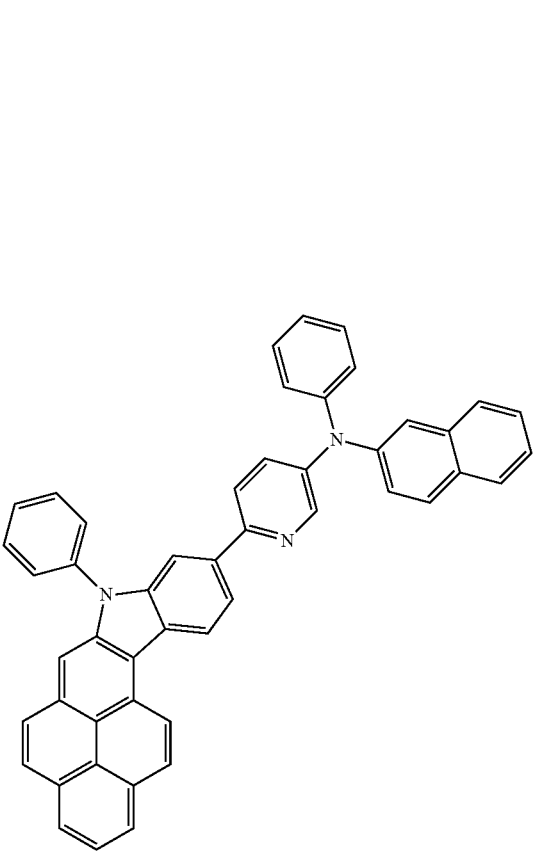

57
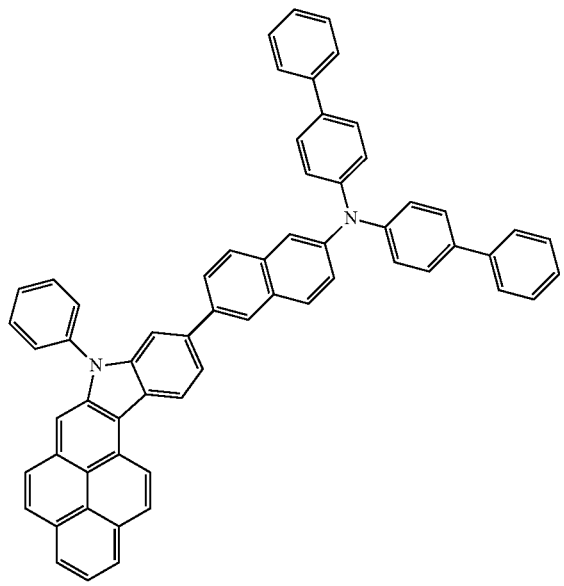
58
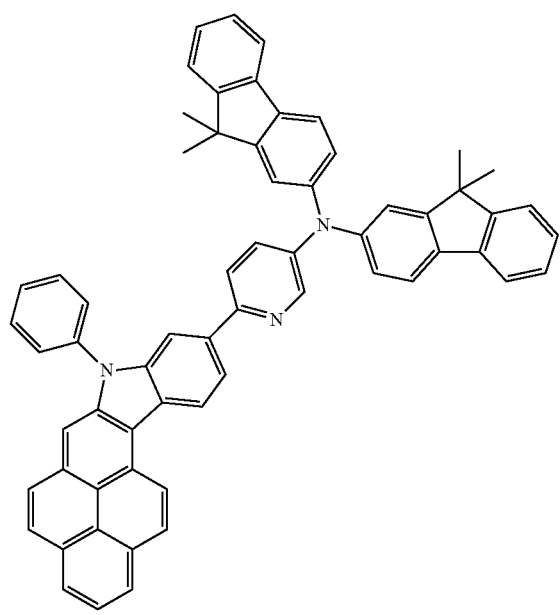
59
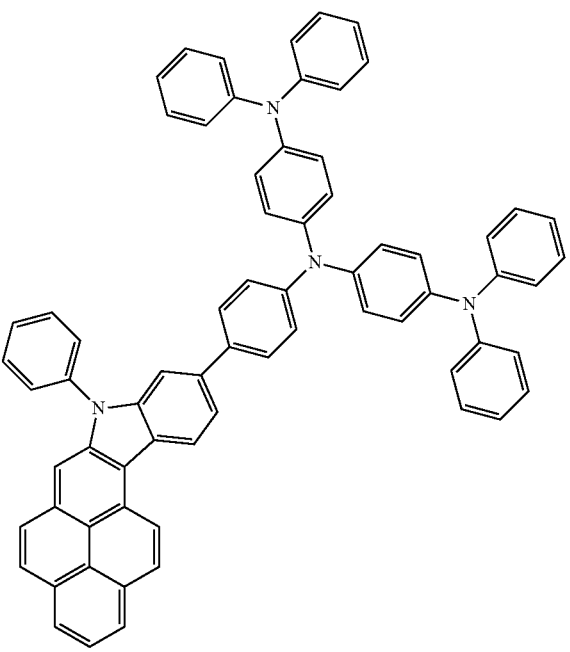
60
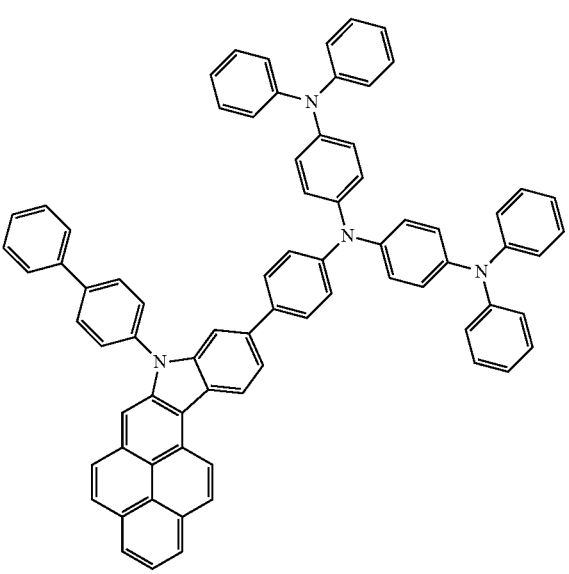

61
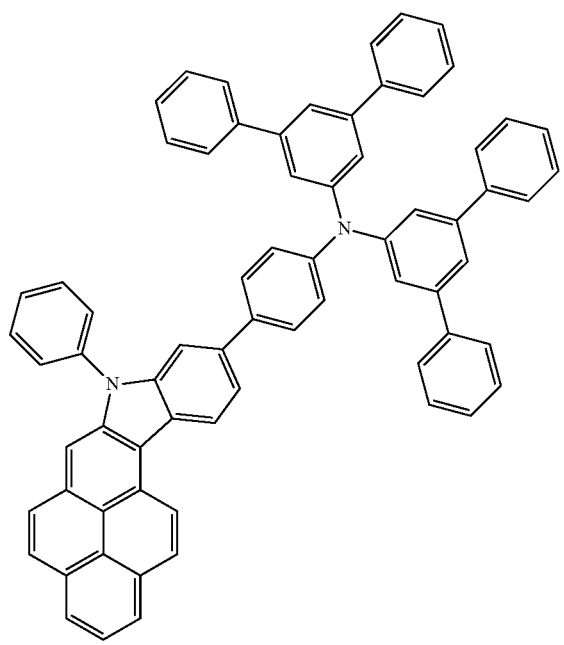
62
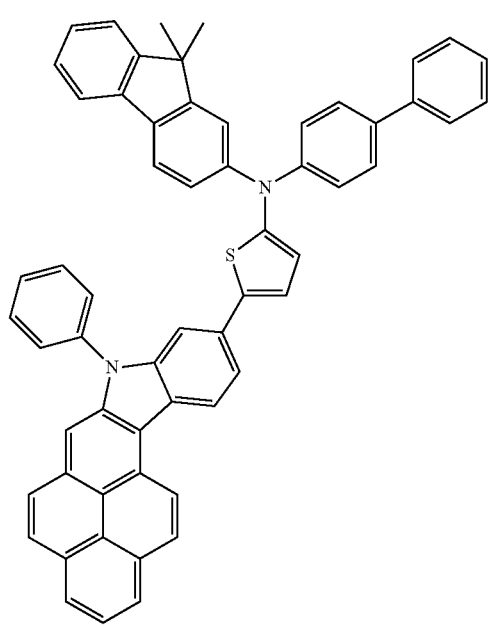
63
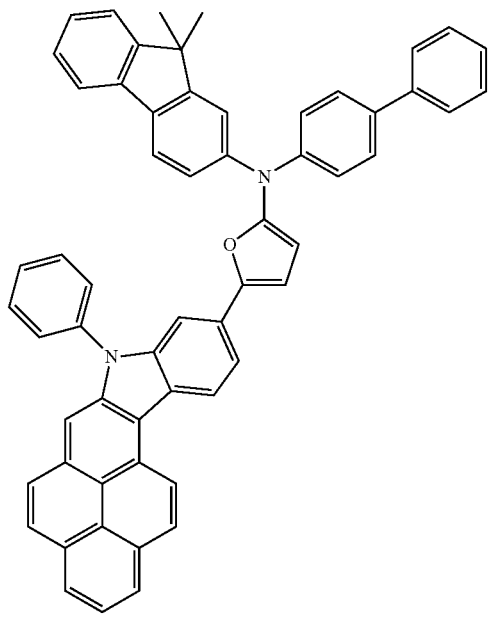
64
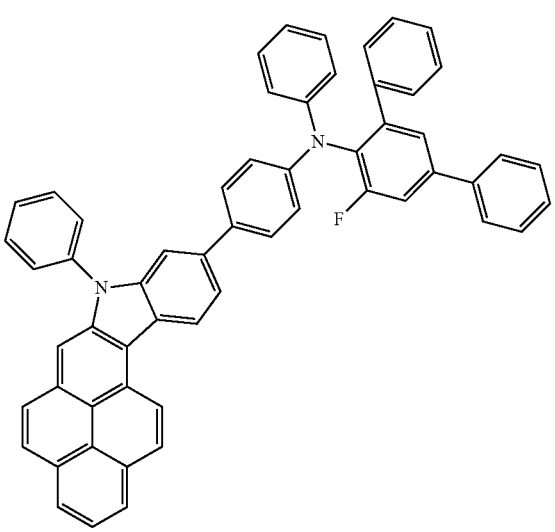

65
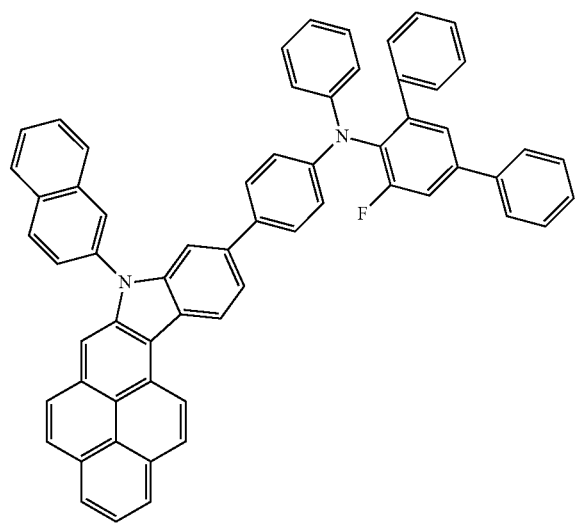
67
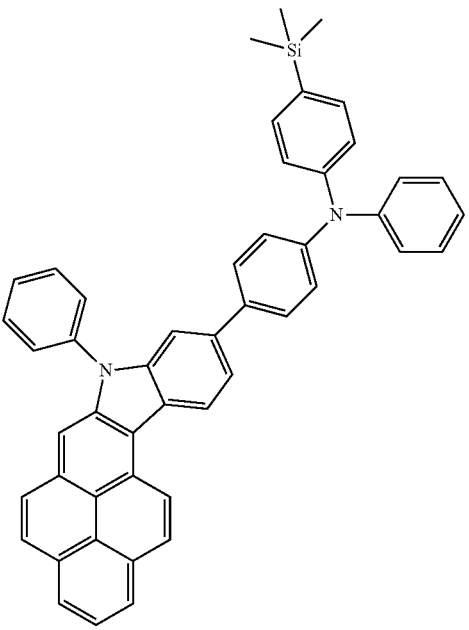
66
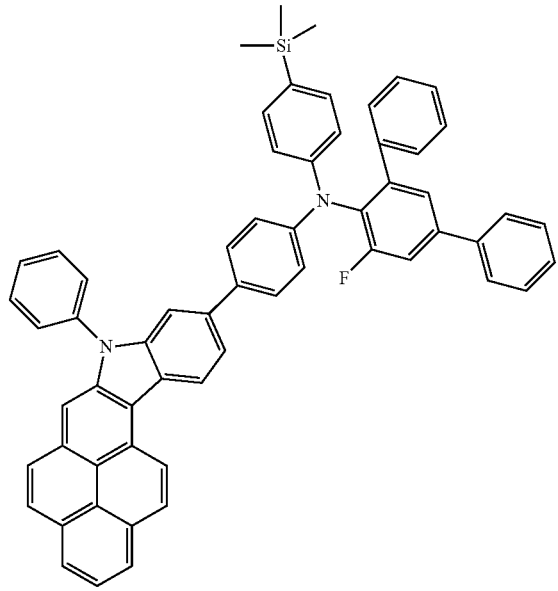
68
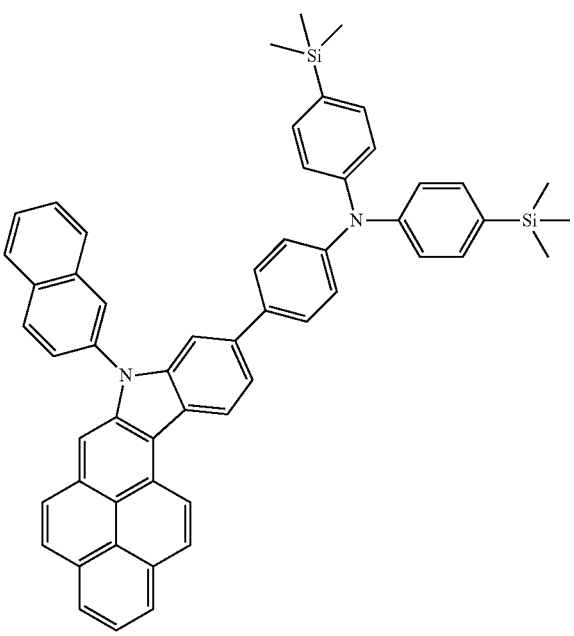

-continued

69

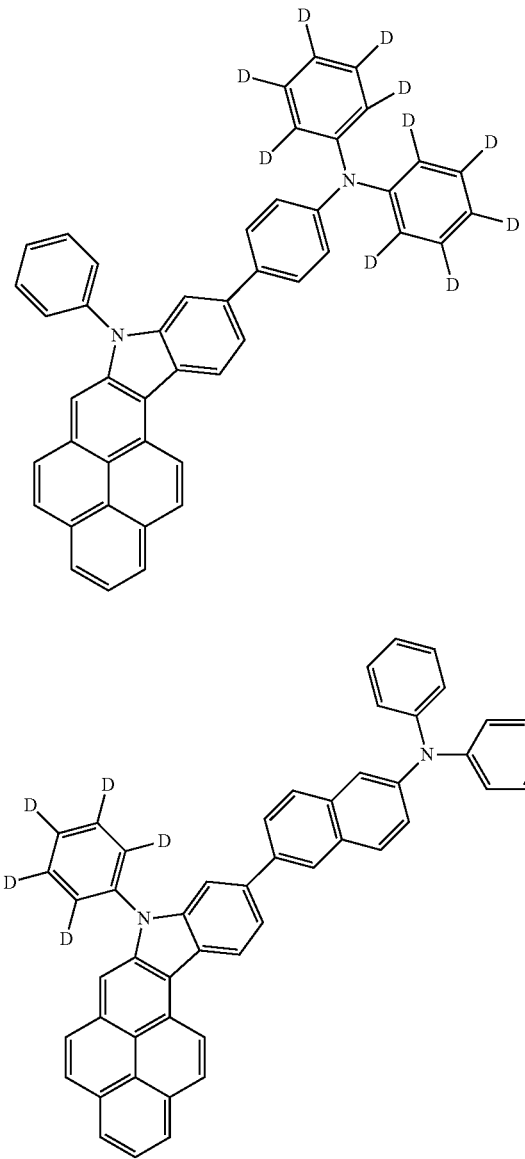

70

When the amine-based compound of Formula 1 has "X₁" as a linker between the pyrene-based core and —N(Ar₁)(Ar₂) (refer to Formula 1' below), it may possess a relatively low absolute value of highest occupied molecular orbital (HOMO) energy level (eV), and a relatively high energy band gap (eV) between HOMO level and lowest unoccupied molecular orbital (LUMO) energy level. As a result, an organic light-emitting diode including the amine-based compound of Formula 1 may emit high-purity blue light shifted to shorter wavelengths, and thus may have higher efficiency and longer lifetime.

For example, with the assumption of a hypothetical compound (refer to Compound A of Comparative Example 2) having the same structure as that of Formula 1, except that X₁ is not present between the pyrene-based core and —N(Ar₁)(Ar₂) (i.e., a=0), the hypothetical compound may possess a higher absolute value of HOMO energy level (eV) than that of the amine-based compound of Formula 1, and accordingly may have a smaller energy band gap than that of the amine-based compound of Formula 1. As a result, an organic light-emitting diode including the hypothetical compound may emit blue light shifted to longer wavelengths (i.e., blue light shifted to a red-light domain and/or a green-light domain), as compared with the organic light-emitting diode including the amine-based compound of Formula 1, and thus may have lower efficiency and shorter lifetime than those of the organic light-emitting diode including the amine-based compound of Formula 1.

Since in the amine-based compound of Formula 1, the "second" carbon in a benzo group of the pyrene-based core is linked to —N(Ar₁)(Ar₂) via the linker X₁ (refer to Formula 1'), an organic light-emitting diode using the amine-based compound of Formula 1 may emit high-purity blue light shifted to shorter wavelengths, and thus may have higher efficiency and longer lifetime.

For example, with the assumption of a hypothetical compound having the same structure as that of Formula 1, except that the "third" carbon of a benzo group in the pyrene-based core is linked to —N(Ar₁)(Ar₂) via the linker X₁ (as an example, refer to Compound B of Comparative Example 3), resonance occurs between the pyrene-based core of the hypothetical compound and —N(Ar₁)(Ar₂). As a result, an organic light-emitting diode including the hypothetical compound may emit blue light shifted to longer wavelengths (i.e., blue light shifted to a red-light domain and/or a green-light domain), as compared with the organic light-emitting diode including the amine-based compound of Formula 1, and thus may have lower efficiency and shorter lifetime than those of the organic light-emitting diode including the amine-based compound of Formula 1.

<Formula 1'>

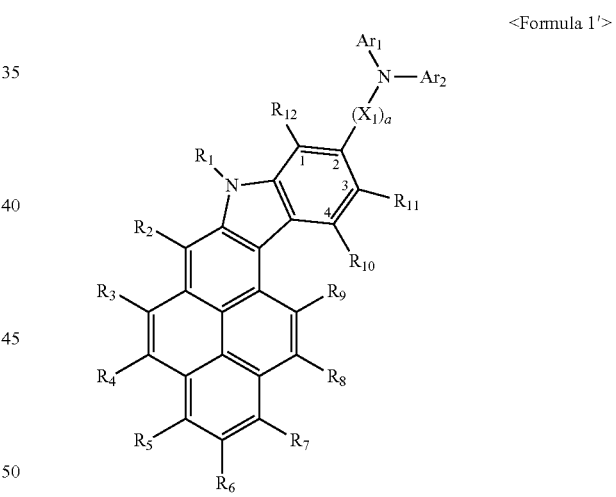

Therefore, an organic light-emitting diode including any of the amine-based compounds represented by Formula 1 above may have a low driving voltage, a high luminance, a high efficiency, and a long lifetime.

The amine-based compound of Formula 1 may be synthesized by a suitable organic synthesis method. A synthesis method of the amine-based compound of Formula 1 may be understood by those of skill in the art with regard to Examples described below.

The amine-based compound of Formula 1 above may be used between a pair of electrodes of an organic light-emitting diode. For example, the amine-based compound of Formula 1 may be used in an emission layer of an organic light-emitting diode, and/or a hole transfer region between the emission layer and an anode (for example, in a hole injection layer, a hole transport layer, or a functional layer having both hole injection and hole transport capabilities.

According to another example embodiment, an organic light-emitting diode includes a first electrode, a second electrode disposed opposite to the first electrode, and an organic layer disposed between the first electrode and the second electrode and including an emission layer, wherein the organic layer includes at least one of the amine-based compounds of Formula 1 described above.

As used herein, "(for example, the organic layer) includes at least one amine-based compound" means that "(the organic layer) may include one of the amine-based compounds of Formula 1 above, or at least two different amine-based compounds of Formula 1 above".

For example, the organic layer may include only Compound 27 above as the amine-based compound. In this regard, Compound 27 above may be present in the hole transport layer of the organic light-emitting diode. In some example embodiments, the organic layer may include Compounds 27 and 64 above as the amine-based compound. In this regard, the Compounds 27 and 64 may be present in the same layer (for example, in the electron transport layer) or may be present in different layers (for example, in the hole transport layer and the emission layer, respectively).

The organic layer may include i) a hole transport region between the first electrode and the emission layer, and ii) an electron transport region between the emission layer and the second electrode, wherein the hole transport region may include at least one of the hole injection layer, the hole transport layer, the functional layer (hereinafter, a "H-functional layer") having both the hole injection and the hole transport capabilities, a buffer layer, and an electron blocking layer, and the electron transport region may include at least one of a hole blocking layer, the electron transport layer, and the electron injection layer.

The term "organic layer" as used herein refers to a single layer and/or a plurality of layers disposed between the first electrode and the second electrode of the organic light-emitting diode.

The FIGURE is a schematic sectional view of an organic light-emitting diode 10 according to an example embodiment. Hereinafter, a structure of an organic light-emitting diode according to an example embodiment and a method of manufacturing the same will now be described with reference to The FIGURE.

A substrate 11 may be a suitable substrate that is used in existing organic light-emitting diodes. In some example embodiments the substrate 11 may be a glass substrate or a transparent plastic substrate with strong mechanical strength, thermal stability, transparency, surface smoothness, ease of handling, and water resistance.

A first electrode 13 may be formed by depositing or sputtering a first electrode-forming material on the substrate 11. When the first electrode 13 constitutes an anode, a material having a high work function may be selected as the first electrode-forming material to facilitate hole injection. The first electrode 13 may be a reflective electrode or a transmission electrode. Transparent and conductive materials such as ITO, IZO, $SnO_2$, ZnO, or the like may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but is not limited thereto.

An organic layer 15 may be disposed on the first electrode 13.

The organic layer 15 may include the hole transport region, the emission layer, and the electron transport region, wherein the hole transport region may include the hole injection layer, the hole transfer layer, and the buffer layer, and the electron transport region may include the electron transport layer and the electron injection layer. For example, the amine-based compound of Formula 1 may be present i) in the emission layer, ii) in the hole transport region, or iii) both in the hole transport region and the emission layer. When the amine-based compound of Formula 1 is present in the emission layer, the amine-based compound may act as a dopant, and the emission layer may further include a host. When the amine-based compound of Formula 1 is present in the hole transport region, the hole transport region may include the hole transport layer, and the amine-based compound may be present in the hole transport layer. Also, when the amine-based compound of Formula 1 is present in both the hole transport region and the emission layer, the amine-based compound in the hole transport region may be identical to or differ from the amine-based compound in the emission layer. For example, when the amine-based compound of Formula 1 is present in both the hole transport region and the emission layer, the amine-based compound in the hole transport region may differ from that in the emission layer.

The HIL may be formed on the first electrode 13 by using any of a variety of suitable methods, such as vacuum deposition, spin coating, casting, Langmuir-Blodgett (LB) deposition, or the like.

When the HIL is formed using vacuum deposition, the deposition conditions may vary depending on the compound that is used to form the HIL, and the desired structure and thermal properties of the HIL to be formed. For example, the deposition may be performed at a temperature of about 100° C. to about 500° C., a pressure of about $10^{-8}$ torr to about $10^{-3}$ torr, and a deposition rate of about 0.01 to about 100 Å/sec, but are not limited thereto.

When the HIL is formed using spin coating, the coating conditions may vary depending on the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C., but are not limited thereto.

A material for forming the HIL may be the amine-based compound of Formula 1 described above. Non-limiting examples of suitable hole injecting materials that may be used to form the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris (3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS), but are not limited thereto.

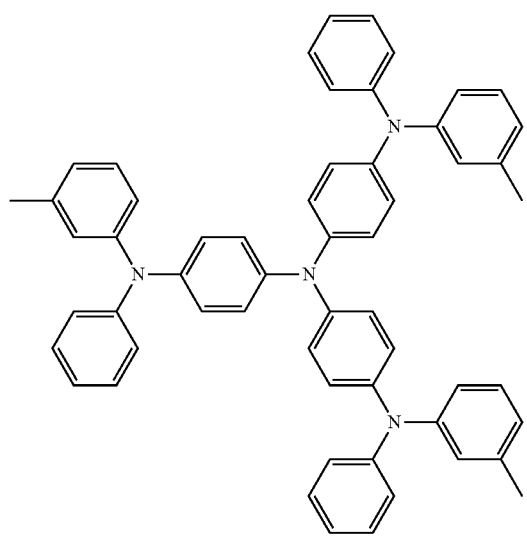

m-MTDATA

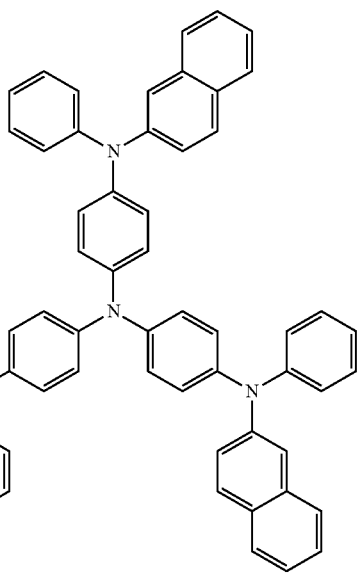

2-TNATA

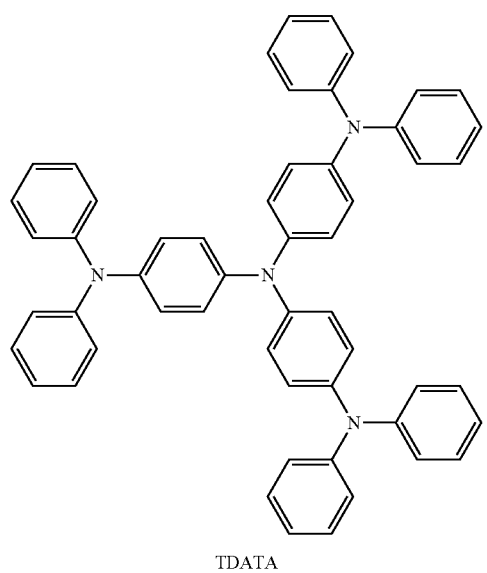

TDATA

A thickness of the HIL may be about 100 Å to about 10000 Å, and in some example embodiments, may be from about 100 Å to about 1000 Å. When the thickness of the HIL is within these ranges, the HIL may have good hole injecting ability without a substantial increase in driving voltage.

Then, a HTL may be formed on the HIL by using any of a variety of suitable methods, such as vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

A material for forming the HTL may be the amine-based compound of Formula 1 described above. Non-limiting examples of suitable HTL forming materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine) (NPB).

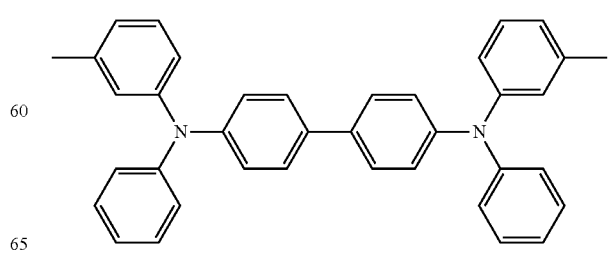

TPD

-continued

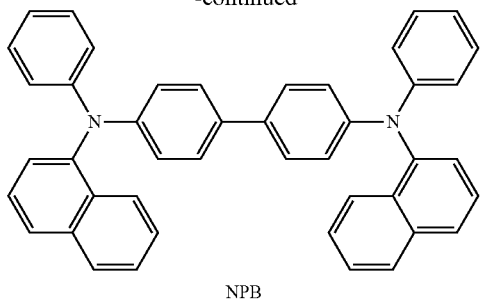

NPB

The thickness of the HTL may be from about 50 Å to about 2000 Å, and in some example embodiments, may be from about 100 Å to about 1500 Å. When the thickness of the HTL is within these ranges, the HTL may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, and in some example embodiments, may be from about 100 Å to about 1,000 Å. When the thickness of the H-functional layer is within these ranges, the H-functional layer may have good hole injection and transport capabilities without a substantial increase in driving voltage.

In some example embodiments, at least one of the HIL, the HTL, and the H-functional layer may include at least one of a compound represented by Formula 300 below and a compound represented by Formula 301:

<Formula 300>

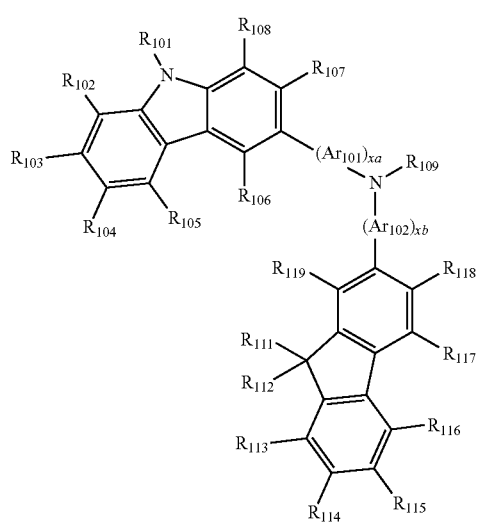

<Formula 301>

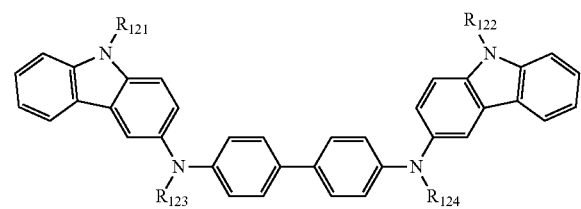

In Formula 300, $Ar_{101}$ and $Ar_{102}$ may be each independently a substituted or unsubstituted $C_6$-$C_{60}$ arylene group. In some example embodiments, $Ar_{101}$ and $Ar_{102}$ may be each independently selected from a phenylene group, a pentalenylene group, an indenylene group, a naphthylene group, an azulenylene group, a heptalenylene group, a substituted or unsubstituted an acenaphthylene group, a fluorenylene group, a phenalenylene group, a phenanthrenylene group, an anthrylene group, a fluoranthenylene group, a triphenylenylene group, a pyrenylenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, a substituted or unsubstituted an acenaphthylene group, a fluorenylene group, a phenalenylene group, a phenanthrenylene group, an anthrylene group, a fluoranthenylene group, a triphenylenylene group, a pyrenylenylene group, a chrysenylenylene group, a naphthacenylene group, a picenylene group, a perylenylene group, and a pentacenylene group, each substituted with at least one of a deuterium atom, a halogen atom, a hydroxyl group, a nitro group, a cyano group, an amino group, an amidino group, hydrazine, hydrazone, a carboxyl group or salt thereof, a sulfuric acid group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In Formula 300, xa and xb may be each independently an integer from 0 to 5, for example, may be 0, 1, or 2. For example, xa may be 1, and xb may be 0, but are not limited thereto.

In Formulae 300 and 301 above, $R_{101}$ to $R_{108}$, $R_{111}$ to $R_{119}$, and $R_{121}$ to $R_{124}$ may be each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. In some example embodiments, $R_{51}$ to $R_{58}$, $R_{61}$ to $R_{69}$, $R_{71}$, and $R_{72}$ may be each independently one of a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group, but are not limited thereto.

In Formula 300, $R_{109}$ may be selected from a phenyl group, a naphthyl group, an anthryl group, a biphenyl group, a pyridyl group; and a phenyl group, a naphthyl group, an anthryl group, a biphenyl group, and a pyridyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In some example embodiments the compound of Formula 300 may be represented by Formula 300A below, but is not limited thereto:

<Formula 300A>

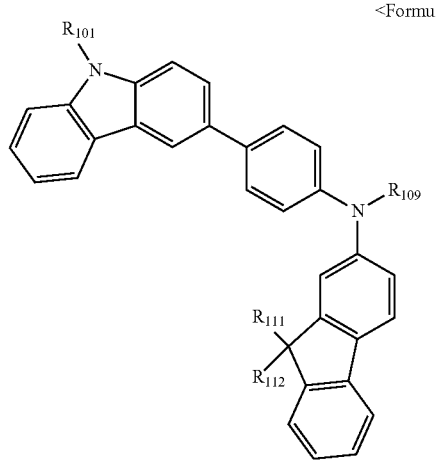

In Formula 300A, $R_{101}$, $R_{111}$, $R_{112}$, and $R_{109}$ may be as defined above.

In some non-limiting example embodiments, at least one of the HIL, HTL, and H-functional layer may include at least one of compounds represented by Formulae 301 to 320 below, but is not limited thereto:

301

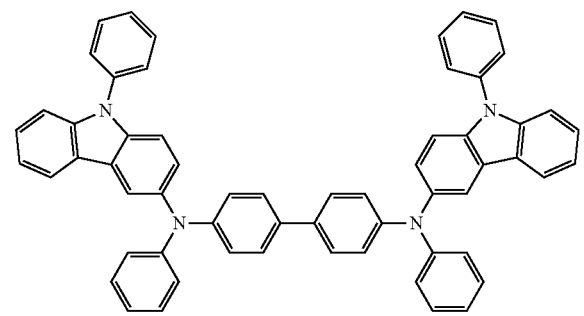

302

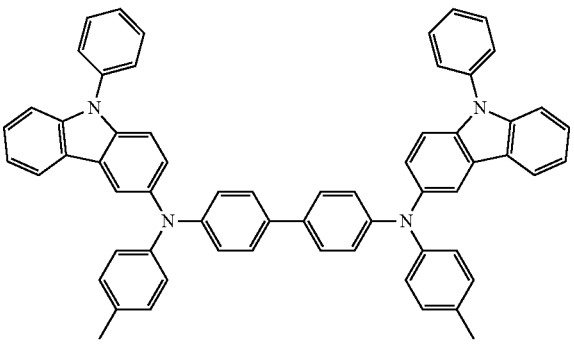

303

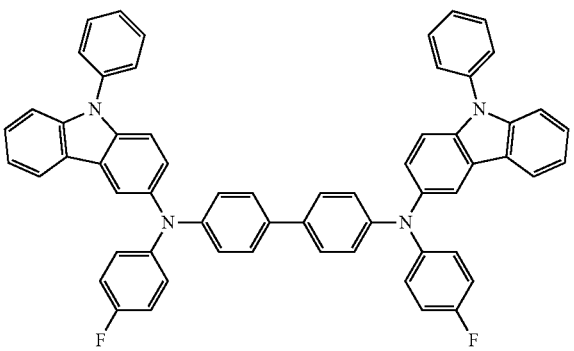

304

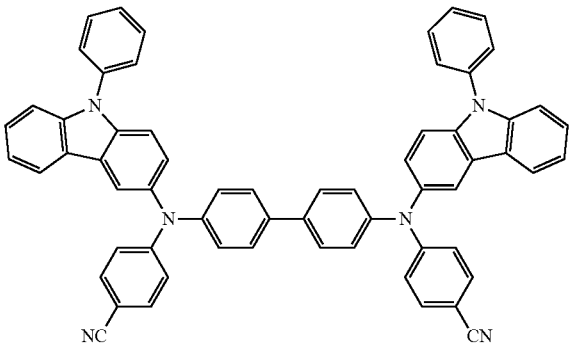

305

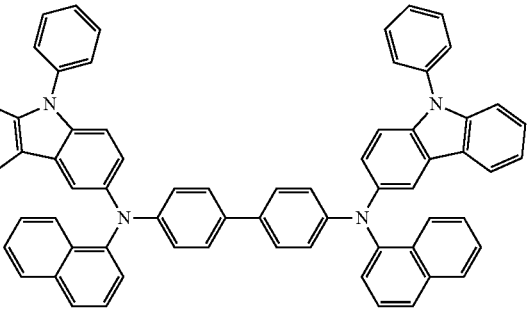

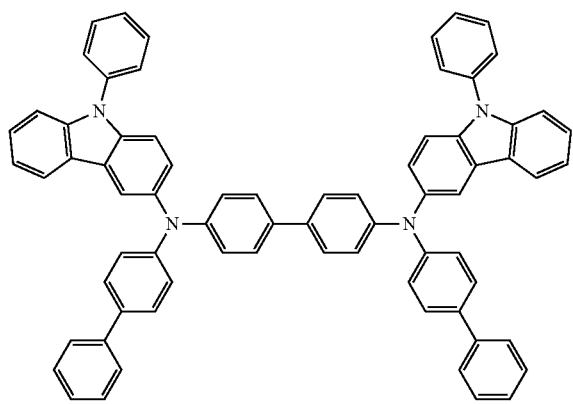
306
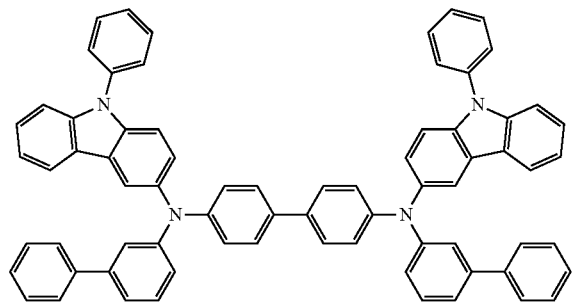
307
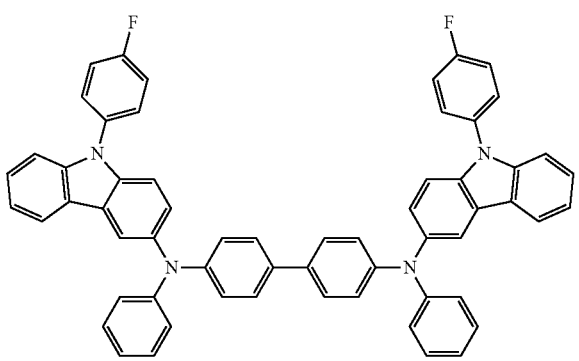
308
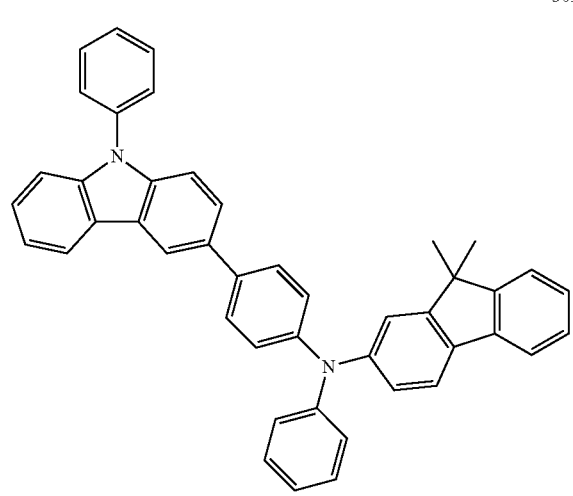
309
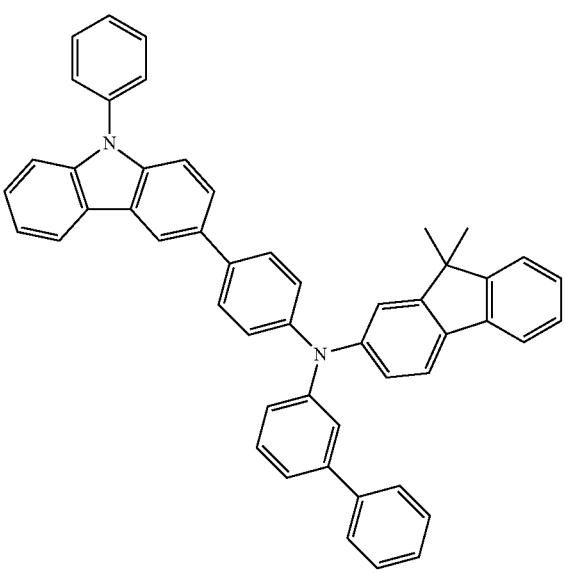
310
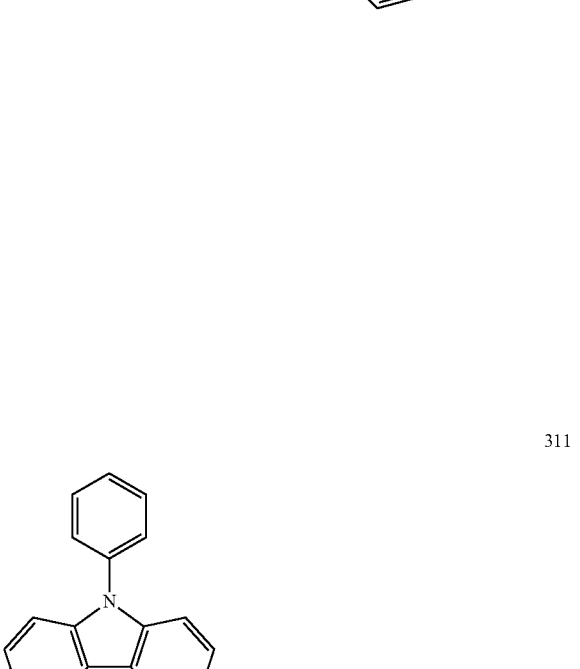
311
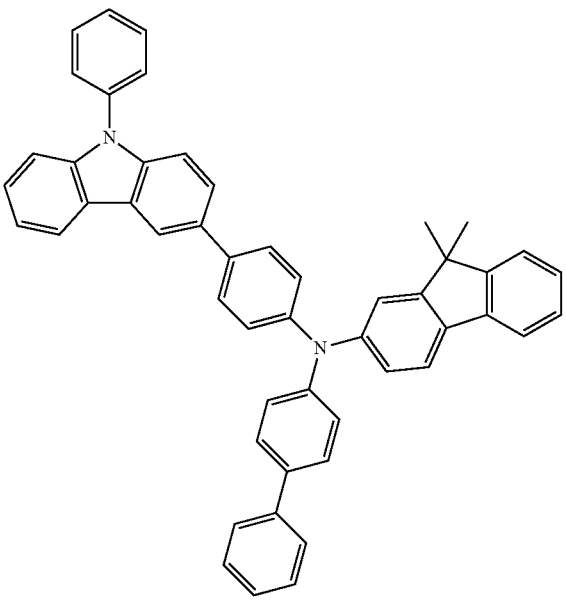

312
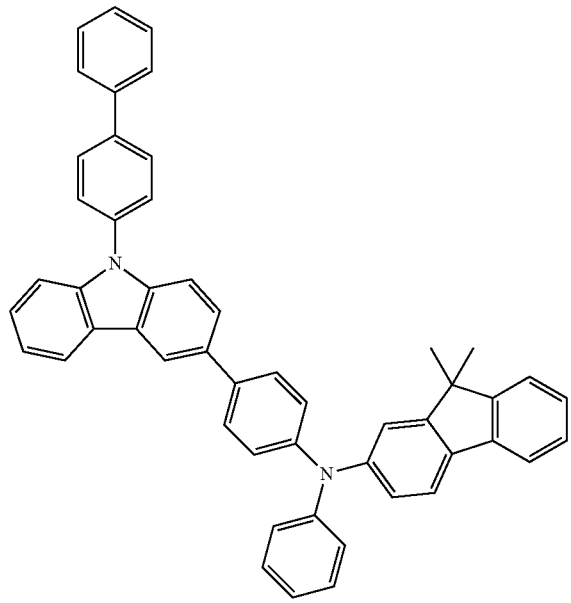
314
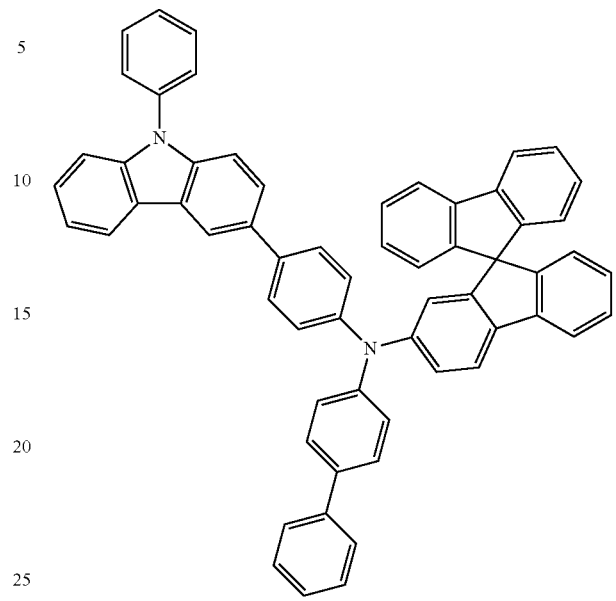
313
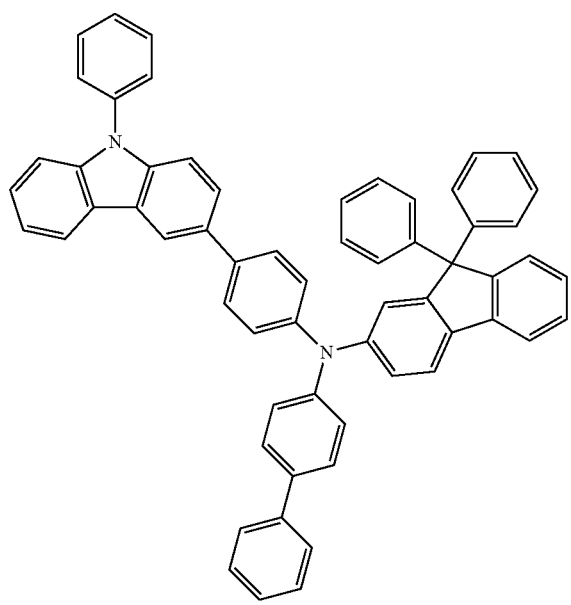
315
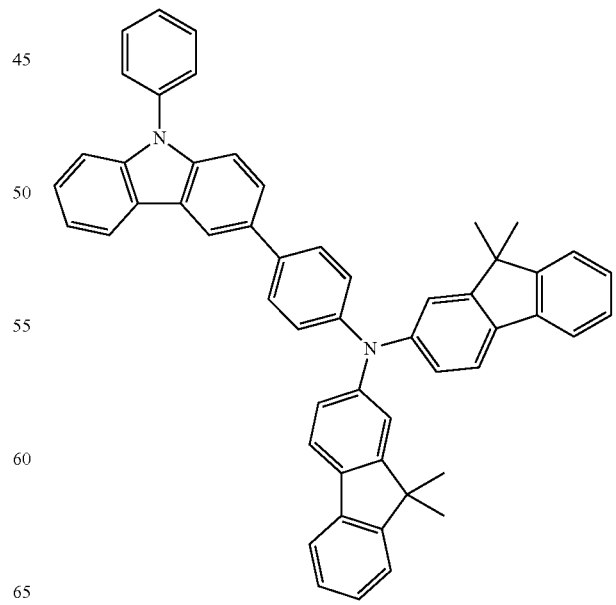

-continued

316

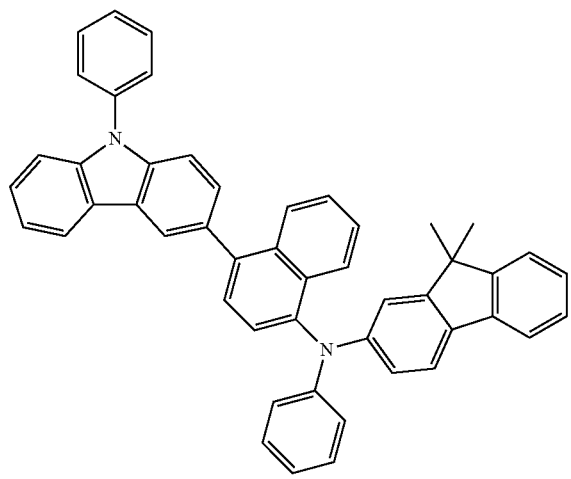

317

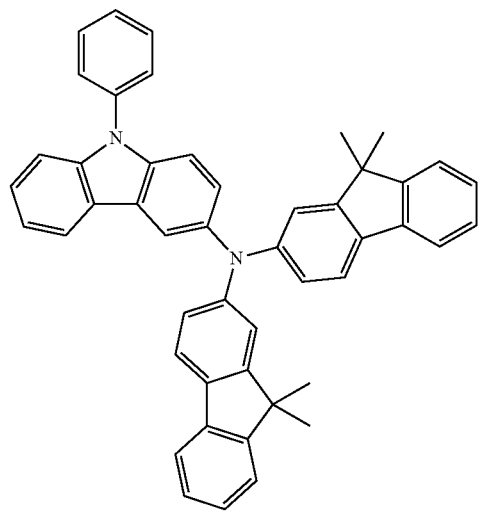

318

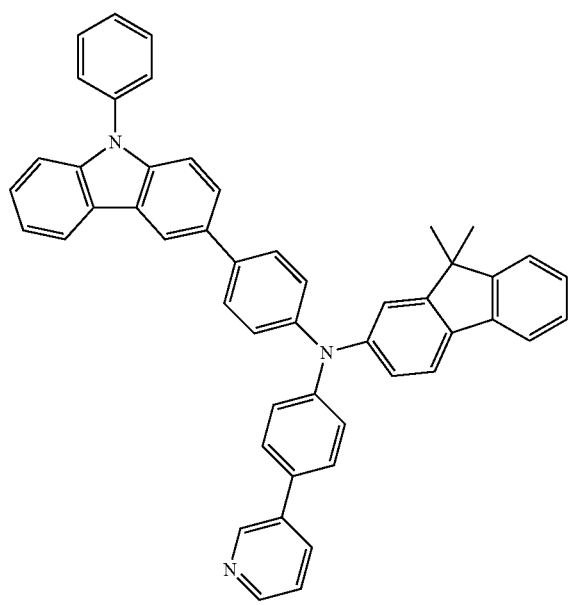

-continued

319

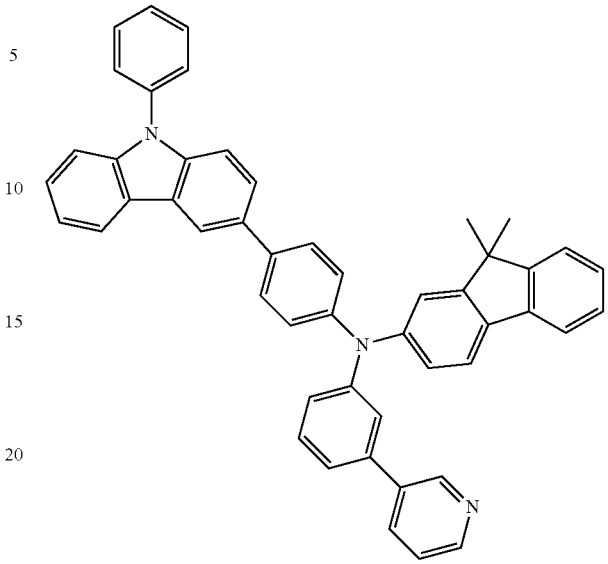

320

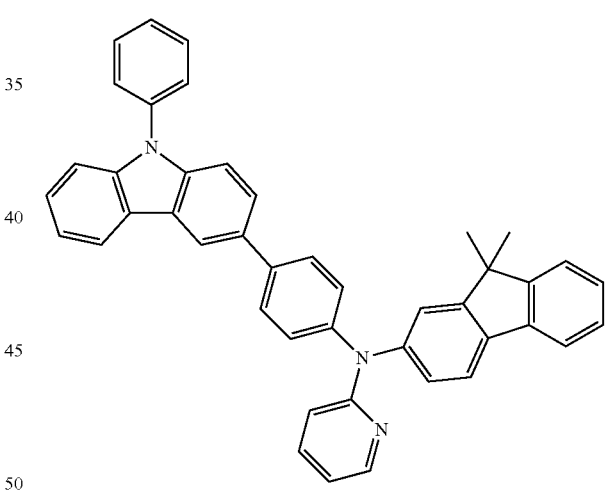

At least one of the HIL, HTL, and H-functional layer may further include a charge-generating material for improved layer conductivity, in addition to a suitable hole injecting material, hole transport material, and/or material having both hole injection and hole transport capabilities as described above.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below, but not limited thereto.

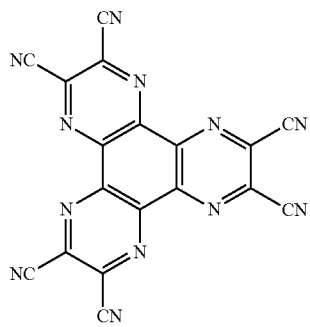

<Compound 200>

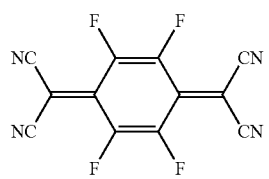

<F4-TCNQ>

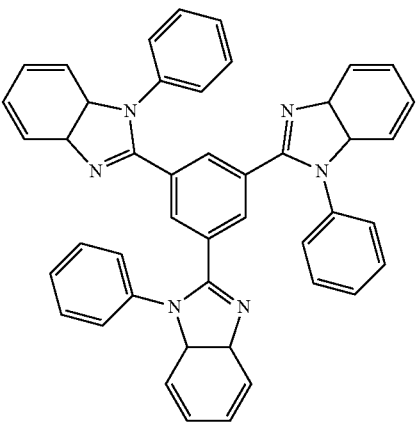

TPBI

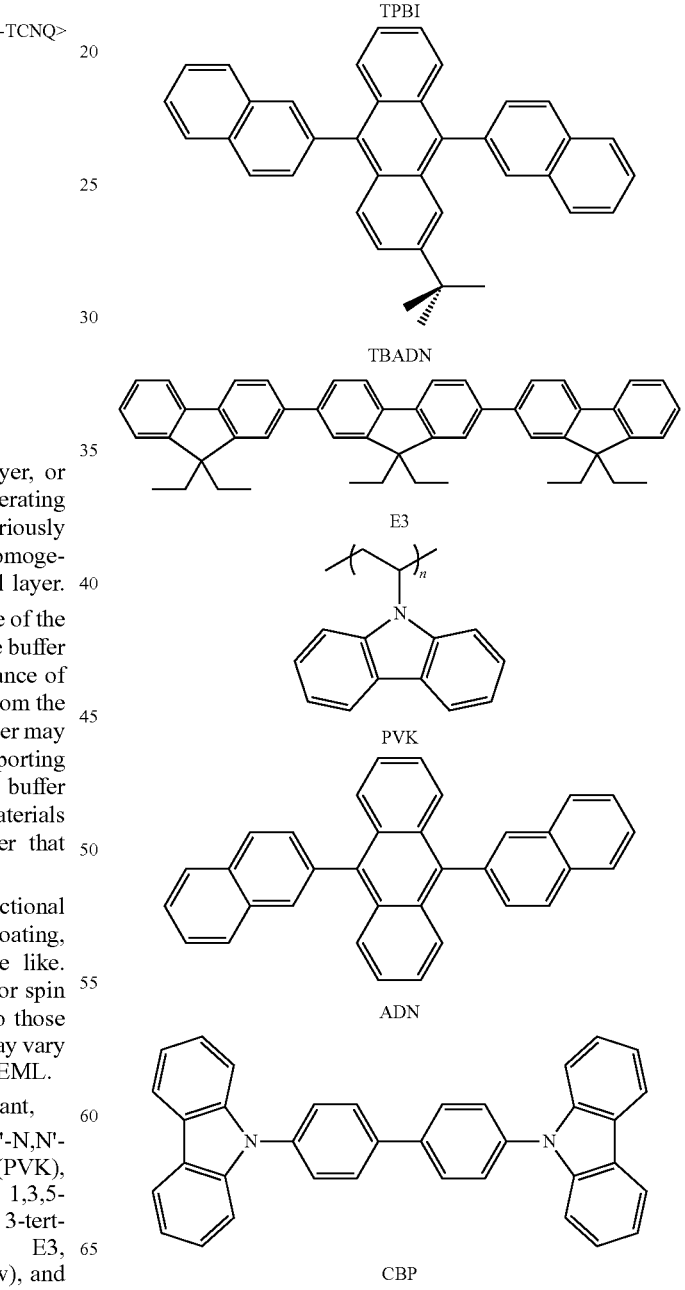

TBADN

E3

PVK

ADN

CBP

When the hole injection layer, hole transport layer, or H-functional layer further includes a charge-generating material, the charge-generating material may be variously modified by being homogeneously dispersed or inhomogeneously distributed in the HIL, HTL or H-functional layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The buffer layer may include a suitable hole injecting material or hole transporting material. In some other example embodiments, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition conditions may be similar to those for the formation of the HIL, though the conditions may vary depending on a compound that is used to form the EML.

The emission layer may include a host and a dopant,

Non-limiting examples of the host are $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), dmCBP (see a formula below), and Compounds 501 to 509 below.

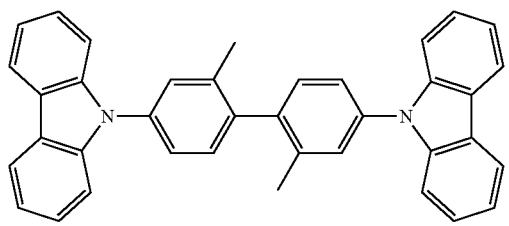
dmCBP
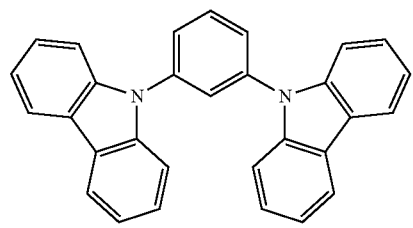
501
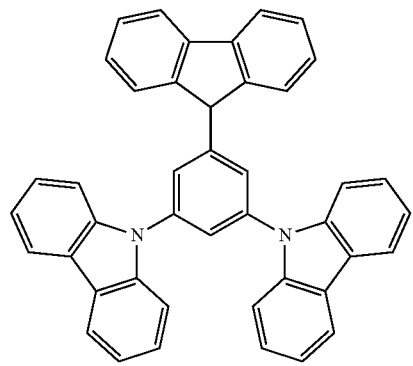
502
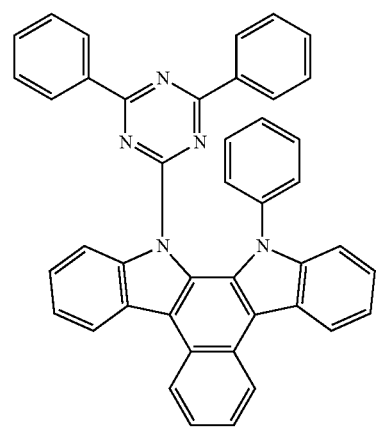
503
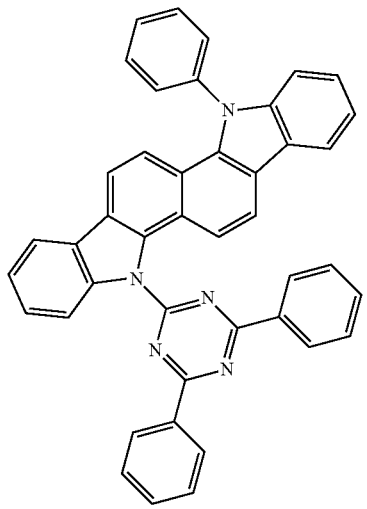
504
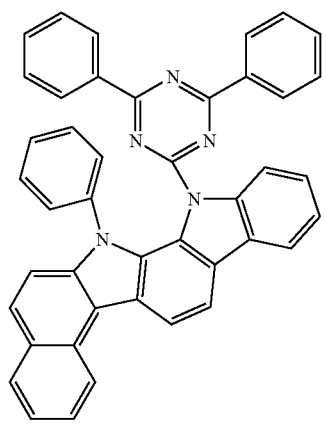
505
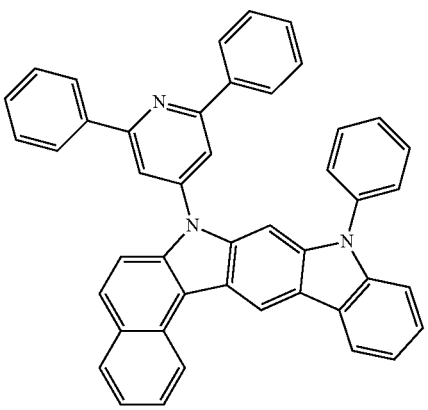
506

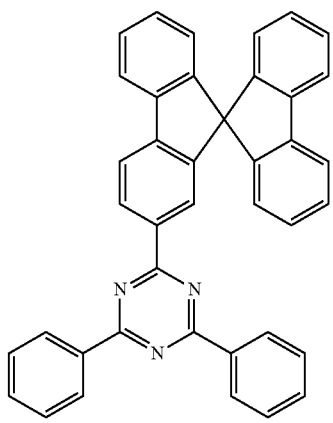

507

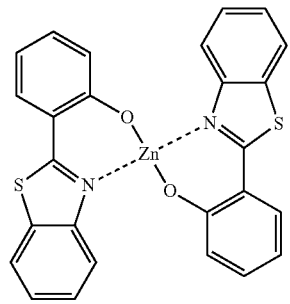

508

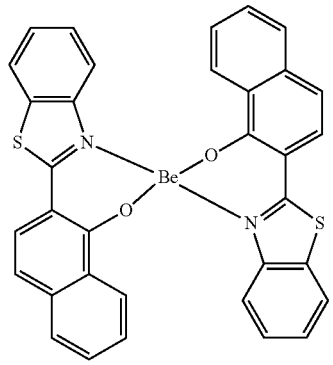

509

In some example embodiments, an anthracene-based compound represented by Formula 400 below may be used as the host.

<Formula 400>

Ar$_{114}$—(Ar$_{112}$)$_h$—[anthracene with (Ar$_{115}$)$_i$ and (Ar$_{116}$)$_j$]—(Ar$_{111}$)$_g$—Ar$_{113}$ In Formula 400, Ar$_{111}$ and Ar$_{112}$ may be each independently a substituted or unsubstituted C$_5$-C$_{60}$ arylene group; Ar$_{113}$ to Ar$_{116}$ may be each independently a substituted or unsubstituted C$_1$-C$_{10}$ alkyl group, or a substituted or unsubstituted C$_6$-C$_{60}$ aryl group; and g, h, i, and j may be each independently an integer from 0 to 4.

In some example embodiments, Ar$_{111}$ and Ar$_{112}$ in Formula 400 may be each independently a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, and an anthryl group.

In Formula 400 above, g, h, i, and j may be each independently 0, 1, or 2.

In some example embodiments, Ar$_{113}$ to Ar$_{116}$ in Formula 400 may be each independently selected from a C$_1$-C$_{10}$ alkyl group, each substituted with at least one of a phenyl group, a naphthyl group, and an anthryl group; a phenyl group, a naphthyl group, an anthryl group, a pyrenyl group, a phenanthrenyl group, a fluorenyl group, a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a phenyl group, a naphthyl group, an anthryl group, a pyrenyl group, a phenanthrenyl group, and a fluorenyl group; and

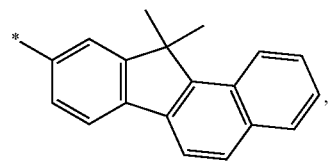 [SMILES: *c1ccc2c(c1)C(C)(C)c1c-2ccc2ccccc12]

but are not limited thereto.

For example, the anthracene-based compound of Formula 400 above may be one of the compounds represented by the following formulae, but is not limited thereto:

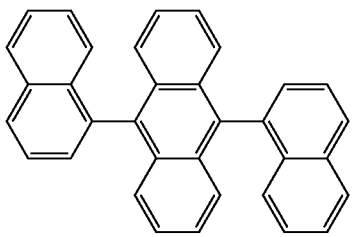

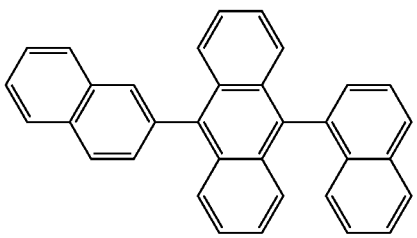

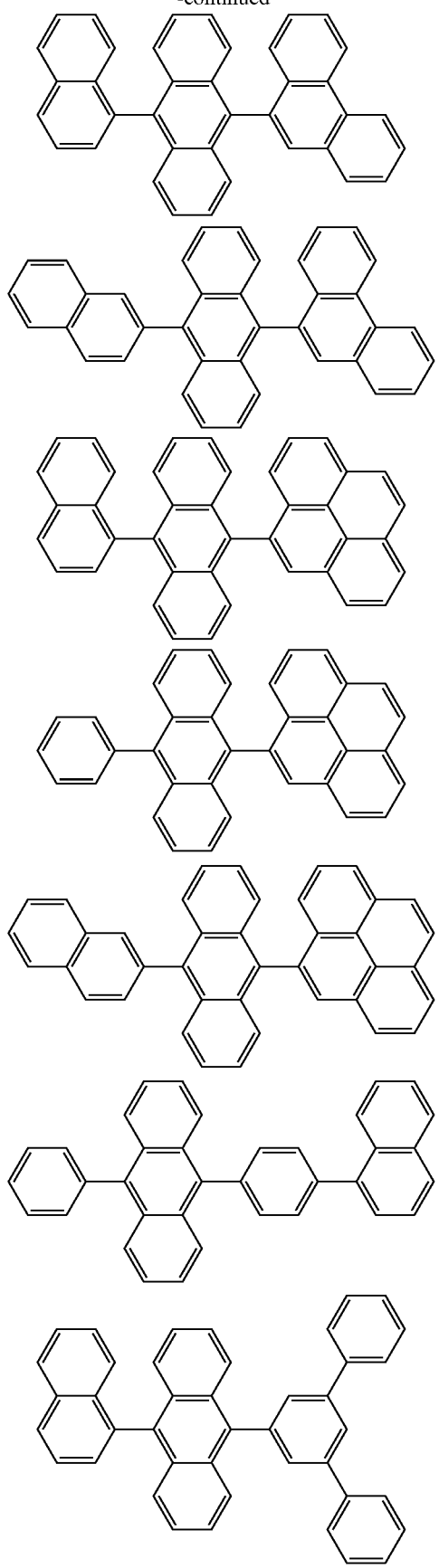
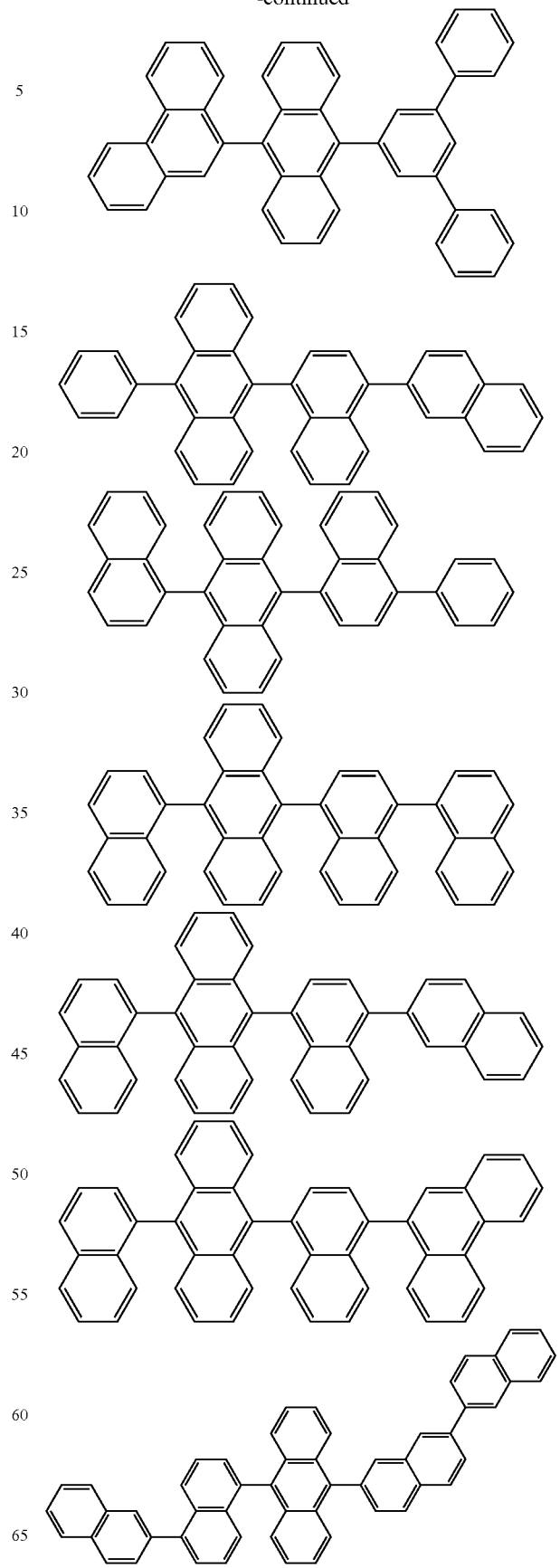

77
-continued
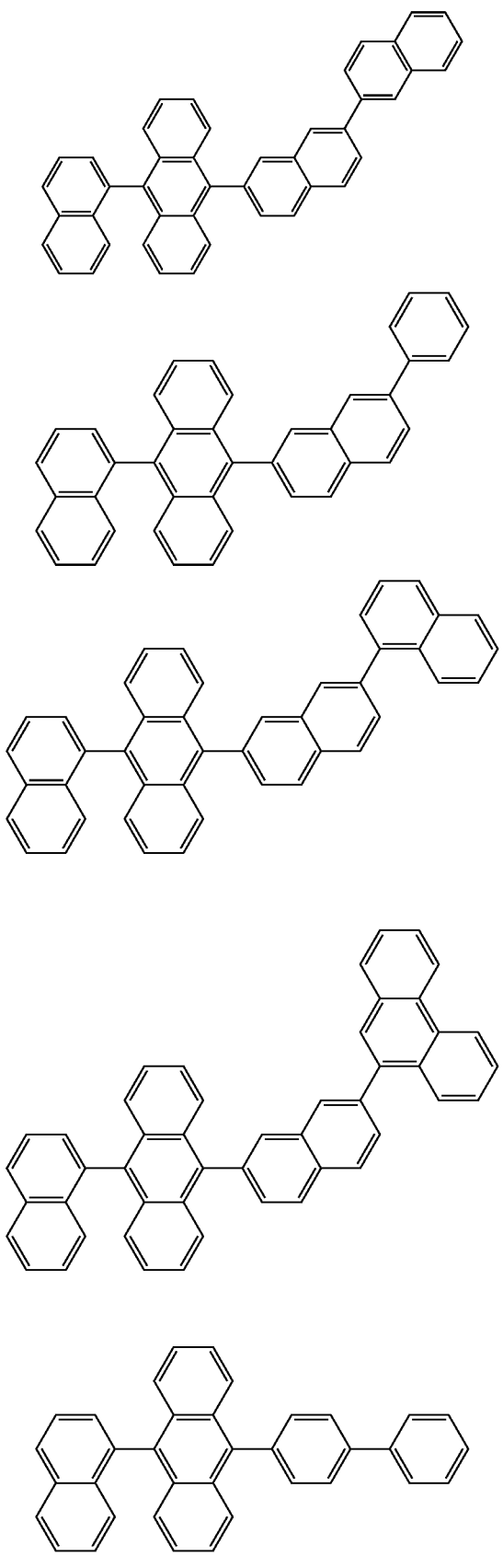
78
-continued
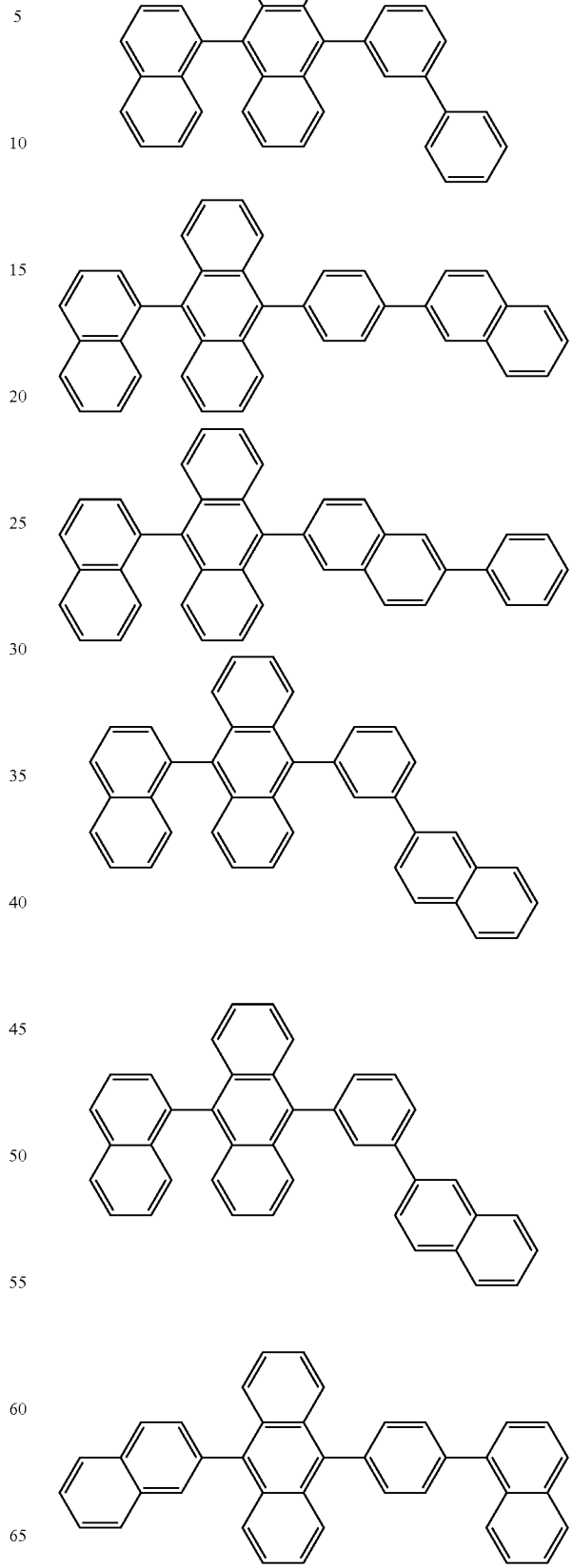

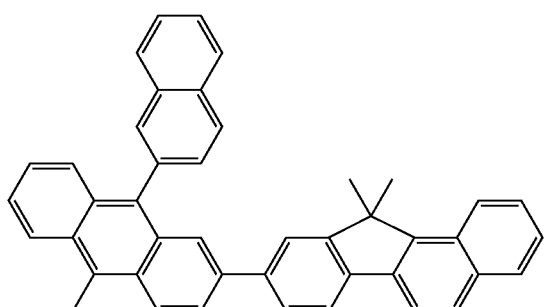
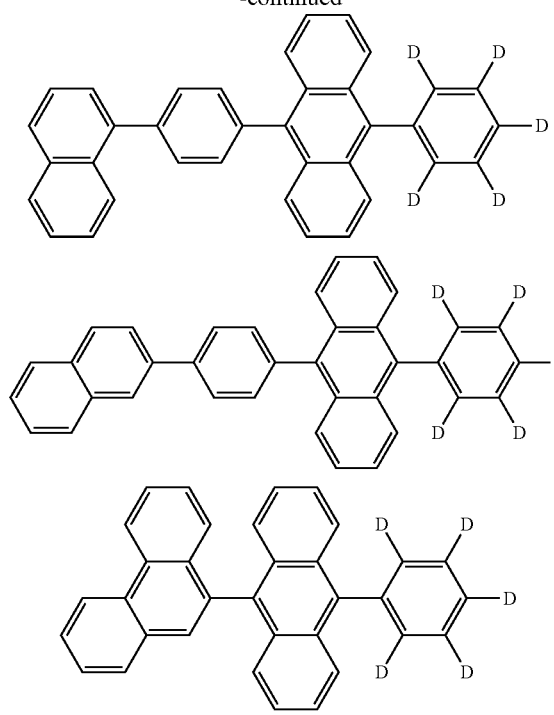
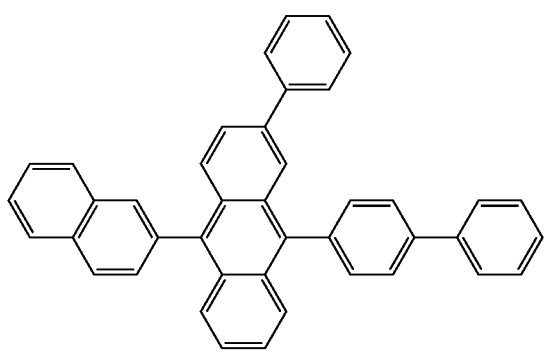
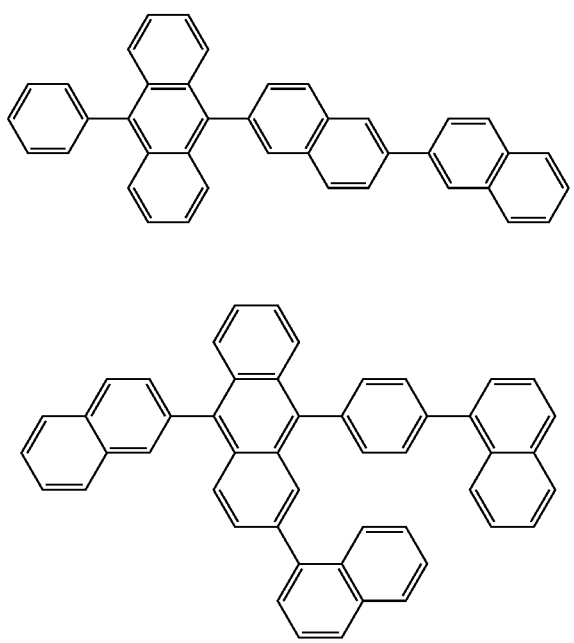
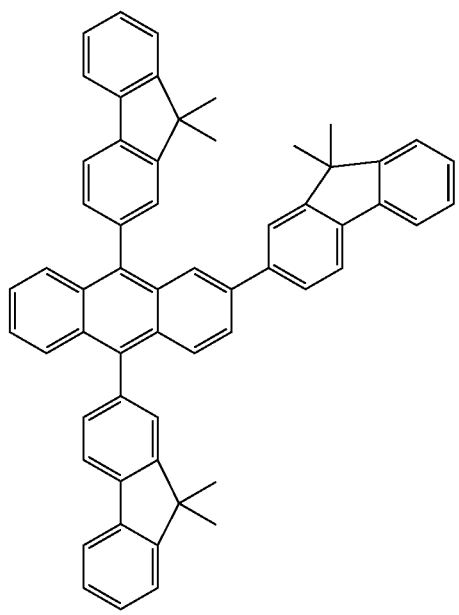

-continued

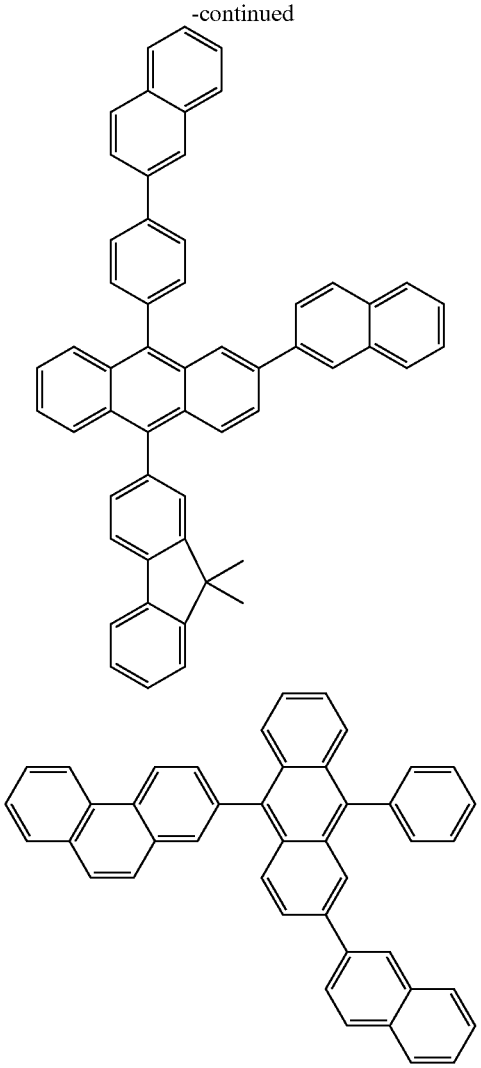

In some example embodiments, an anthracene-based compound represented by Formula 401 below may be used as the host.

<Formula 401>

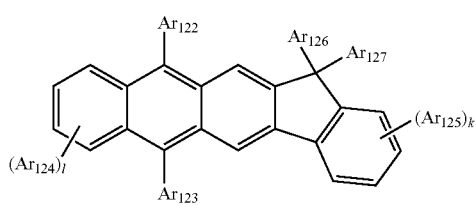

$Ar_{122}$ to $Ar_{125}$ in Formula 401 may be defined as described above in conjunction with $Ar_{113}$ in Formula 400, and thus detailed descriptions thereof will not be provided here.

$Ar_{126}$ and $Ar_{127}$ in Formula 401 above may be each independently a $C_1$-$C_{10}$ alkyl group (for example, a methyl group, an ethyl group, or a propyl group).

In Formula 401, k and l may be each independently an integer from 0 to 4, for example, 0, 1, or 2.

For example, the anthracene compound of Formula 401 above may be one of the compounds represented by the following formulae, but is not limited thereto:

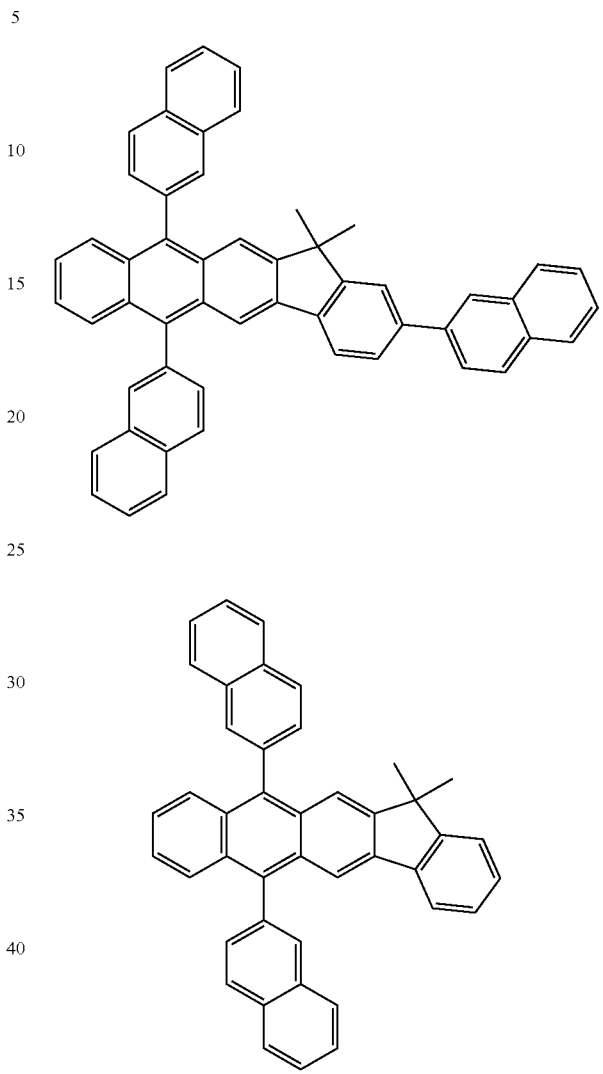

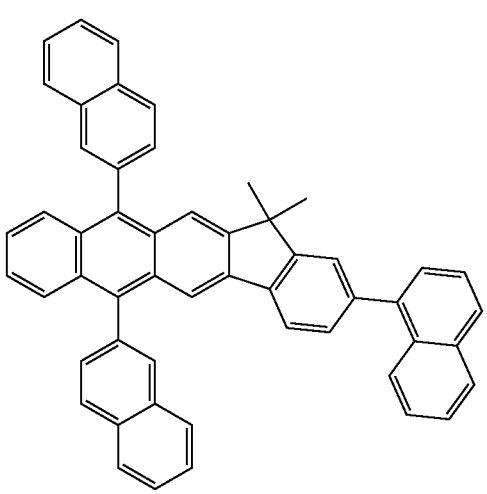

-continued

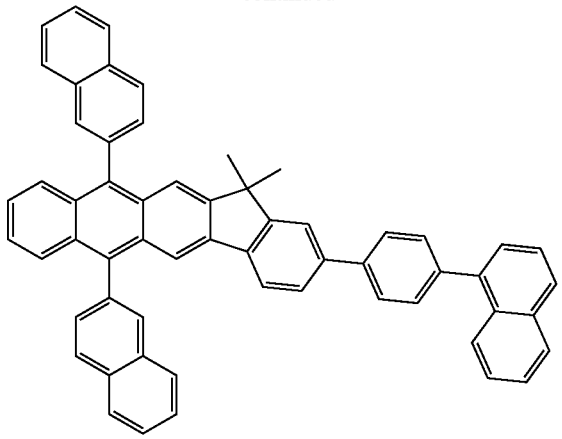 [SMILES: CC1(C)c2cc(-c3ccc(-c4cccc5ccccc45)cc3)ccc2-c2cc3c(-c4ccc5ccccc5c4)c4ccccc4c(-c4ccc5ccccc5c4)c3cc21]

When the organic light-emitting diode is a full color organic light-emitting diode, the emission layer may be patterned into a red emission layer, a green emission layer, and a blue emission layer. In some example embodiments, the EML 23 may include a red emission layer, a green emission layer, and/or a blue emission layer that are stacked upon one another to emit white light, but is not limited thereto.

A dopant in the EML may be the amine-based compound of Formula 1, which may act as a fluorescent dopant emitting light based on the mechanism of fluorescence. For example, the amine-based compound of Formula 1 may act as a fluorescent dopant emitting blue light, green light, or bluish green light, but is not limited thereto.

Non-limiting examples of suitable dopants are as follows.

At least one of the red EML, the green EML, and the blue EML may include a dopant below (ppy=phenylpyridine).

Non-limiting examples of the blue dopant are compounds represented by the following formulae.

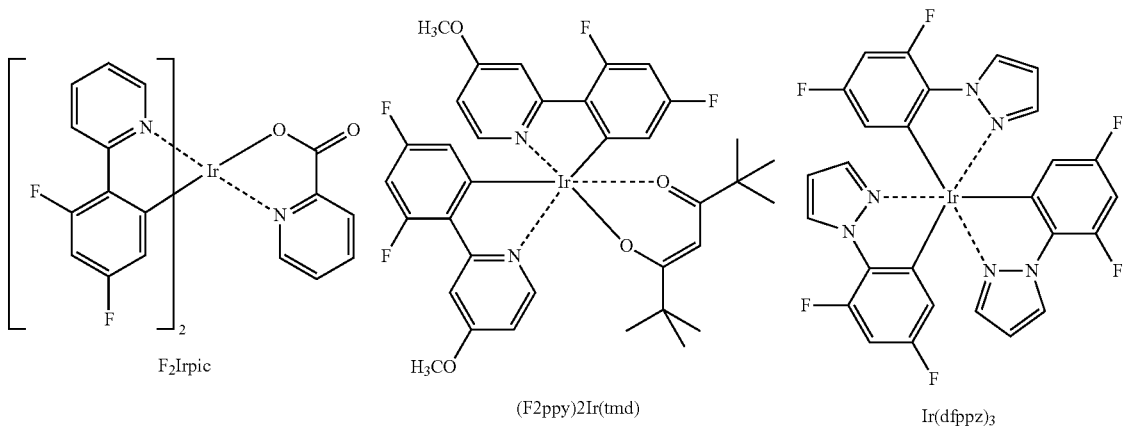

F₂Irpic (F2ppy)2Ir(tmd)

Ir(dfppz)₃

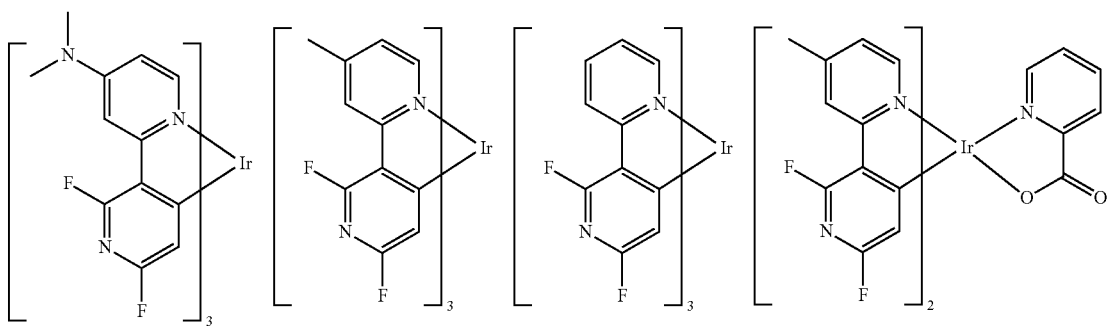

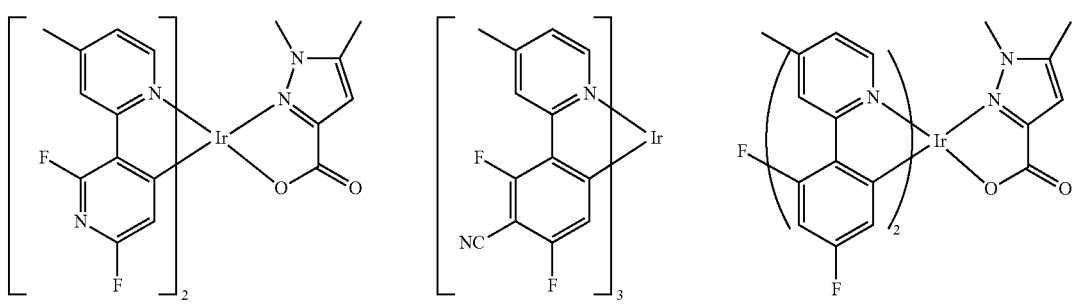

-continued
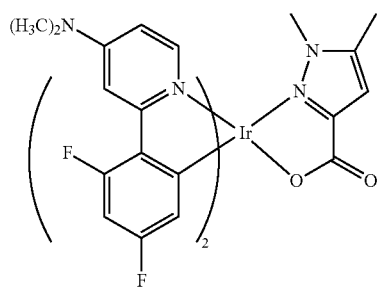
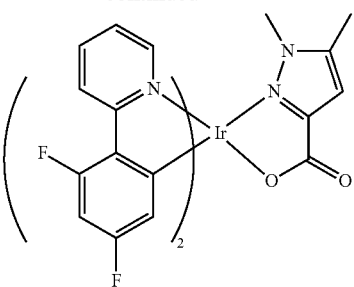
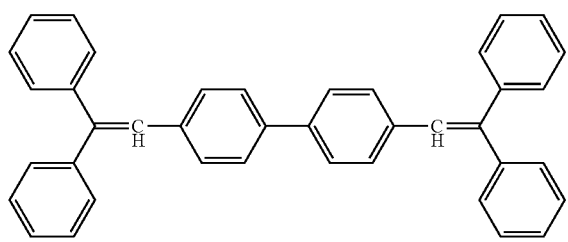
DPVBi
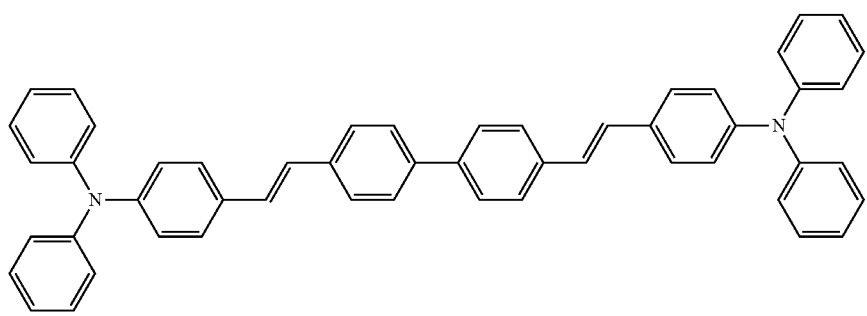
DPAVBi
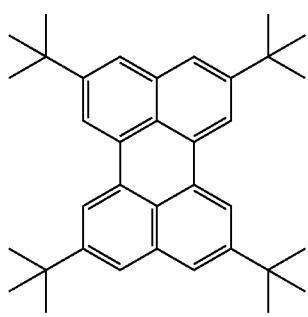
TBPe Non-limiting examples of the red dopant are compounds represented by the following formulae. For example, the red dopant may be DCM or DCJTB, which will be described later.
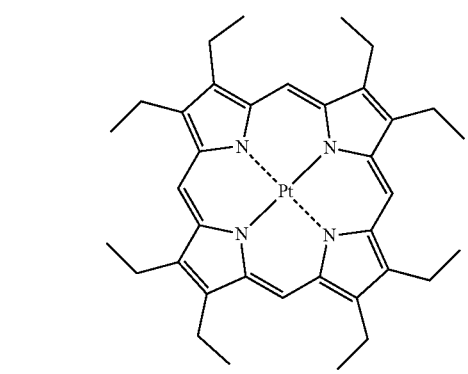
PtOEP
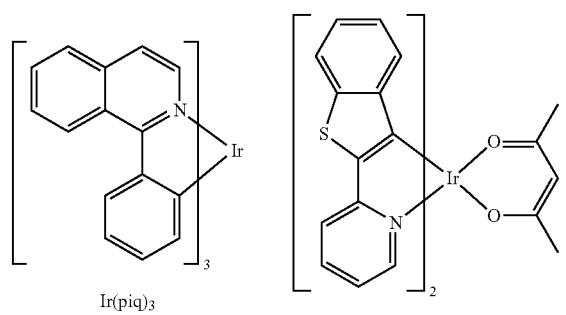
Ir(piq)₃    Btp₂Ir(acac)
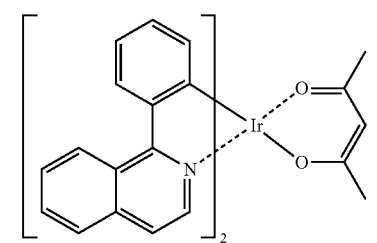
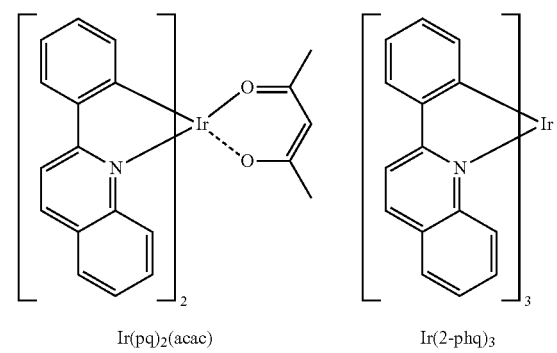
Ir(pq)₂(acac)    Ir(2-phq)₃
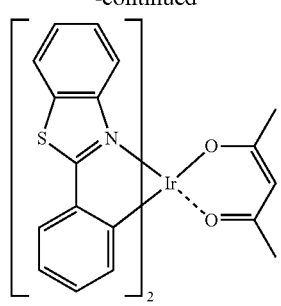
Ir(BT)₂(acac)
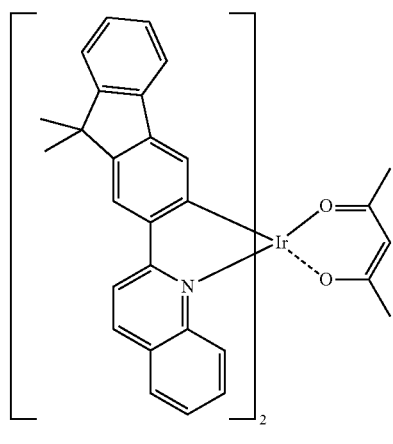
Ir(flq)₂(acac)
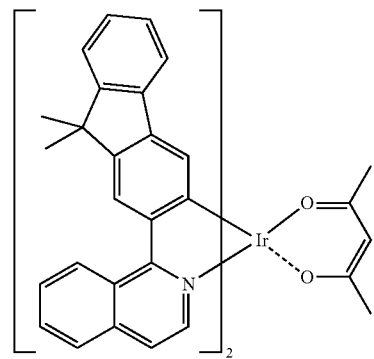
Ir(fliq)₂(acac)
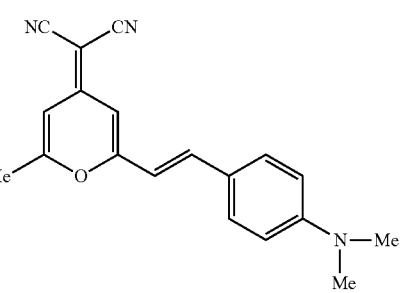
DCM

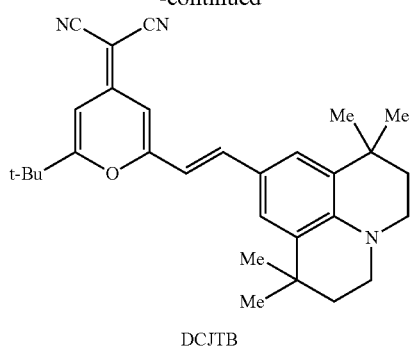
DCJTB
Non-limiting examples of the green dopant are compounds represented by the following formulae. For example, the green dopant may be C545T represented below.
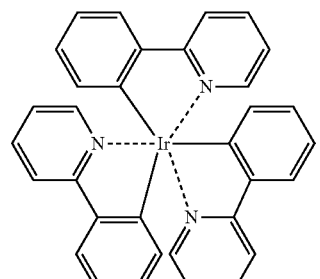
Ir(ppy)₃
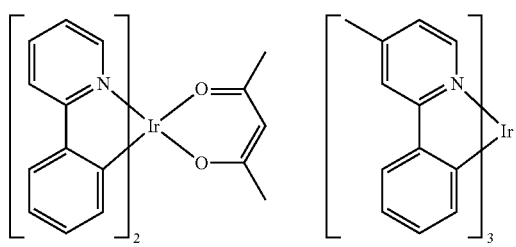
Ir(ppy)₂(acac)          Ir(mpyp)₃
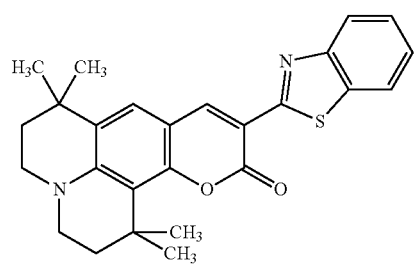
C545T
Non-limiting examples of the dopant that may be used in the EML are complexes represented by the following formulae.
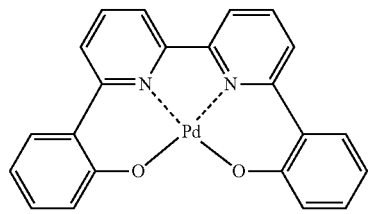
D1
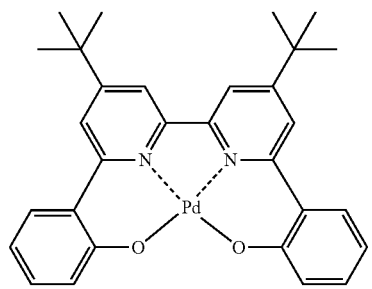
D2
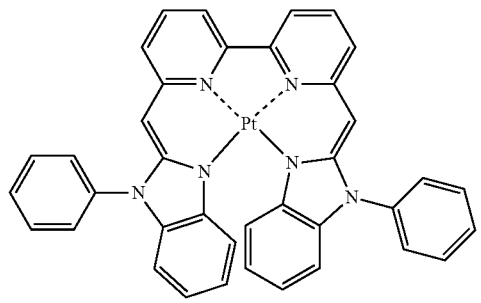
D3
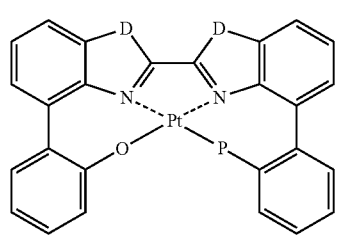
D4
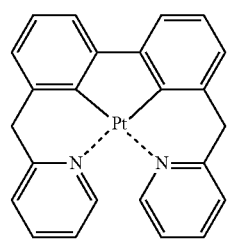
D5
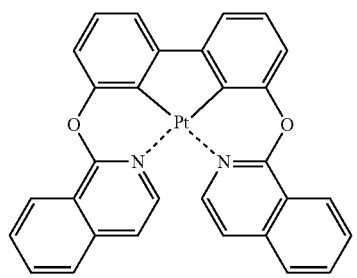
D6

-continued
D7
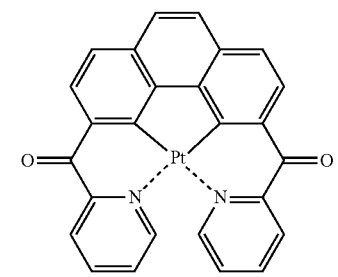
D8
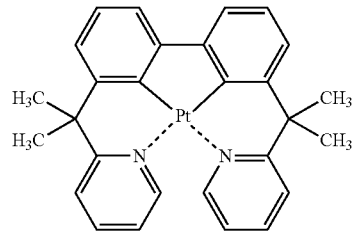
D9
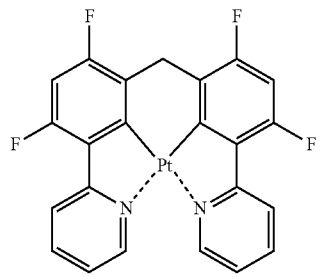
D10
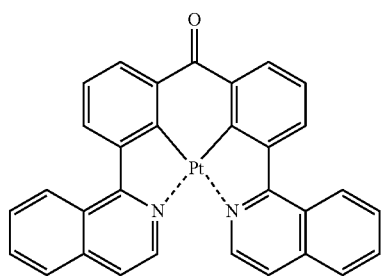
D11
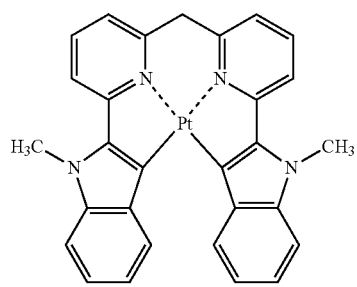
D12
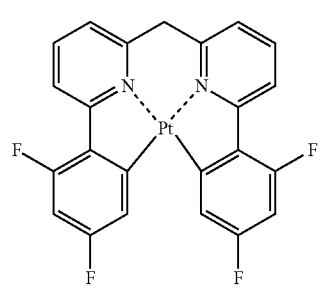
-continued
D13
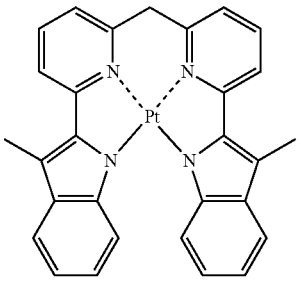
D14
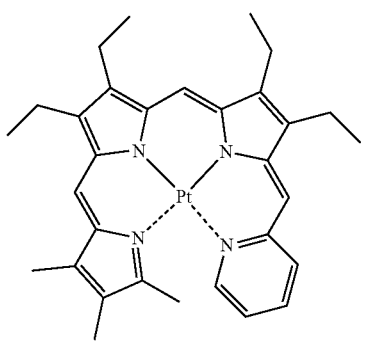
D15
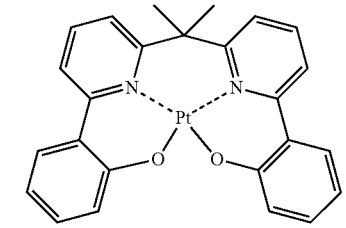
D16
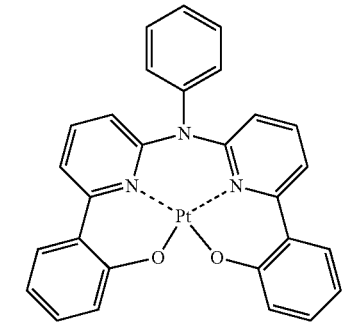
D17
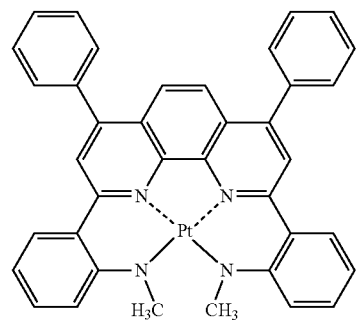

-continued
D18 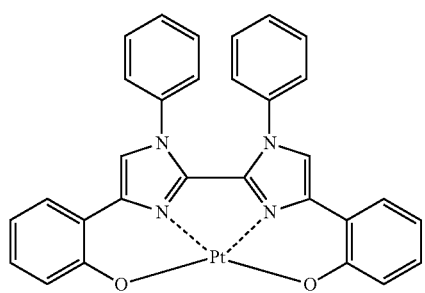
D19 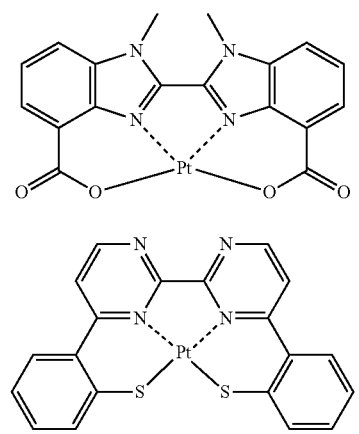
D20 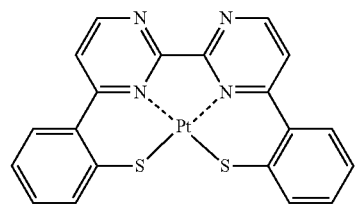
D21 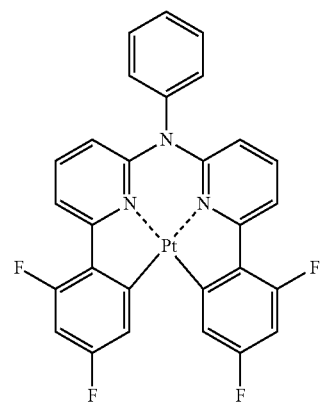
D22 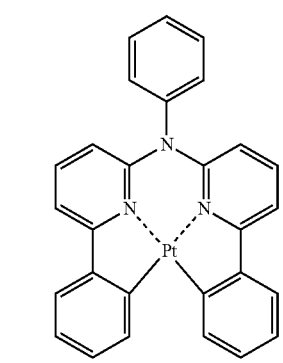
-continued
D23 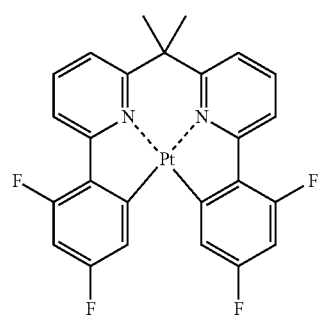
D24 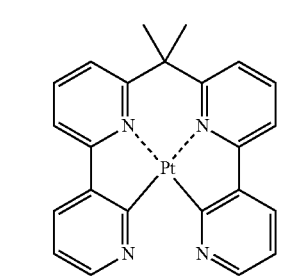
D25 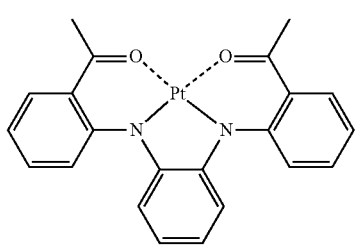
D26 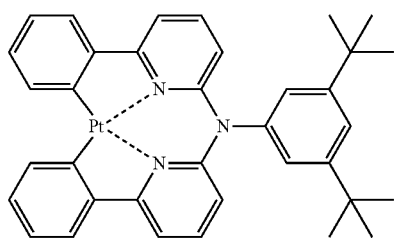
D27 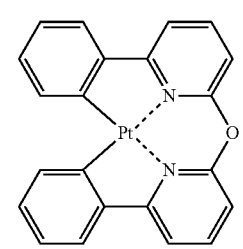
D28 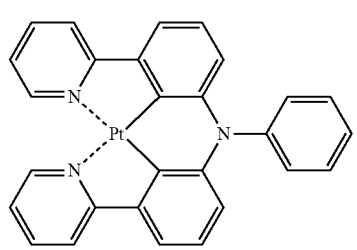

D29 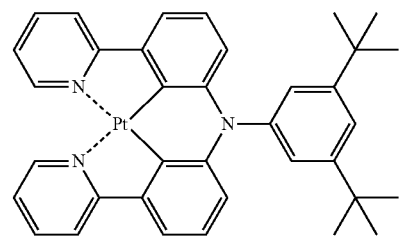
D30 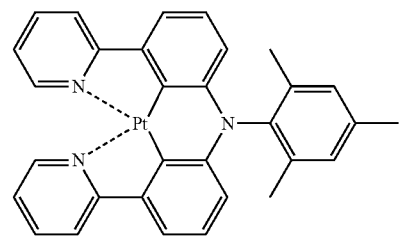
D31 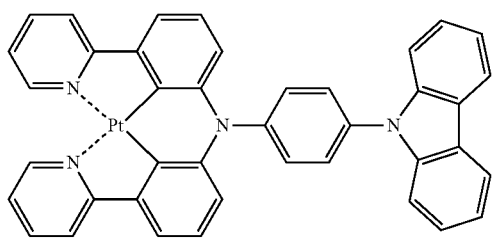
D32 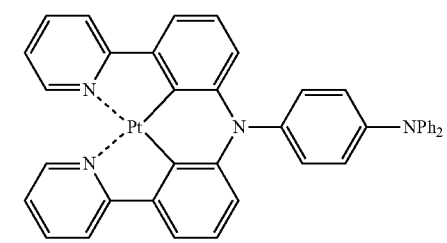
D33 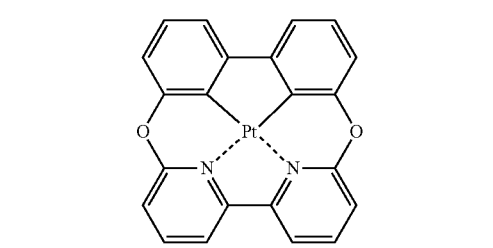
D34 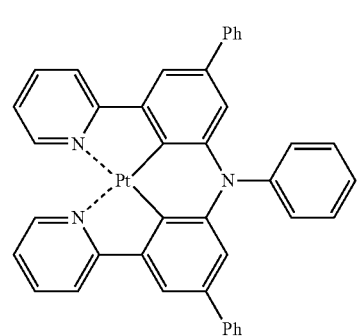
D35 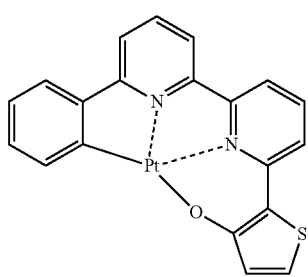
D36 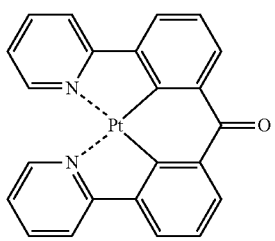
D37 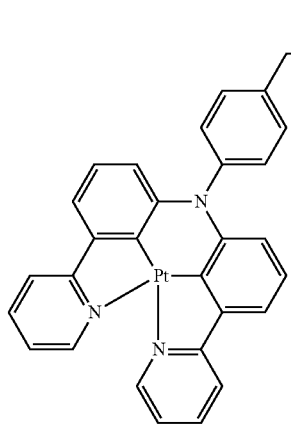
D38 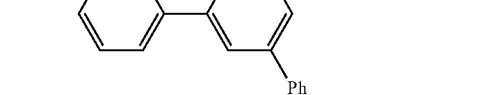
D39 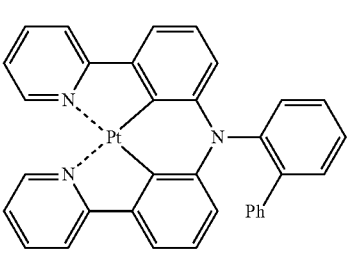

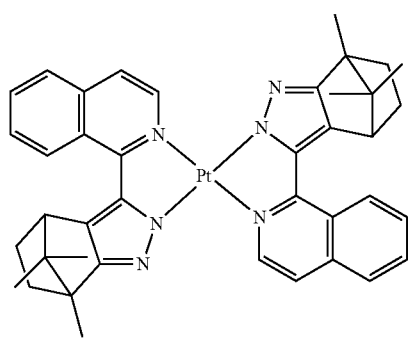 D40
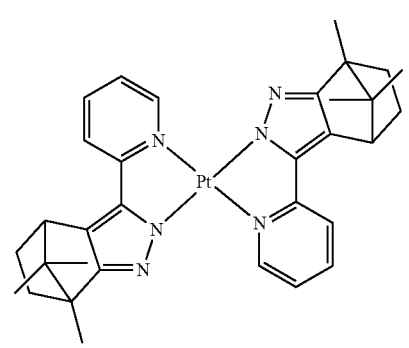 D41
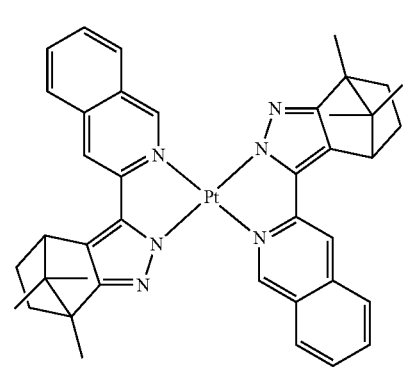 D42
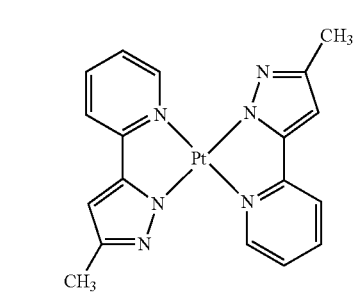 D43
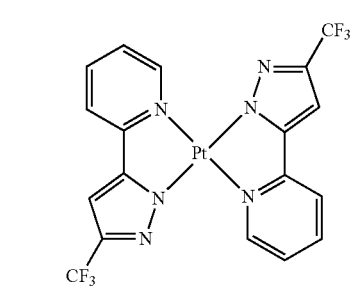 D44
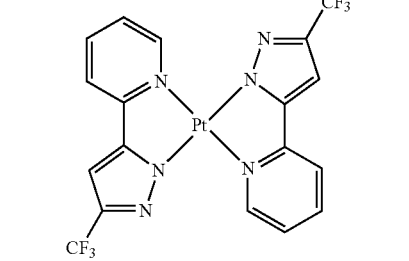 D45
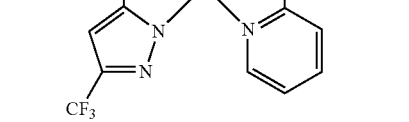 D46
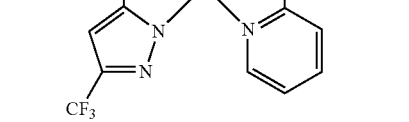 D47
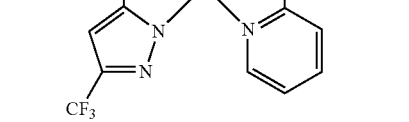 D48
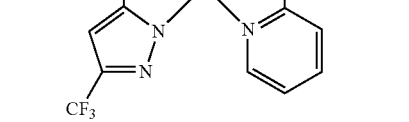 D49

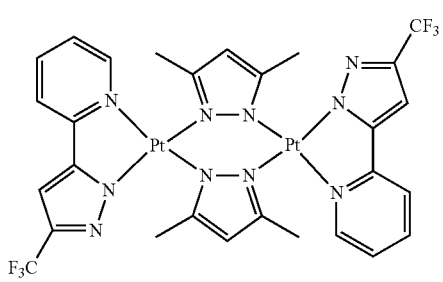

D50

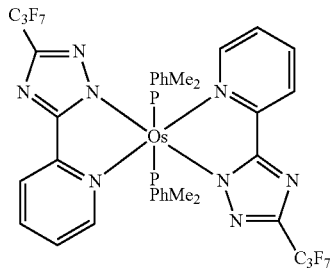

Os(hptz)₂(PPh₂Me₂)₂

Non-limiting examples of the dopant that may be used in the EML are Os complexes represented by the following formulae.

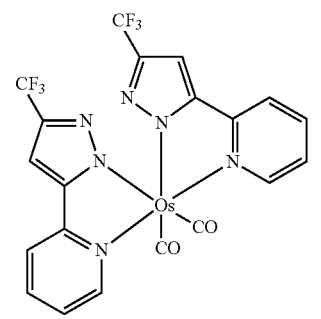

Os(fppz)₂(CO)₂

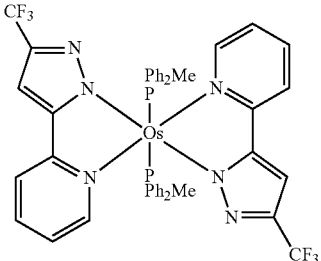

Os(fppz)₂(PPh₂Me)₂

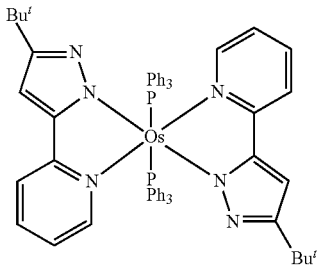

Os(bppz)₂(PPh₃)₂

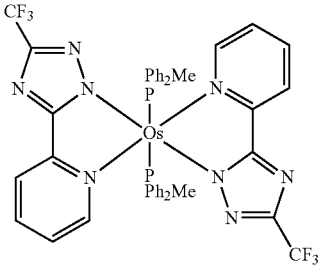

Os(fptz)₂(PPh₂Me)₂

When the EML includes both a host and a dopant, the amount of the dopant may be from about 0.01 to about 15 parts by weight typically based on about 100 parts by weight of the host, but is not limited to this range.

The thickness of the EML may be about 100 Å to about 1000 Å, and in some example embodiments, may be from about 200 Å to about 600 Å. When the thickness of the EML is within these ranges, the EML may have good light emitting ability without a substantial increase in driving voltage.

Then, an ETL may be formed on the EML by using any of a variety of suitable methods, such as vacuum deposition, or spin coating, casting, or the like. When the ETL is formed using vacuum deposition or spin coating, the deposition and coating conditions may be similar to those for the formation of the HIL, though the deposition and coating conditions may vary depending on compound that is used to form the ETL. A material for forming the ETL may be a suitable material that may stably transport electrons injected from an electron injecting electrode (cathode). Non-limiting examples of materials for forming the ETL are a quinoline derivative, such as tris(8-quinolinolate)aluminum (Alq₃), TAZ, BAlq, beryllium bis(benzoquinolin-10-olate) (Bebq₂), 9,10-di(naphthalene-2-yl)anthracene (ADN), Compound 201, and Compound 202, or the like.

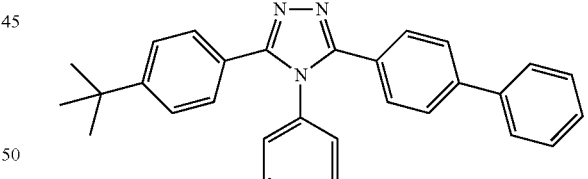

TAZ

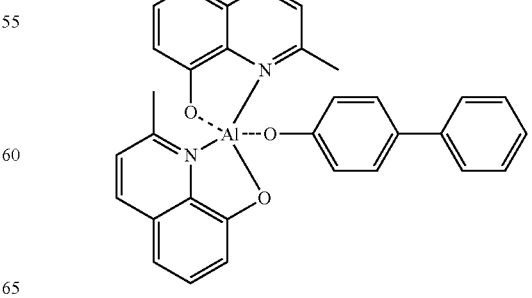

BAlq

<Compound 201>

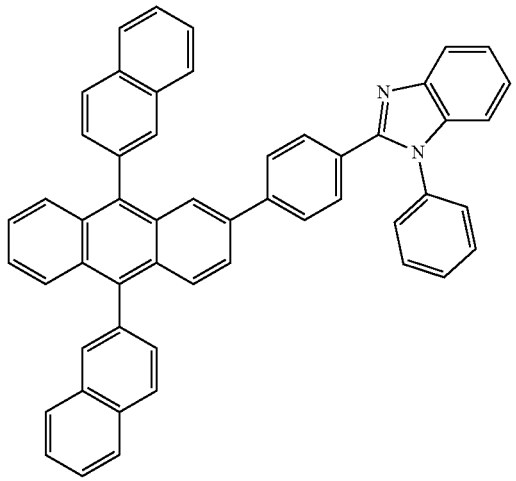

<Compound 202>

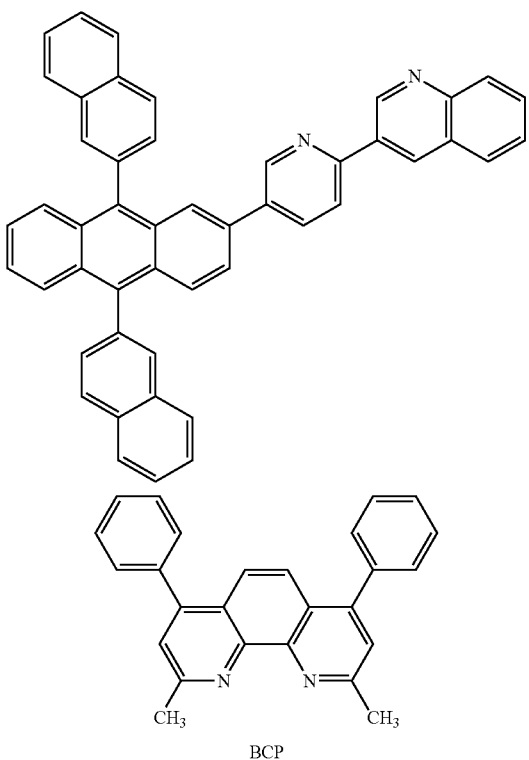

BCP

A thickness of the ETL may be from about 100 Å to about 1,000 Å, and in some example embodiments, may be from about 150 Å to about 500 Å. When the thickness of the ETL is within these ranges, the ETL may have satisfactory electron transporting ability without a substantial increase in driving voltage.

In some example embodiments the ETL may further include a metal-containing material, in addition to an electron-transporting organic compound as described above.

The metal-containing material may include a lithium (Li) complex. Non-limiting examples of the Li complex are lithium quinolate (LiQ) or Compound 203 below:

<Compound 203>

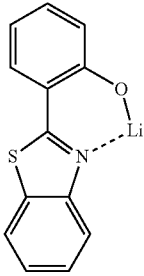

Then, an EIL, which facilitates injection of electrons from the cathode, may be formed on the ETL. A suitable electron-injecting material may be used to form the EIL.

Non-limiting examples of materials for forming the EIL are LiF, NaCl, CsF, $Li_2O$, BaO, or the like. The deposition conditions for forming the EIL may be similar to those for the formation of the HIL, though the deposition conditions may vary depending the material that is used to form the EIL.

A thickness of the EIL may be from about 1 Å to about 100 Å, and in some example embodiments, may be from about 3 Å to about 90 Å. When the thickness of the EIL is within these ranges, the EIL may have satisfactory electron injection ability without a substantial increase in driving voltage.

The second electrode 17 is disposed on the organic layer 15. The second electrode 17 may be a cathode that is an electron injection electrode. A material for forming the second electrode 17 may be a metal, an alloy, an electro-conductive compound, which have a low work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some example embodiments, to manufacture a top-emission light-emitting diode, the transmission electrode may be formed of indium tin oxide (ITO) or indium zinc oxide (IZO).

Although the organic light-emitting diode of The FIGURE is described above, the present example embodiment is not limited thereto.

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. A suitable hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

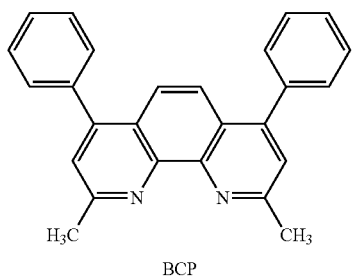 [SMILES: Cc1cc(-c2ccccc2)c2ccc3c(-c4ccccc4)cc(C)nc3c2n1 ; "BCP"]

BCP

A thickness of the HBL may be from about 20 Å to about 1000 Å, and in some example embodiments, may be from about 30 Å to about 300 Å. When the thickness of the HBL is within these ranges, the HBL may have improved hole blocking ability without a substantial increase in driving voltage.

As used herein, the unsubstituted $C_1$-$C_{60}$ alkyl group (or a $C_1$-$C_{60}$ alkyl group) may be a linear or branched $C_1$-$C_{60}$ alkyl group, such as a methyl group, an ethyl group, a propyl group, an isobutyl group, a sec-butyl group, a pentyl group, an iso-amyl group, and a hexyl group. The substituted $C_1$-$C_{60}$ alkyl group may include at least one substituent selected from among, but not limited to, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{24}$)($Q_{25}$), and —Si($Q_{26}$)($Q_{27}$)($Q_{28}$) (where $Q_{24}$ and $Q_{25}$ may each independently be a $C_6$-$C_{60}$ aryl group or a $C_2$-$C_{60}$ heteroaryl group; and $Q_{26}$ to $Q_{28}$ may each independently be a $C_1$-$C_{60}$ alkyl group, a $C_1$-$C_{60}$ alkoxy group, a $C_6$-$C_{60}$ aryl group, or a $C_2$-$C_{60}$ heteroaryl group).

The unsubstituted $C_1$-$C_{60}$ alkoxy group (or a $C_1$-$C_{60}$ alkoxy group) may be a group represented by Formula —OA, wherein A is an unsubstituted $C_1$-$C_{60}$ alkyl group described above. Examples of the unsubstituted $C_1$-$C_{60}$ alkoxy group are a methoxy group, an ethoxy group, an isopropyloxy group, and the like. At least one of the hydrogen atoms in the alkoxy group may be substituted with the substituents described above in conjunction with the substituted $C_1$-$C_{60}$ alkyl group.

The unsubstituted $C_2$-$C_{60}$ alkenyl group (a $C_2$-$C_{60}$ alkenyl group) is a $C_2$-$C_{60}$ alkyl group having at least one carbon-carbon triple bond in the center or at a terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

The unsubstituted $C_2$-$C_{60}$ alkynyl group (a $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group (a $C_2$-$C_{60}$ alkynyl group) are an ethenyl group, a propynyl group, and the like. At least one hydrogen atom in the alkynyl group may be substituted with those substituents described above in conjunction with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group have at least two rings, they may be fused to each other. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, an ovalenyl group, and the like. Examples of the substituted $C_6$-$C_{60}$ aryl group may be inferred based on those of the unsubstituted $C_6$-$C_{60}$ aryl group and the substituted $C_1$-$C_{60}$ alkyl group described above. Examples of the substituted or unsubstituted $C_6$-$C_{60}$ arylene group may be inferred based on those examples of the substituted or unsubstituted $C_6$-$C_{60}$ aryl group described above.

The unsubstituted $C_2$-$C_{60}$ heteroaryl group is a monovalent group having at least one aromatic ring and at least one of the heteroatoms selected from the group consisting of N, O, P, and S. The unsubstituted $C_2$-$C_{60}$ heteroarylene group is a divalent group having at least one aromatic ring having and at least one of the heteroatoms selected from the group consisting of N, O, P, and S. In this regard, when the heteroaryl group and the heteroarylene group have at least two rings, they may be fused to each other. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, and the like. Examples of the unsubstituted $C_2$-$C_{60}$ heteroarylene group may be inferred based on those examples of the substituted or unsubstituted $C_2$-$C_{60}$ arylene group described above.

The substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_6$-$C_{60}$ arylthiol group indicates —$SA_3$ (where $A_3$ is a substituted or unsubstituted $C_6$-$C_{60}$ aryl group described above).

Hereinafter, the organic light-emitting diode according to an example embodiment will be described in detail with reference to the following synthesis examples and other examples. However, these examples are for illustrative purposes only and are not intended to limit the scope of the example embodiments.

In the expression that "B instead of A was used" in the following synthesis examples, a mole equivalent of B is the same that of A.

EXAMPLE

Synthesis Example 1: Synthesis of Compound 5

Intermediate 3-5 was synthesized according to Reaction Scheme 1-1 below.

<Reaction Scheme 1-1>

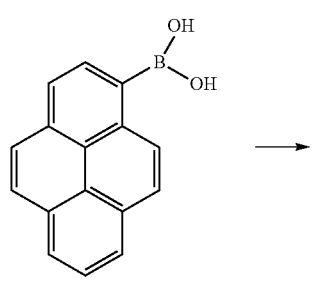

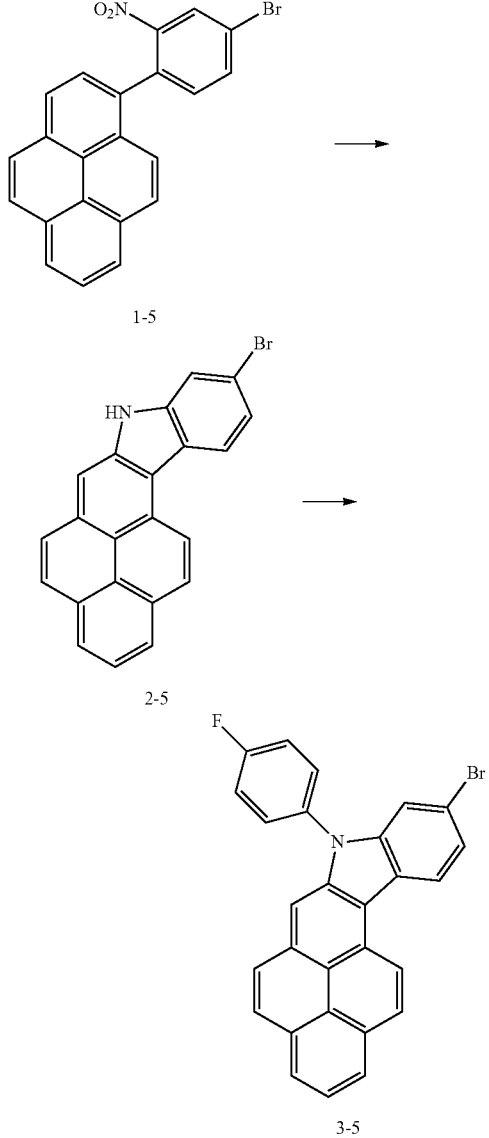

Synthesis of Intermediate 1-5

4.93 g (20.0 mmol) of pyrene boronic acid, 5.61 g (20.0 mmol) of 2,5-dibromonitrobenzene, 1.15 g (1.0 mmol) of Pd(PPh$_3$)$_4$, and 8.29 g (60.0 mmol) of K$_2$CO$_3$ were dissolved in 60 mL of a mixed solution of THF/H$_2$O (2:1), and then stirred at about 70° C. for about 5 hours. The reaction solution was cooled to room temperature, and 40 mL of water was added thereto, followed by three times of extraction with 50 mL of ethylether. An organic layer was collected, dried using magnesium sulfate, and the solvent was evaporated. The residue was separated and purified by silica gel column chromatography to obtain 6.83 g of Intermediate 1-5 (Yield: 85%). This compound was identified using mass spectroscopy/fast atom bombardment (MS/FAB)

$C_{22}H_{12}BrNO_2$: calc. 402.24, found 402.35.

Synthesis of Intermediate 2-5

4.24 g (10.0 mmol) of Intermediate 1-5 and 5.77 g (22 mmol) of triphenylphosphine (PPh$_3$) were dissolved in 30 mL of 1,2-dichlorobenzene, and then stirred at about 170° C. for about 12 hours. The reaction solution was cooled to room temperature, and the solvent was removed therefrom under vacuum conditions, followed by three times of extraction with 50 mL of water and 50 mL of dichloromethane. An organic layer was collected, dried using magnesium sulfate, and the solvent was evaporated. The residue was separated and purified by silica gel column chromatography to obtain 2.96 g of Intermediate 2-5 (Yield: 80%). This compound was identified using mass spectroscopy/fast atom bombardment (MS/FAB).

$C_{22}H_{12}BrN$: calc. 370.24, found 370.38.

Synthesis of Intermediate 3-5

3.70 g (10.0 mmol) of Intermediate 2-5, 2.62 g (15.0 mmol) of 4-fluorobromobenzene, 0.19 g (1.0 mmol) of CuI, 0.05 g (0.2 mmol) of 18-Crown-6, and 4.15 g (30.0 mmol) of $K_2CO_3$ were dissolved in 30 mL of 1,3-dimethyl-3,4,5,6-tetrahydro-2(1H)-pyrimidinone (DMPU), and then stirred at about 170° C. for about 12 hours. The reaction solution was cooled down to room temperature, followed by three times of extraction with 50 mL of water and 50 mL of dichloromethane. An organic layer was collected, dried using magnesium sulfate, and the solvent was evaporated. The residue was separated and purified by silica gel column chromatography to obtain 3.76 g of Intermediate 3-5 (Yield: 81%). This compound was identified using mass spectroscopy/fast atom bombardment (MS/FAB).

$C_{28}H_{15}BrFN$: calc. 464.32, found 464.51.

Intermediate C-5 was synthesized according to Reaction Scheme 1-2 below:

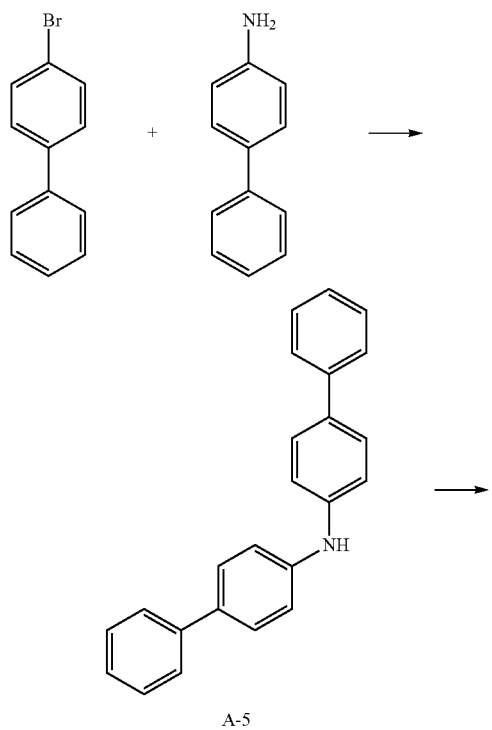

<Reaction Scheme 1-2>

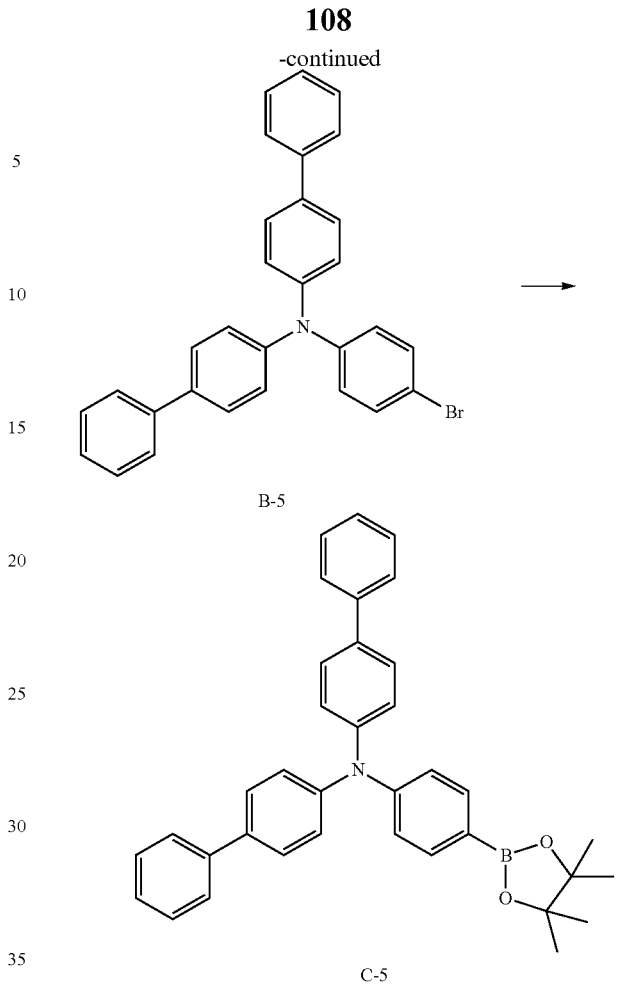

Synthesis of Intermediate A-5

4.66 g (20.0 mmol) of 4-bromobiphenyl, 5.07 g (30.0 mmol) of 4-phenylaniline, 0.37 g (0.4 mmol) of $Pd_2(dba)_3$, 0.08 g (0.4 mmol) of $PtBu_3$, and 2.88 g (30.0 mmol) of KOtBu were dissolved in 60 mL of toluene, and then stirred at about 85° C. for about 4 hours. The reaction solution was cooled down to room temperature, followed by three times of extraction with 50 mL of water and 50 mL of diethyl ether. An organic layer was collected, dried using magnesium sulfate, and the solvent was evaporated. The residue was separated and purified by silica gel column chromatography to obtain 5.65 g of Intermediate A-5 (Yield: 88%). This compound was identified using mass spectroscopy/fast atom bombardment (MS/FAB).

$C_{24}H_{19}N$: calc. 321.41, found 321.51.

Synthesis of Intermediate B-5

4.82 g (15.0 mmol) of Intermediate A-5, 2.83 g (10.0 mmol) of 4-bromoiodobenzene, 0.18 g (0.2 mmol) of $Pd_2(dba)_3$, 0.04 g (0.4 mmol) of $PtBu_3$, and 1.44 g (15.0 mmol) of KOtBu were dissolved in 40 mL of toluene, and then stirred at about 85° C. for about 4 hours. The reaction solution was cooled down to room temperature, followed by three times of extraction with 30 mL of water and 30 mL of diethyl ether. An organic layer was collected, dried using magnesium sulfate, and the solvent was evaporated. The residue was separated and purified by silica gel column chromatography to obtain 5.85 g of Intermediate B-5 (Yield: 82%). This compound was identified using mass spectroscopy/fast atom bombardment (MS/FAB).

C₃₀H₂₀BrN: calc. 476.40, found 476.52.

Synthesis of Intermediate C-5

4.76 g (10.0 mmol) of Intermediate B-5, 2.54 g (10.0 mmol) of bis(pinacolato)diborone, 0.36 g (0.5 mmol) of PdCl₂(dppf)₂, and 2.94 g (30.0 mmol) of KOAc were dissolved in 40 mL of dimethyl sulfoxide (DMSO), and then stirred at about 80° C. for about 6 hours. The reaction solution was cooled down to room temperature, followed by three times of extraction with 50 mL of water and 50 mL of diethyl ether. An organic layer was collected, dried using magnesium sulfate, and the solvent was evaporated. The residue was separated and purified by silica gel column chromatography to obtain 4.18 g of Intermediate C-5 (Yield: 80%). This compound was identified using MS/FAB.

C₃₆H₃₄BrNO₂: calc. 523.47, found 523.61.

Compound 5 was synthesized according to Reaction Scheme 1-3 below:

<Reaction Scheme 1-3>

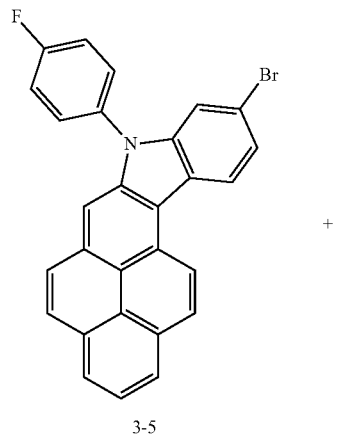

3-5

+

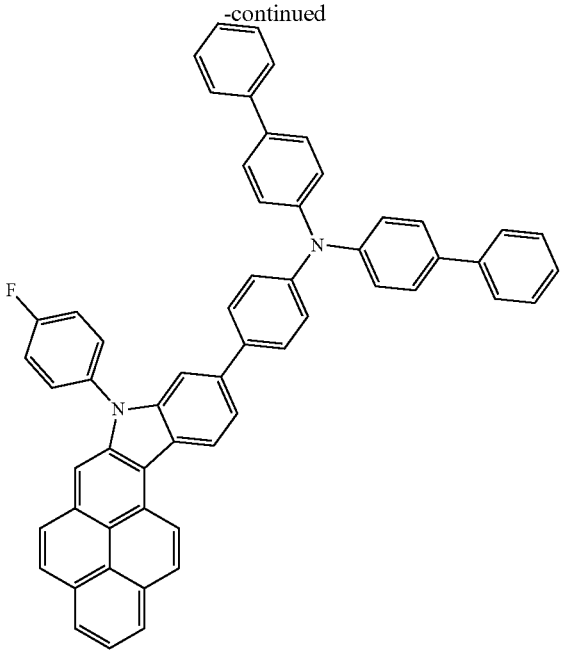

5

Synthesis of Compound 5

2.32 g (5.0 mmol) of Intermediate 3-5, 2.61 g (5.0 mmol) of Intermediate C-5, 0.29 g (0.25 mmol) of Pd(PPh₃)₄, and 2.07 g (15.0 mmol) of K₂CO₃ were dissolved in 30 mL of a mixed solution of THF/H₂O (2:1), and then stirred at about 70° C. for about 5 hours. The reaction solution was cooled down to room temperature, followed by three times of extraction with 50 mL of water and 50 mL of diethyl ether. An organic layer was collected, dried using magnesium sulfate, and the solvent was evaporated. The residue was separated and purified by silica gel column chromatography to obtain 3.35 g of Compound 5 (Yield: 86%). This compound was identified using MS/FAB and ¹H nuclear magnetic resonance (NMR).

C₅₈H₃₇FN₂: calc. 780.29, found 780.33.

¹H NMR (CDCl₃, 400 MHz) δ(ppm) 8.52-8.48 (m, 2H), 8.15-8.10 (m, 3H), 8.05-7.99 (m, 4H), 7.80-7.73 (m, 2H), 7.64-7.60 (m, 4H), 7.52-7.38 (m, 12H), 7.22-7.19 (m, 2H), 7.14-7.09 (m, 2H), 6.86-6.82 (m, 4H), 6.77-6.73 (m, 2H)

Synthesis Example 2: Synthesis of Compound 7

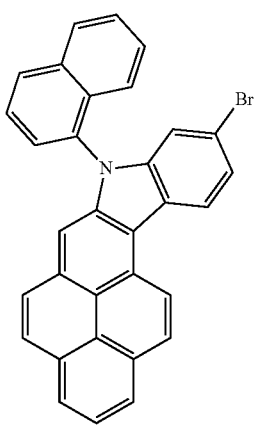

3-7

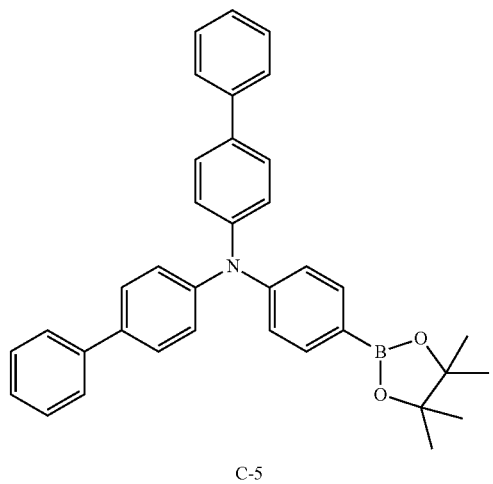

C-5

-continued

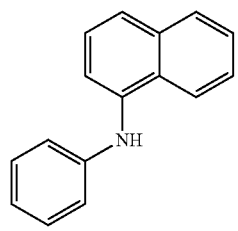
A-7

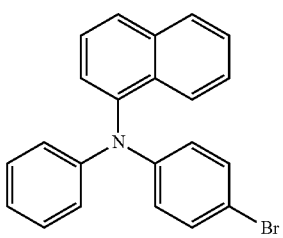
B-7

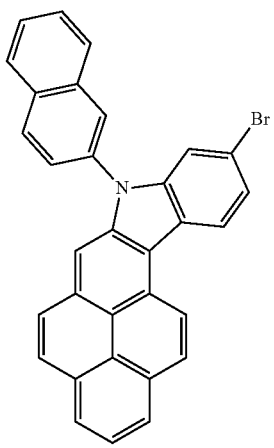

used in the synthesis of Compound 5. Compound 7 was identified using MS/FAB and NMR.

$C_{54}H_{33}N_2$: calc. 710.27, found 710.33.

$^1$H NMR (CDCl$_3$, 400 MHz) δ(ppm) 8.59-8.57 (m, 1H), 8.46-8.42 (m, 1H), 8.17-8.10 (m, 5H), 8.03-7.99 (m, 4H), 7.87-7.80 (m, 3H), 7.69-7.65 (m, 2H), 7.58-7.33 (m, 8H), 7.26-7.21 (m, 2H), 7.08-7.02 (m, 2H), 6.91-6.87 (m, 2H), 6.74-6.72 (m, 1H), 6.65-6.61 (m, 1H), 6.47-6.44 (m, 2H)

Synthesis Example 3: Synthesis of Compound 12

C-7

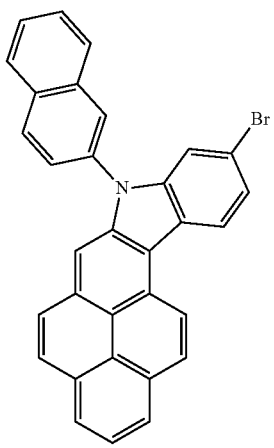
3-12

Synthesis of Intermediate 3-7

Intermediate 3-7 was synthesized in the same manner as the synthesis method of Intermediate 3-5, except that 1-bromonaphthalene, instead of 4-fluorobromobenzene, was used.

Synthesis of Intermediate A-7

Intermediate A-7 was synthesized in the same manner as the synthesis method of Intermediate A-5, except that 1-bromonaphthalene and aniline, instead of 4-bromobiphenyl and 4-phenylaniline respectively, were used.

Synthesis of Intermediate B-7

Intermediate B-7 was synthesized in the same manner as the synthesis method of Intermediate B-5, except that Intermediate A-7, instead of Intermediate A-5, was used.

Synthesis of Intermediate C-7

Intermediate C-7 was synthesized in the same manner as the synthesis method of Intermediate C-5, except that Intermediate B-7, instead of Intermediate B-5, was used.

Synthesis of Compound 7

4.02 g of Compound 7 (Yield 80%) was synthesized in the same manner as the synthesis method of Compound 5, except that Intermediate 3-7 and Intermediate C-7, instead of Intermediate 3-5 and Intermediate C-5 respectively, were

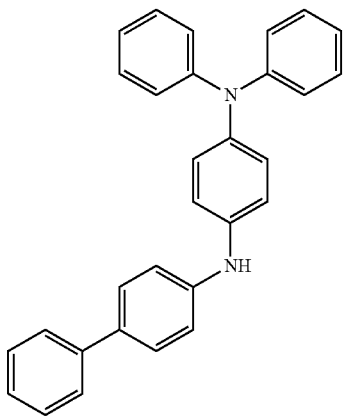
A-12

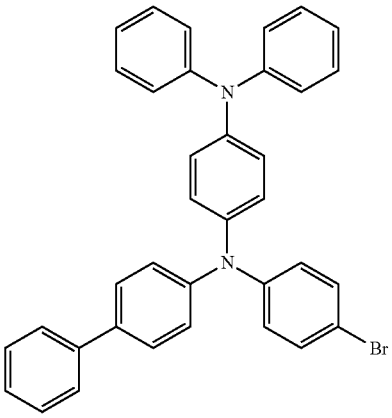
B-12

C-12

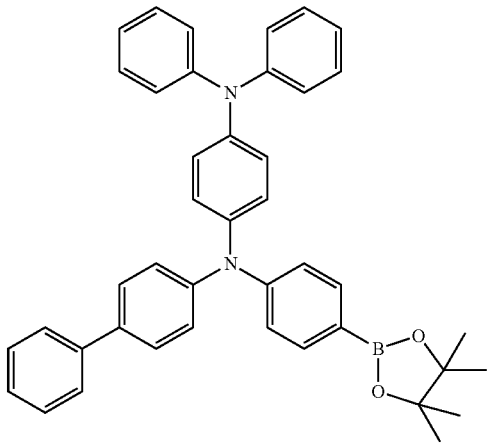

Synthesis of Intermediate 3-12

Intermediate 3-12 was synthesized in the same manner as the synthesis method of Intermediate 3-5, except that 2-bromonaphthalene, instead of 4-fluorobromobenzene, was used.

Synthesis of Intermediate A-12

Intermediate A-12 was synthesized in the same manner as the synthesis method of Intermediate A-5, except that (4-bromo-phenyl)-diphenylamine, instead of 4-bromobiphenyl, was used.

Synthesis of Intermediate B-12

Intermediate B-12 was synthesized in the same manner as the synthesis method of Intermediate B-5, except that Intermediate A-12, instead of Intermediate A-5, was used.

Synthesis of Intermediate C-12

Intermediate C-12 was synthesized in the same manner as the synthesis method of Intermediate C-5, except that Intermediate B-12, instead of Intermediate B-5, was used.

Synthesis of Compound 12

3.02 g of Compound 12 (Yield 75%) was synthesized in the same manner as the synthesis method of Compound 5, except that Intermediate 3-12 and Intermediate C-12, instead of Intermediate 3-5 and Intermediate C-5 respectively, were used in the synthesis of Compound 5. Compound 12 was identified using MS/FAB and NMR.

$C_{68}H_{45}N_3$: calc. 903.36, found 903.41.

$^1$H NMR (CDCl$_3$, 400 MHz) δ(ppm) 8.52-8.48 (m, 2H), 8.15-7.94 (m, 7H), 7.80-7.78 (m, 2H), 7.70-7.61 (m, 6H), 7.51-7.40 (m, 10H), 7.08-7.03 (m, 4H), 6.86-6.74 (m, 4H), 6.66-6.58 (m, 6H), 6.16-6.10 (m, 4H)

Synthesis Example 4: Synthesis of Compound 14

3-12

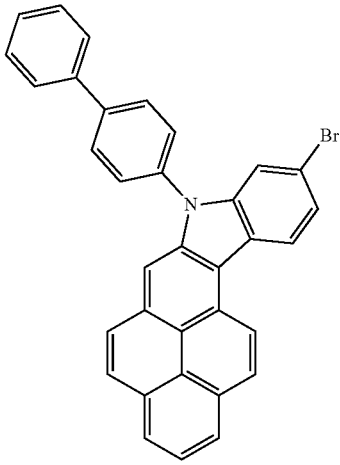

Intermediate 3-14 Synthesis of

Intermediate 3-14 was synthesized in the same manner as the synthesis method of Intermediate 3-5, except that 4-bromobiphenyl, instead of 4-fluorobromobenzene, was used.

Compound 14 Synthesis of 2.85 g of Compound 14 (Yield 81%) was synthesized in the same manner as the synthesis method of Compound 5, except that Intermediate 3-14, instead of Intermediate 3-5, was used in the synthesis of Compound 5. Compound 14 was identified using MS/FAB and NMR.

$C_{64}H_{41}N_2$: calc. 838.33, found 838.39.

$^1$H NMR (CDCl$_3$, 400 MHz) δ(ppm) 8.52-8.44 (m, 2H), 8.16-8.13 (m, 3H), 8.08-7.99 (m, 4H), 7.80-7.73 (m, 2H), 7.64-7.60 (m, 6H), 7.53-7.38 (m, 17H), 7.35-7.32 (m, 2H), 7.06-6.98 (m, 4H), 6.85-6.82 (m, 2H)

Synthesis Example 5: Synthesis of Compound 16

3-16

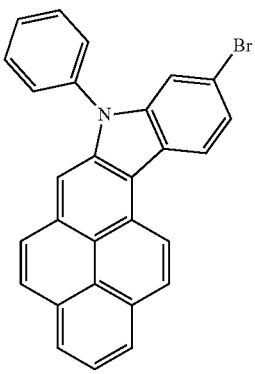

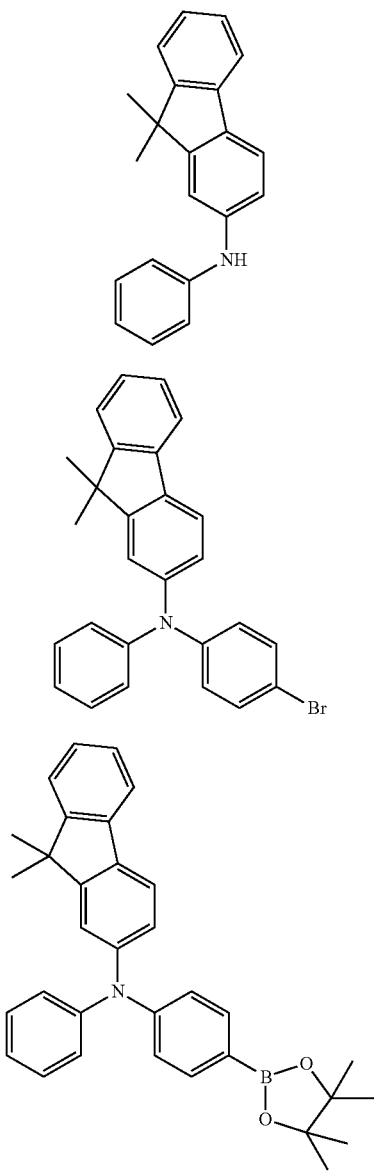

A-16

B-16

C-16

Synthesis of Intermediate 3-16

Intermediate 3-16 was synthesized in the same manner as the synthesis method of Intermediate 3-5, except that bromobenzene, instead of 4-fluorobromobenzene, was used.

Synthesis of Intermediate A-16

Intermediate A-16 was synthesized in the same manner as the synthesis method of Intermediate A-5, except that 2-bromo-9,9-dimethyl-9H-fluorene and aniline, instead of 4-bromobiphenyl and 4-phenylaniline respectively, were used.

Synthesis of Intermediate B-16

Intermediate B-16 was synthesized in the same manner as the synthesis method of Intermediate B-5, except that Intermediate A-16, instead of Intermediate A-5, was used.

Synthesis of Intermediate C-16

Intermediate C-16 was synthesized in the same manner as the synthesis method of Intermediate C-5, except that Intermediate B-16, instead of Intermediate B-5, was used.

Synthesis of Compound 16

2.77 g of Compound 16 (Yield 79%) was synthesized in the same manner as the synthesis method of Compound 5, except that Intermediate 3-16 and Intermediate C-16 instead of Intermediate 3-5 and Intermediate C-5 respectively, were used. Compound 16 was identified using MS/FAB and NMR.

$C_{55}H_{38}N_2$: calc. 726.30, found 726.35.

$^1$H NMR (CDCl$_3$, 400 MHz) δ(ppm) 8.52-8.44 (m, 2H), 8.16-7.99 (m, 7H), 7.80-7.72 (m, 3H), 7.57-7.36 (m, 7H), 7.40-7.30 (m, 2H), 7.14-7.04 (m, 4H), 6.99-6.93 (m, 4H), 6.69-6.67 (m, 1H), 6.53-6.51 (m, 2H), 1.61 (s, 6H)

Synthesis Example 6: Synthesis of Compound 18

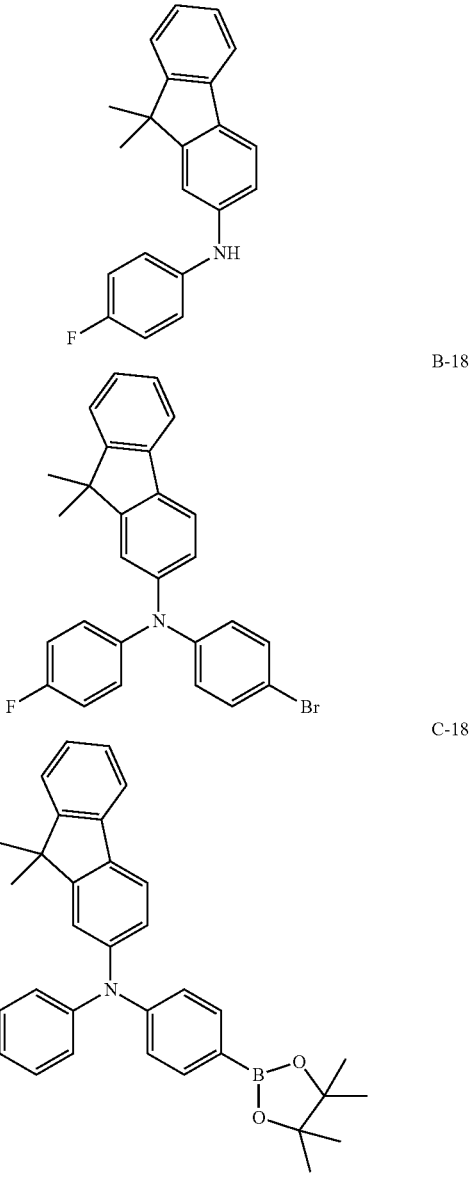

A-18

B-18

C-18

Synthesis of Intermediate A-18

Intermediate A-18 was synthesized in the same manner as the synthesis method of Intermediate A-5, except that 2-bromo-9,9-dimethyl-9H-fluorene and 4-fluorobenzene amine instead of 4-bromobiphenyl and 4-phenylaniline respectively, were used.

Synthesis of Intermediate B-18

Intermediate B-18 was synthesized in the same manner as the synthesis method of Intermediate B-5, except that Intermediate A-18, instead of Intermediate A-5, was used.

Synthesis of Intermediate C-18

Intermediate C-18 was synthesized in the same manner as the synthesis method of Intermediate C-5, except that Intermediate B-18, instead of Intermediate B-5, was used.

Synthesis of Compound 18

3.02 g of Compound 18 (Yield 88%) was synthesized in the same manner as the synthesis method of Compound 5, except that Intermediate 3-16 (refer to Synthesis Example 5) and Intermediate C-18, instead of Intermediate 3-5 and Intermediate C-5 respectively, were used in the synthesis of Compound 5. Compound 18 was identified using MS/FAB and NMR.

$C_{55}H_{37}N_2F$: calc. 744.29, found 744.33.

$^1$H NMR (CDCl$_3$, 400 MHz) δ(ppm) 8.52-8.44 (m, 2H), 8.16-7.99 (m, 7H), 7.80-7.72 (m, 3H), 7.57-7.46 (m, 7H), 7.40-7.30 (m, 2H), 7.14-7.08 (m, 2H), 6.99-6.93 (m, 2H), 6.71-6.66 (m, 3H), 6.58-6.54 (m, 3H), 1.61 (s, 6H)

Synthesis Example 7: Synthesis of Compound 19

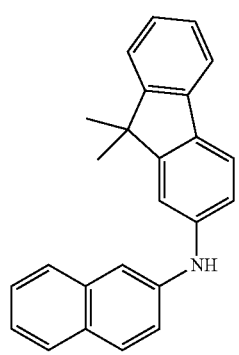

A-19

B-19

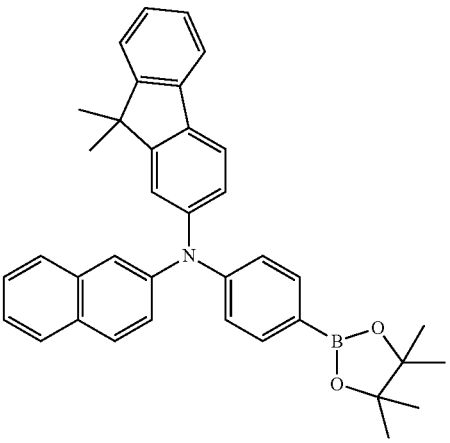

C-19

Synthesis of Intermediate A-19

Intermediate A-19 was synthesized in the same manner as the synthesis method of Intermediate A-5, except that 2-bromo-9,9-dimethyl-9H-fluorene and naphthalene-2-amine, instead of 4-bromobiphenyl and 4-phenylaniline respectively, were used.

Synthesis of Intermediate B-19

Intermediate B-19 was synthesized in the same manner as the synthesis method of Intermediate B-5, except that Intermediate A-19, instead of Intermediate A-5, was used.

Synthesis of Intermediate C-19

Intermediate C-19 was synthesized in the same manner as the synthesis method of Intermediate C-5, except that Intermediate B-19, instead of Intermediate B-5, was used.

Synthesis of Compound 19

3.07 g of Compound 19 (Yield 80%) was synthesized in the same manner as the synthesis method of Compound 5, except that Intermediate 3-16 (refer to Synthesis Example 5) and Intermediate C-19, instead of Intermediate 3-5 and Intermediate C-5 respectively, were used in the synthesis of Compound 5. Compound 19 was identified using MS/FAB and NMR.

$C_{59}H_{40}N_2$: calc. 776.31, found 776.35.

$^1$H NMR (CDCl$_3$, 400 MHz) δ(ppm) 8.52-8.44 (m, 2H), 8.16-7.99 (m, 7H), 7.80-7.68 (m, 5H), 7.57-7.46 (m, 10H), 7.41-7.30 (m, 3H), 7.16-7.08 (m, 3H), 6.82-6.78 (m, 3H), 6.74-6.70 (m, 1H), 1.63 (s, 6H)

Synthesis Example 8: Synthesis of Compound 23

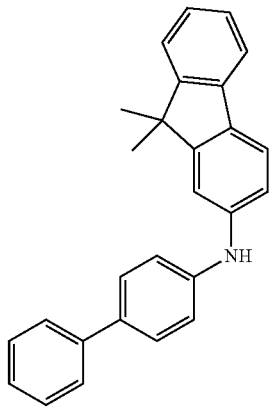
A-23

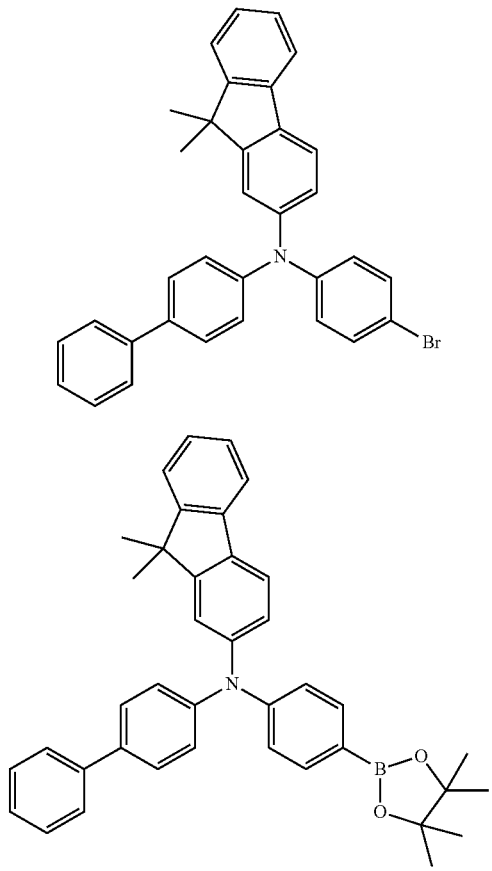
B-23

C-23

Synthesis of Intermediate A-23

Intermediate A-23 was synthesized in the same manner as the synthesis method of Intermediate A-5, except that 2-bromo-9,9-dimethyl-9H-fluorene, instead of 4-bromobiphenyl, was used.

Synthesis of Intermediate B-23

Intermediate B-23 was synthesized in the same manner as the synthesis method of Intermediate B-5, except that Intermediate A-23, instead of Intermediate A-5, was used.

Synthesis of Intermediate C-23

Intermediate C-23 was synthesized in the same manner as the synthesis method of Intermediate C-5, except that Intermediate B-23, instead of Intermediate B-5, was used.

Synthesis of Compound 23

2.35 g of Compound 23 (Yield 71%) was synthesized in the same manner as the synthesis method of Compound 5, except that Intermediate 3-7 (refer to Synthesis Example 2) and Intermediate C-23, instead of Intermediate 3-5 and Intermediate C-5 respectively, were used in the synthesis of Compound 5, Compound 23 was identified using MS/FAB and NMR.

$C_{65}H_{44}N_2$: calc. 852.35, found 852.40.

$^1$H NMR (CDCl$_3$, 400 MHz) δ(ppm) 8.59-8.48 (m, 2H), 8.15-8.10 (m, 3H), 8.03-7.99 (m, 5H), 7.86-7.76 (m, 3H), 7.69-7.25 (m, 17H), 7.14-7.08 (m, 2H), 6.91-6.86 (m, 3H), 6.53-6.48 (m, 3H), 1.61 (s, 6H)

Synthesis Example 9: Synthesis of Compound 26

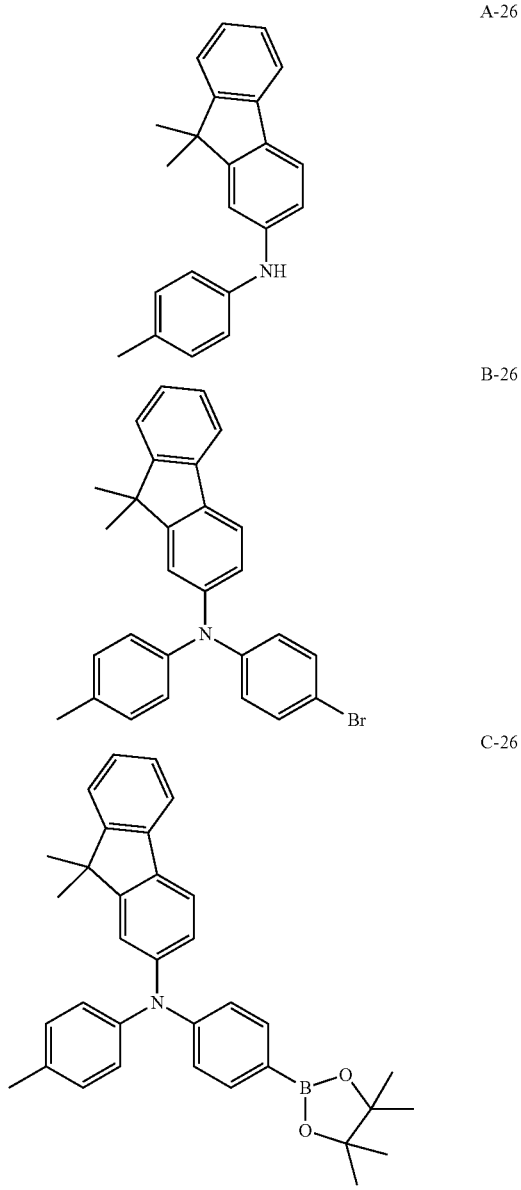
A-26

B-26

C-26

Synthesis of Intermediate A-26

Intermediate A-26 was synthesized in the same manner as the synthesis method of Intermediate A-5, except that 2-bromo-9,9-dimethyl-9H-fluorene and p-toluidine, instead of 4-bromobiphenyl and 4-phenylaniline respectively, were used.

Synthesis of Intermediate B-26

Intermediate B-26 was synthesized in the same manner as the synthesis method of Intermediate B-5, except that Intermediate A-26, instead of Intermediate A-5, was used.

Synthesis of Intermediate C-26

Intermediate C-26 was synthesized in the same manner as the synthesis method of Intermediate C-5, except that Intermediate B-26, instead of Intermediate B-5, was used.

Synthesis of Compound 26

2.94 g of Compound 26 (Yield 82%) was synthesized in the same manner as the synthesis method of Compound 5, except that Intermediate 3-14 (refer to Synthesis Example 4) and Intermediate C-26, instead of Intermediate 3-5 and Intermediate C-5 respectively, were used in the synthesis of Compound 5. Compound 26 was identified using MS/FAB and NMR.

$C_{61}H_{44}N_2$: calc. 816.35, found 816.40.

$^1$H NMR (CDCl$_3$, 400 MHz) δ(ppm) 8.52-8.44 (m, 2H), 8.19-7.99 (m, 7H), 7.80-7.73 (m, 3H), 7.63-7.60 (m, 2H), 7.56-7.47 (m, 7H), 7.42-7.30 (m, 4H), 7.14-7.08 (m, 2H), 6.89-6.85 (m, 2H), 6.71-6.65 (m, 3H), 6.56-6.52 (m, 3H), 2.30 (s, 3H), 1.60 (s, 6H)

Synthesis Example 10: Synthesis of Compound 27

3.33 g of Compound 27 (Yield 86%) was synthesized in the same manner as the synthesis method of Compound 5, except that Intermediate 3-14 (refer to Synthesis Example 4) and Intermediate C-18 (refer to Synthesis Example 6), instead of Intermediate 3-5 and Intermediate C-5 respectively, were used in the synthesis of Compound 5. Compound 27 was identified using MS/FAB and NMR.

$C_{61}H_{41}N_2F$: calc. 820.32, found 820.36.

$^1$H NMR (CDCl$_3$, 400 MHz) δ(ppm) 8.52-8.45 (m, 2H), 8.15-7.99 (m, 7H), 7.80-7.73 (m, 3H), 7.63-7.60 (m, 2H), 7.58-7.47 (m, 7H), 7.42-7.30 (m, 4H), 7.14-7.08 (m, 2H), 6.89-6.84 (m, 2H), 6.71-6.64 (m, 3H), 6.56-6.50 (m, 3H), 1.60 (s, 6H)

Synthesis Example 11: Synthesis of Compound 29

3.09 g of Compound 29 (Yield 83%) was synthesized in the same manner as the synthesis method of Compound 5, except that Intermediate 3-14 (refer to Synthesis Example 4) and Intermediate C-23 (refer to Synthesis Example 8), instead of Intermediate 3-5 and Intermediate C-5 respectively, were used in the synthesis of Compound 5. Compound 29 was identified using MS/FAB and NMR.

$C_{67}H_{46}N_2$: calc. 878.36, found 878.41.

$^1$H NMR (CDCl$_3$, 400 MHz) δ(ppm) 8.52-8.44 (m, 2H), 8.15-7.99 (m, 7H), 7.80-7.73 (m, 3H), 7.65-7.60 (m, 6H), 7.56-7.30 (m, 16H), 7.14-7.09 (m, 2H), 6.90-6.86 (m, 3H), 6.55-6.50 (m, 3H), 1.58 (s, 6H)

Synthesis Example 12: Synthesis of Compound 31

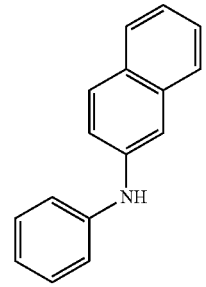

A-31

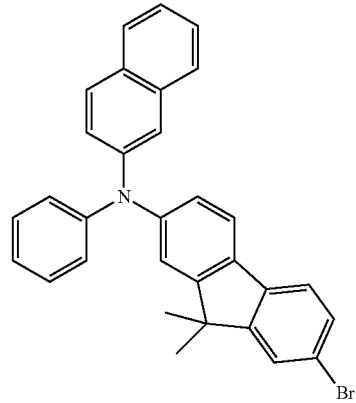

B-31

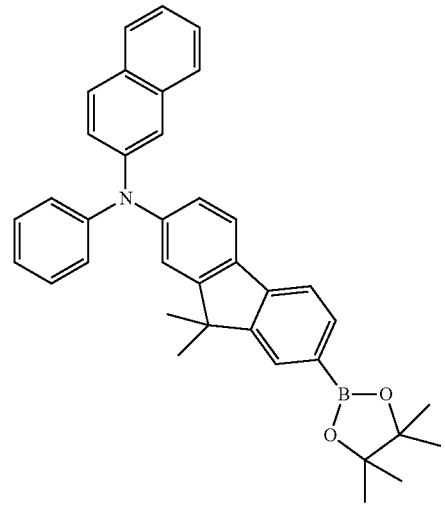

C-31

Synthesis of Intermediate A-31

Intermediate A-31 was synthesized in the same manner as the synthesis method of Intermediate A-5, except that 2-bromonaphthalene and aniline, instead of 4-bromobiphenyl and 4-phenylaniline respectively, were used.

Synthesis of Intermediate B-31

Intermediate B-31 was synthesized in the same manner as the synthesis method of Intermediate B-5, except that Intermediate A-31 and 2-bromo-7-iodo-9,9-dimethyl-9H-fluorene, instead of Intermediate A-5 and 4-bromoiodobenzene respectively, were used.

Synthesis of Intermediate C-31

Intermediate C-31 was synthesized in the same manner as the synthesis method of Intermediate C-5, except that Intermediate B-31, instead of Intermediate B-5, was used.

Synthesis of Compound 31

3.10 g of Compound 31 (Yield 78%) was synthesized in the same manner as the synthesis method of Compound 5, except that Intermediate 3-16 (refer to Synthesis Example 5) and Intermediate C-31 instead of Intermediate 3-5 and Intermediate C-5 respectively, were used in the synthesis of Compound 5. Compound 31 was identified using MS/FAB and NMR.

$C_{59}H_{40}N_2$: calc. 776.31, found 776.37.
$^1$H NMR (CDCl$_3$, 400 MHz) δ(ppm) 8.52-8.45 (m, 2H), 8.15-7.93 (m, 7H), 7.78-7.68 (m, 6H), 7.59-7.37 (m, 11H), 7.10-7.06 (m, 4H), 6.91-6.88 (m, 2H), 6.80-6.75 (m, 3H), 1.63 (s, 6H)

Synthesis Example 13: Compound 35

Synthesis of Intermediate B-35

Intermediate B-35 was synthesized in the same manner as the synthesis method of Intermediate B-5, except that 2-bromo-7-iodo-9,9-dimethyl-9H-fluorene, instead of 4-bromoiodobenzene, was used.

Synthesis of Intermediate C-35

Intermediate C-35 was synthesized in the same manner as the synthesis method of Intermediate C-5, except that Intermediate B-35, instead of Intermediate B-5, was used.

Synthesis of Compound 35

2.99 g of Compound 35 (Yield 76%) was synthesized in the same manner as the synthesis method of Compound 5, except that Intermediate C-35, instead of Intermediate C-5, was used. Compound 35 was identified using MS/FAB and NMR.

$C_{67}H_{45}N_2F$: calc. 896.35, found 896.40.
$^1$H NMR (CDCl$_3$, 400 MHz) δ(ppm) 8.52-8.47 (m, 2H), 8.15-7.93 (m, 7H), 7.71-7.40 (m, 20H), 7.22-7.09 (m, 4H), 6.93-6.90 (m, 1H), 6.84-6.75 (m, 5H), 1.62 (s, 6H)

Synthesis Example 14: Synthesis of Compound 36

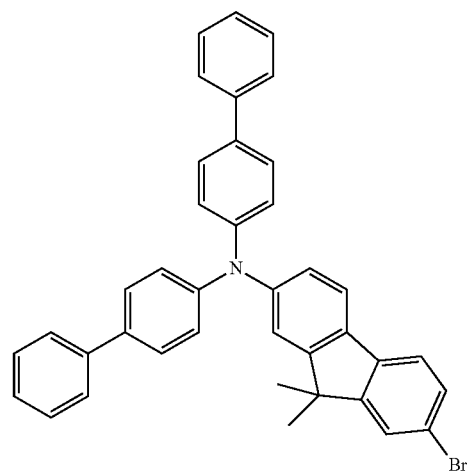
C-35

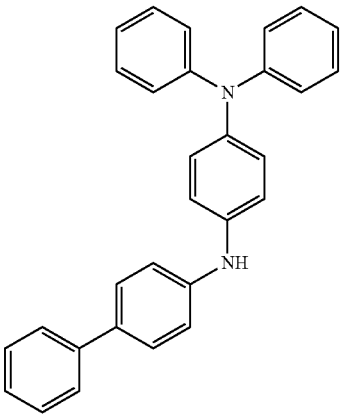
A-12

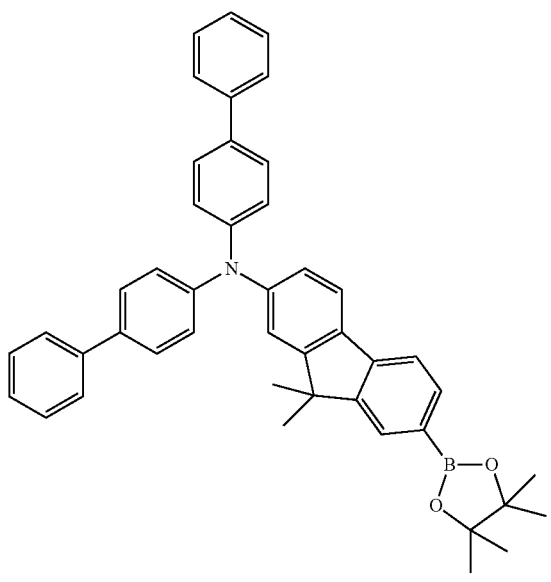

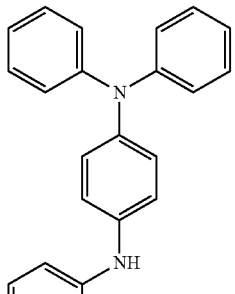
B-36

C-36

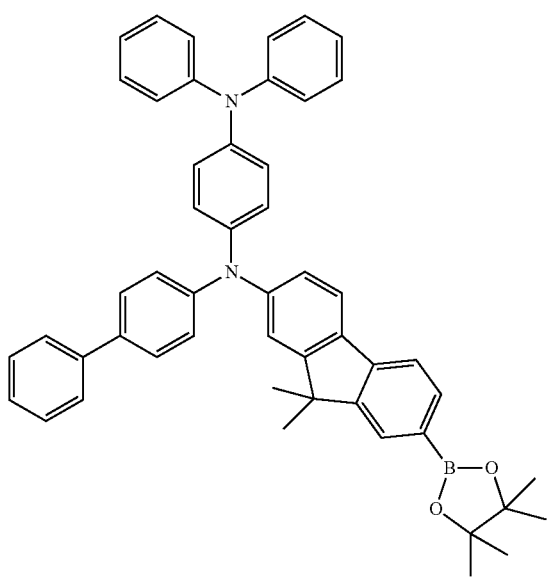

Synthesis of Intermediate B-36

Intermediate B-36 was synthesized in the same manner as the synthesis method of Intermediate B-5, except that Intermediate A-12 (refer to Synthesis Example 3) and 2-bromo-7-iodo-9,9-dimethyl-9H-fluorene, instead of Intermediate A-5 and 4-bromoiodobenzene respectively, were used.

Synthesis of Intermediate C-36

Intermediate C-36 was synthesized in the same manner as the synthesis method of Intermediate C-5, except that Intermediate B-36, instead of Intermediate B-5, was used.

Synthesis of Compound 36

1.94 g of Compound 36 (Yield 82%) was synthesized in the same manner as the synthesis method of Compound 5, except that Intermediate C-36, instead of Intermediate C-5, was used in the synthesis of Compound 5. Compound 36 was identified using MS/FAB and NMR.

$C_{73}H_{61}N_3$: calc. 987.39, found 987.42.

$^1$H NMR (CDCl$_3$, 400 MHz) δ(ppm) 8.52-8.44 (m, 2H), 8.15-7.93 (m, 7H), 7.72-7.38 (m, 25H), 7.25-7.15 (m, 4H), 6.95-7.6.93 (m, 1H), 6.84-6.75 (m, 5H), 1.62 (s, 6H)

Synthesis Example 15: Synthesis of Compound 41

1.88 g of Compound 41 (Yield 73%) was synthesized in the same manner as the synthesis method of Compound 5, except that Intermediate 3-12 (refer to Synthesis Example 3) and Intermediate C-35 (refer to Synthesis Example 13), instead of Intermediate 3-5 and Intermediate C-5 respectively, were used in the synthesis of Compound 5. Compound 41 was identified using MS/FAB and NMR.

$C_{71}H_{48}N_2$: calc. 928.38, found 928.42.

$^1$H NMR (CDCl$_3$, 400 MHz) δ(ppm) 8.52-8.44 (m, 2H), 8.16-7.83 (m, 9H), 7.72-7.40 (m, 25H), 6.93-6.90 (m, 1H), 6.84-6.75 (m, 5H), 1.63 (s, 6H)

Synthesis Example 16: Synthesis of Compound 42

2.09 g of Compound 42 (Yield 83%) was synthesized in the same manner as the synthesis method of Compound 5, except that Intermediate 3-12 (refer to Synthesis Example 3) and Intermediate C-36 (refer to Synthesis Example 14), instead of Intermediate 3-5 and Intermediate C-5 used in the synthesis of Compound 5 respectively, were used. Compound 42 was identified using MS/FAB and NMR.

$C_{77}H_{53}N_3$: calc. 852.35, found 852.40.

$^1$H NMR (CDCl$_3$, 400 MHz) δ(ppm) 8.52-8.48 (m, 2H), 8.15-7.93 (m, 7H), 7.78-7.32 (m, 21H), 7.10-7.06 (m, 3H), 6.91-6.93 (m, 2H), 6.80-6.75 (m, 3H), 1.63 (s, 6H)

Synthesis Example 17: Synthesis of Compound 46

A-16

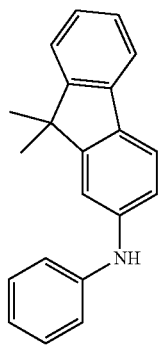

B-46

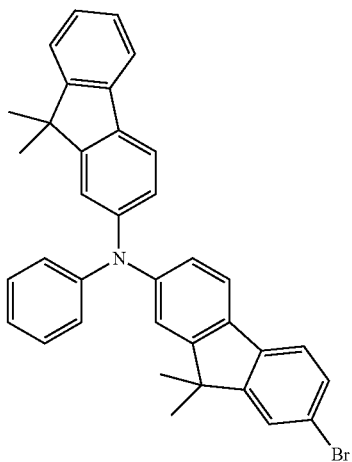

C-46

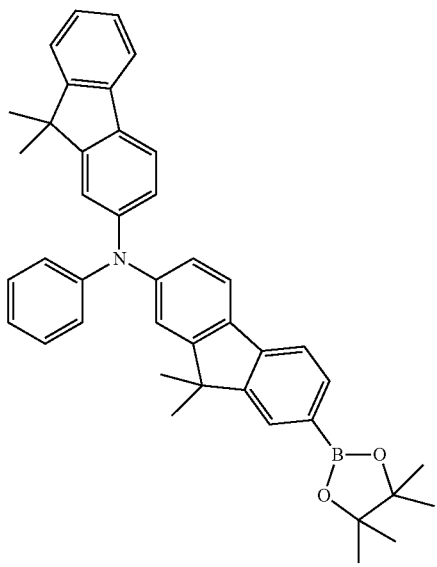

Synthesis of Intermediate B-46

B-46 was synthesized in the same manner as the synthesis method of Intermediate B-5, except that Intermediate A-16 (refer to Synthesis Example 5) and 2-bromo-7-iodo-9,9-dimethyl-9H-fluorene, instead of Intermediate A-5 and 4-bromoiodobenzene respectively, were used.

Synthesis of Intermediate C-46

Intermediate C-46 was synthesized in the same manner as the synthesis method of Intermediate C-5, except that Intermediate B-46, instead of Intermediate B-5, was used.

Synthesis of Compound 46

3.02 g of Compound 46 (Yield 80%) was synthesized in the same manner as the synthesis method of Compound 5, except that Intermediate 3-16 (refer to Synthesis Example 5) and Intermediate C-46 instead of Intermediate 3-5 and Intermediate C-5 respectively, were used in the synthesis of Compound 5. Compound 46 was identified using MS/FAB and NMR.

$C_{64}H_{46}N_2$: calc. 842.36, found 842.40.

$^1$H NMR (CDCl$_3$, 400 MHz) δ(ppm) 8.52-8.47 (m, 2H), 8.15-7.93 (m, 7H), 7.78-7.69 (m, 5H), 7.59-7.30 (m, 9H), 7.14-7.08 (m, 4H), 6.82-6.73 (m, 3H), 6.62-6.55 (m, 4H), 1.63 (s, 6H), 1.61 (s, 6H)

Synthesis Example 18: Synthesis of Compound 47

A-18

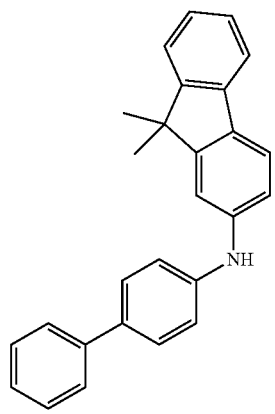

B-47

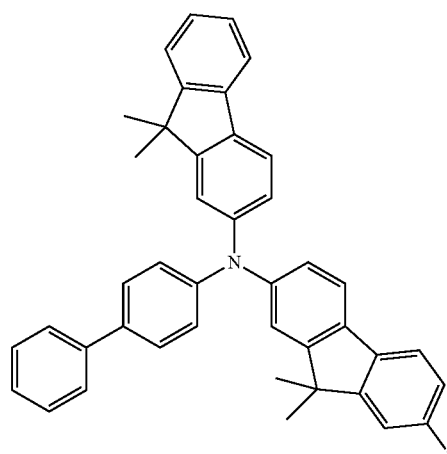

C-47

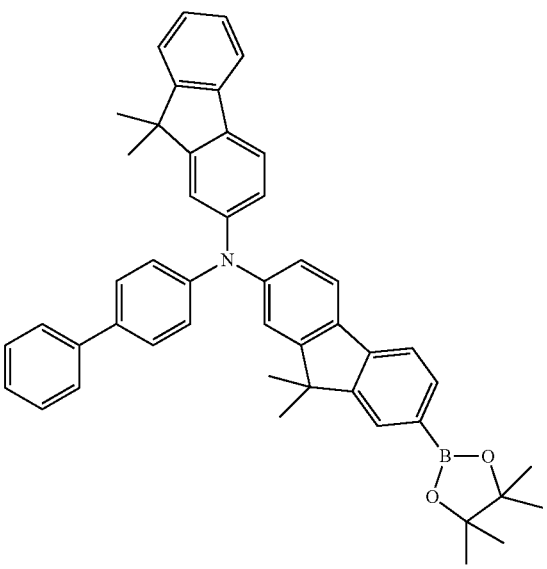

Synthesis of Intermediate B-47

Intermediate B-47 was synthesized in the same manner as the synthesis method of Intermediate B-5, except that Intermediate A-19 (refer to Synthesis Example 7) and 2-bromo-7-iodo-9,9-dimethyl-9H-fluorene, instead of Intermediate A-5 and 4-bromoiodobenzene respectively, were used.

Synthesis of Intermediate C-47

Intermediate C-47 was synthesized in the same manner as the synthesis method of Intermediate C-5, except that Intermediate B-47, instead of Intermediate B-5, was used.

Synthesis of Compound 47

2.85 g of Compound 47 (Yield 77%) was synthesized in the same manner as the synthesis method of Compound 5, except that Intermediate 3-16 (refer to Synthesis Example 5) and Intermediate C-47, instead of Intermediate 3-5 and Intermediate C-5 respectively, were used in the synthesis of Compound 5. Compound 47 was identified using MS/FAB and NMR.

$C_{70}H_{50}N_2$: calc. 918.39, found 918.45.

$^1$H NMR (CDCl$_3$, 400 MHz) δ(ppm) 8.52-8.48 (m, 2H), 8.15-7.93 (m, 7H), 7.78-7.69 (m, 5H), 7.64-7.30 (m, 16H), 7.14-7.08 (m, 2H), 6.98-6.94 (m, 2H), 6.79-6.72 (m, 4H), 1.63 (s, 6H), 1.61 (s, 6H)

Synthesis Example 19: Synthesis of Compound 50

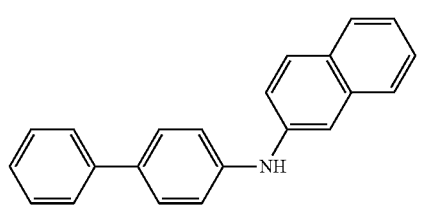

A-50

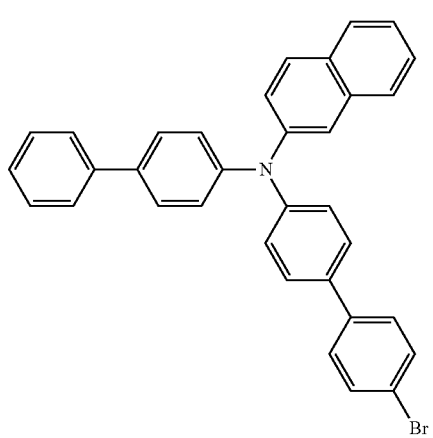

B-50

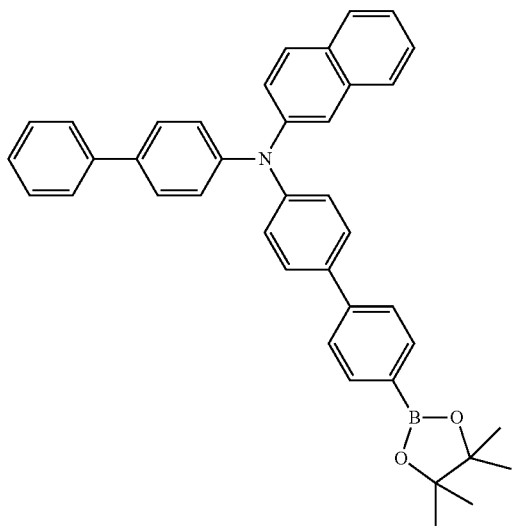

C-50

Synthesis of Intermediate A-50

Intermediate A-50 was synthesized in the same manner as the synthesis method of Intermediate A-5, except that 2-bromonaphthalene, instead of 4-bromobiphenyl, was used.

Synthesis of Intermediate B-50

Intermediate B-50 was synthesized in the same manner as the synthesis method of Intermediate B-5, except that Intermediate A-50 and 4-(4-bromophenyl)-iodobenzene, instead of Intermediate A-5 and 4-bromoiodobenzene respectively, were used.

Synthesis of Intermediate C-50

Intermediate C-50 was synthesized in the same manner as the synthesis method of Intermediate C-5, except that Intermediate B-50, instead of Intermediate B-5, was used.

Synthesis of Compound 50

3.23 g of Compound 50 (Yield 79%) was synthesized in the same manner as the synthesis method of Compound 5, except that Intermediate 3-16 (refer to Synthesis Example 5) and Intermediate C-50, instead of Intermediate 3-5 and Intermediate C-5 respectively, were used in the synthesis of Compound 5. Compound 50 was identified using MS/FAB and NMR.

$C_{62}H_{43}N_2$: calc. 812.31, found 812.34.

$^1$H NMR (CDCl$_3$, 400 MHz) δ(ppm) 8.52-8.47 (m, 2H), 8.16-8.12 (m, 3H), 8.08-7.99 (m, 4H), 7.84-7.72 (m, 5H), 7.66-7.36 (m, 20H), 7.12-7.10 (m, 2H), 6.81-6.75 (m, 4H)

Synthesis Example 20: Synthesis of Compound 52

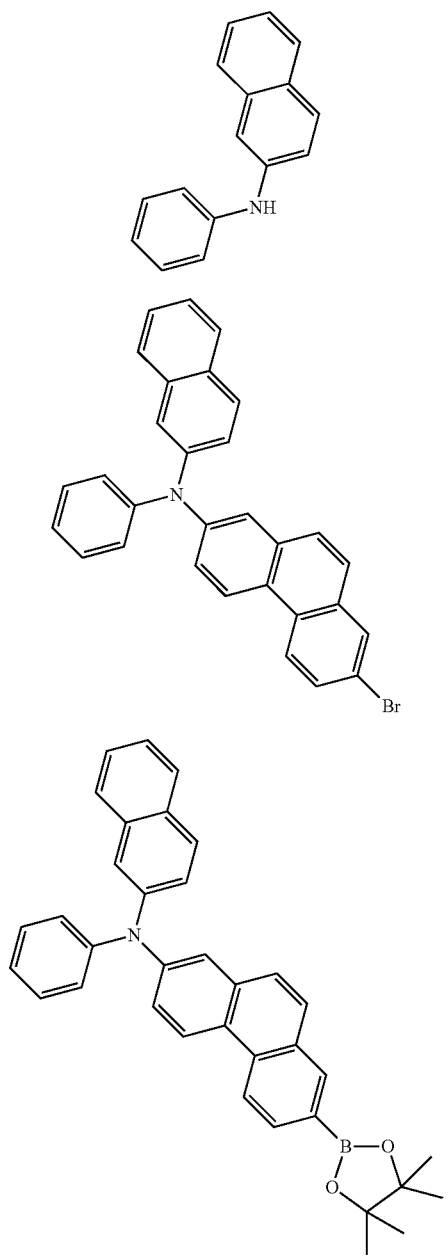

Synthesis of Intermediate B-52

Intermediate B-52 was synthesized in the same manner as the synthesis method of Intermediate B-5, except that Intermediate A-31 (refer to Synthesis Example 12) and 2-bromo-7-iodophenanthrene, instead of Intermediate A-5 and 4-bromoiodobenzene respectively, were used.

Synthesis of Intermediate C-52

Intermediate C-52 was synthesized in the same manner as the synthesis method of Intermediate C-5, except that Intermediate B-52, instead of Intermediate B-5, was used.

Synthesis of Compound 52

3.29 g of Compound 52 (Yield 75%) was synthesized in the same manner as the synthesis method of Compound 5, except that Intermediate 3-16 (refer to Synthesis Example 5) and Intermediate C-52, instead of Intermediate 3-5 and Intermediate C-5 respectively, were used in the synthesis of Compound 5. Compound 52 was identified using MS/FAB and NMR.

$C_{58}H_{36}N_2$: calc. 760.28, found 760.34.

$^1$H NMR (CDCl$_3$, 400 MHz) δ(ppm) 8.52-8.48 (m, 2H), 8.33-8.26 (m, 3H), 8.15-7.99 (m, 7H), 7.88-7.67 (m, 7H), 7.57-7.36 (m, 11H), 7.14-7.06 (m, 4H), 6.96-6.91 (m, 4H)

Synthesis Example 21: Synthesis of Compound 54

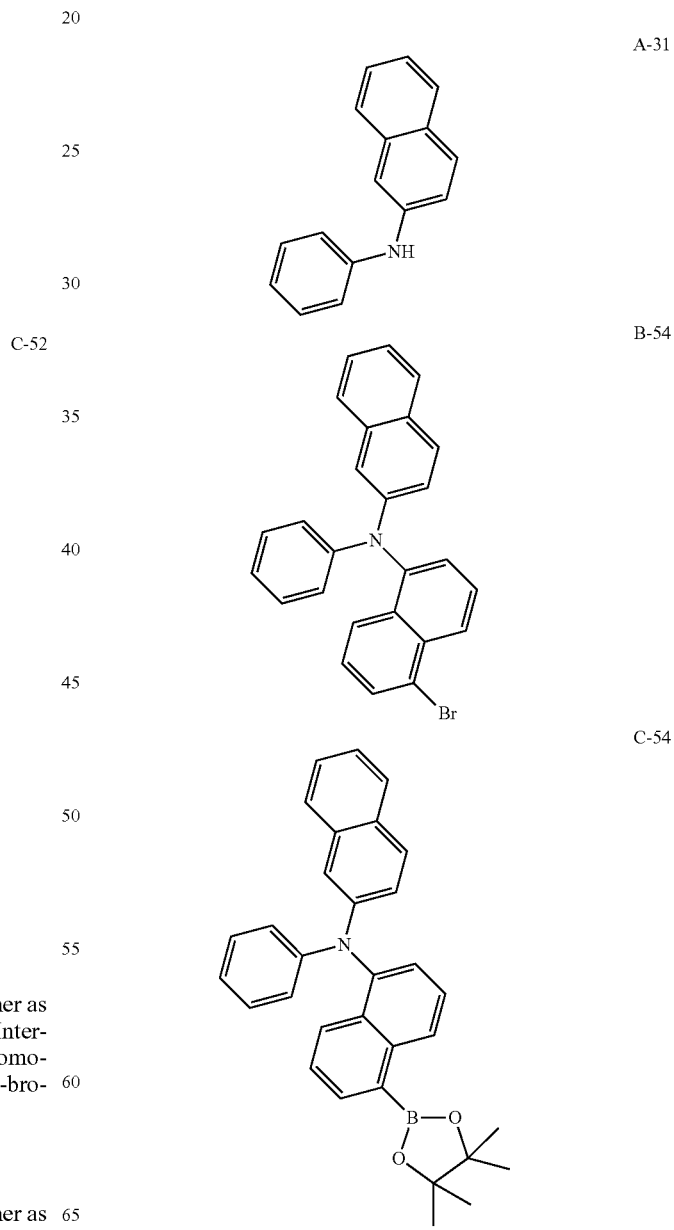

Synthesis of Intermediate B-54

Intermediate B-54 was synthesized in the same manner as the synthesis method of Intermediate B-5, except that Intermediate A-31 (refer to Synthesis Example 12) and 1-bromo-5-iodo naphthalene, instead of Intermediate A-5 and 4-bromoiodobenzene respectively, were used.

Synthesis of Intermediate C-54

Intermediate C-54 was synthesized in the same manner as the synthesis method of Intermediate C-5, except that Intermediate B-54, instead of Intermediate B-5, was used.

Synthesis of Compound 54

3.07 g of Compound 54 (Yield 71%) was synthesized in the same manner as the synthesis method of Compound 54, except that Intermediate 3-16 (refer to Synthesis Example 5) and Intermediate C-54, instead of Intermediate 3-5 and Intermediate C-5 respectively, were used in the synthesis of Compound 5. Compound 54 was identified using MS/FAB and NMR.

$C_{54}H_{34}N_2$: calc. 710.86, found 710.91.

$^1$H NMR (CDCl$_3$, 400 MHz) δ(ppm) 8.52-8.44 (m, 2H), 8.15-7.92 (m, 8H), 7.83-7.30 (m, 17H), 7.07-7.02 (m, 3H), 6.76-6.70 (m, 2H), 6.42-6.39 (m, 2H)

Synthesis Example 22: Synthesis of Compound 56

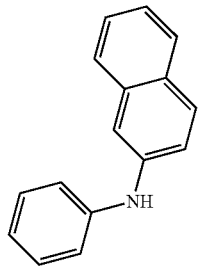

A-31

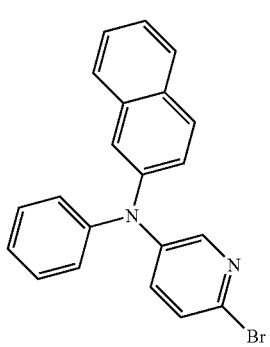

B-56

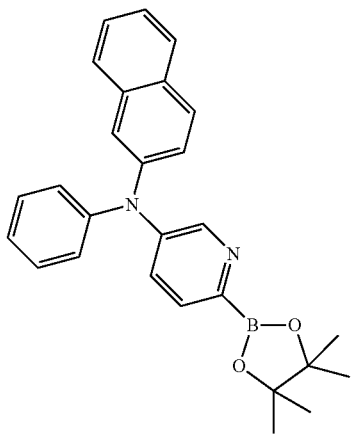

C-56

Synthesis of Intermediate B-56

Intermediate B-56 was synthesized in the same manner as the synthesis method of Intermediate B-5, except that Intermediate A-31 (refer to Synthesis Example 12) and 2,5-dibromopyridine, instead of Intermediate A-5 and 4-bromoiodobenzene respectively, were used.

Synthesis of Intermediate C-56

Intermediate C-56 was synthesized in the same manner as the synthesis method of Intermediate C-5, except that Intermediate B-56, instead of Intermediate B-5, was used.

Synthesis of Compound 56

2.66 g of Compound 56 (Yield 74%) was synthesized in the same manner as the synthesis method of Compound 5, except that Intermediate 3-16 (refer to Synthesis Example 5) and Intermediate C-56, instead of Intermediate 3-5 and Intermediate C-5 respectively, were used in the synthesis of Compound 5. Compound 56 was identified using MS/FAB and NMR.

$C_{49}H_{31}N_3$: calc. 661.25, found 661.31.

$^1$H NMR (CDCl$_3$, 400 MHz) δ(ppm) 8.52-8.44 (m, 2H), 8.15-8.12 (m, 4H), 8.08-7.99 (m, 6H), 7.78-7.76 (m, 2H), 7.69-7.53 (m, 6H), 7.48-7.36 (m, 4H), 7.22-7.09 (m, 3H), 6.96-6.92 (m, 2H), 6.60-6.58 (m, 2H)

Synthesis Example 23: Synthesis of Compound 57

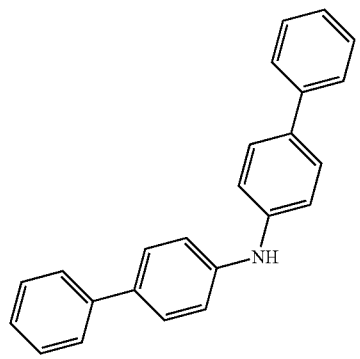

A-5

B-57

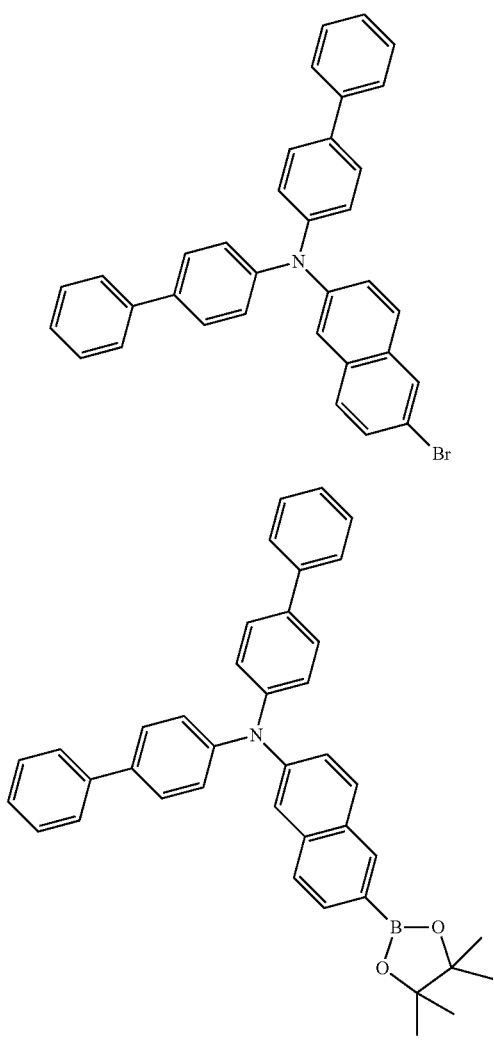

Synthesis of Intermediate B-57

Intermediate B-57 was synthesized in the same manner as the synthesis method of Intermediate B-5, except that 2-bromo-6-iodonaphthalene, instead of 4-bromoiodobenzene, was used.

Synthesis of Intermediate C-57

Intermediate C-7 was synthesized in the same manner as the synthesis method of Intermediate C-5, except that Intermediate B-57, instead of Intermediate B-5, was used.

Synthesis of Compound 57

3.89 g of Compound 57 (Yield 86%) was synthesized in the same manner as the synthesis method of Compound 5, except that Intermediate 3-16 (refer to Synthesis Example 5) and Intermediate C-57, instead of Intermediate 3-5 and Intermediate C-5 respectively, were used in the synthesis of Compound 5. Compound 57 was identified using MS/FAB and NMR.

$C_{62}H_{40}N_2$: calc. 812.31, found 812.35.

$^1$H NMR (CDCl$_3$, 400 MHz) δ(ppm) 8.52-8.44 (m, 2H), 8.15-8.01 (m, 8H), 7.89-7.79 (m, 5H), 7.63-7.36 (m, 20H), 7.14-7.11 (m, 1H), 6.99-6.90 (m, 4H)

Synthesis Example 24: Synthesis of Compound 59

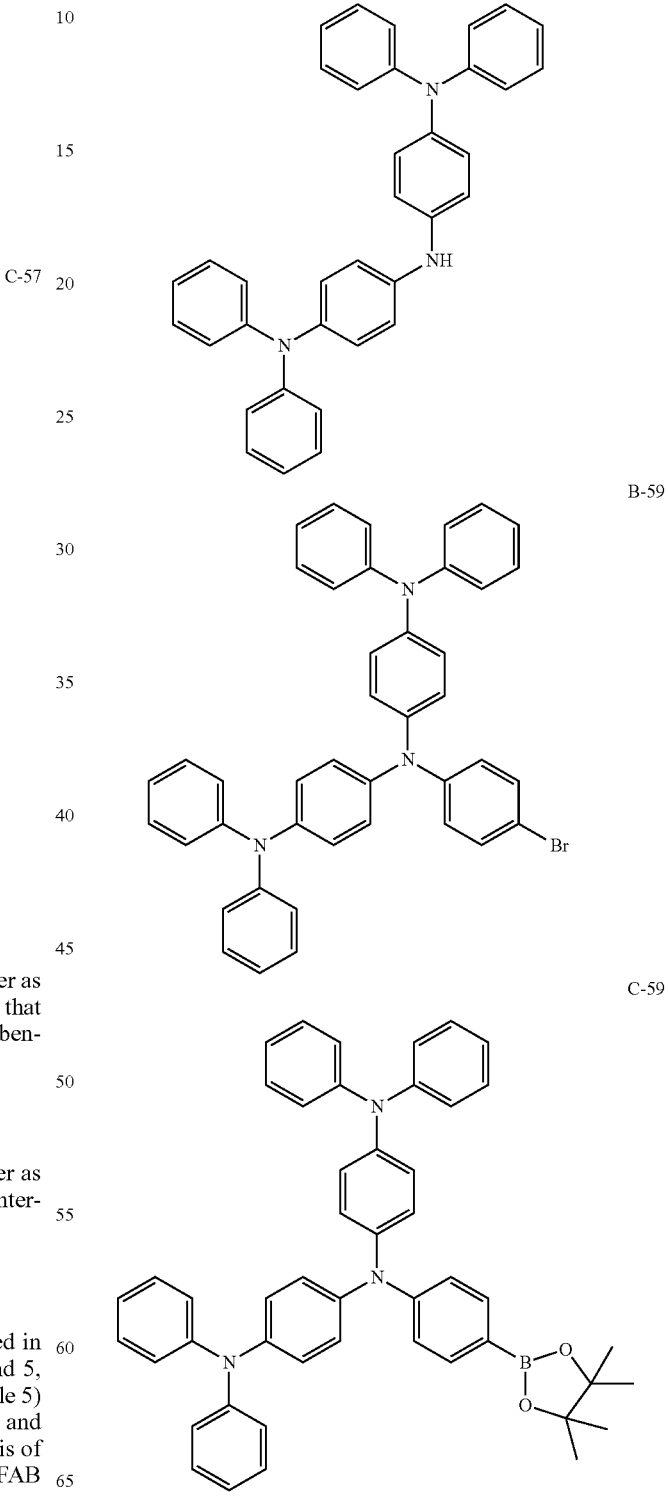

Synthesis of Intermediate A-59

Intermediate A-16 was synthesized in the same manner as the synthesis method of Intermediate A-5, except that (4-bromo-phenyl)-diphenylamine and N',N'-diphenylbenzene-1,4-diamine, instead of 4-bromobiphenyl and 4-phenylaniline respectively, were used.

Synthesis of Intermediate B-59

Intermediate B-59 was synthesized in the same manner as the synthesis method of Intermediate B-5, except that Intermediate A-59, instead of Intermediate A-5, was used.

Synthesis of Intermediate C-59

Intermediate C-59 was synthesized in the same manner as the synthesis method of Intermediate C-5, except that Intermediate B-59, instead of Intermediate B-5, was used.

Synthesis of Compound 59

2.65 g of Compound 59 (Yield 71%) was synthesized in the same manner as the synthesis method of Compound 5, except that Intermediate 3-16 (refer to Synthesis Example 5) and Intermediate C-59, instead of Intermediate 3-5 and Intermediate C-5 respectively, were used in the synthesis of Compound 5. Compound 59 was identified using MS/FAB and NMR.

$C_{70}H_{48}N_4$: calc. 944.38, found 944.42.

$^1$H NMR (CDCl$_3$, 400 MHz) δ(ppm) 8.52-8.48 (m, 2H), 8.16-7.99 (m, 8H), 7.80-7.76 (m, 2H), 7.58-7.39 (m, 8H), 7.08-7.00 (m, 7H), 6.87-6.75 (m, 14H), 6.69-6.59 (m, 7H)

Synthesis Example 25: Synthesis of Compound 62

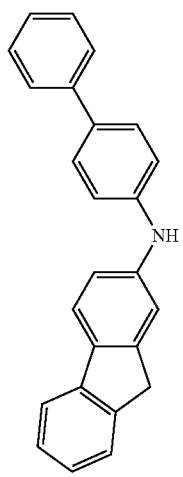

A-23

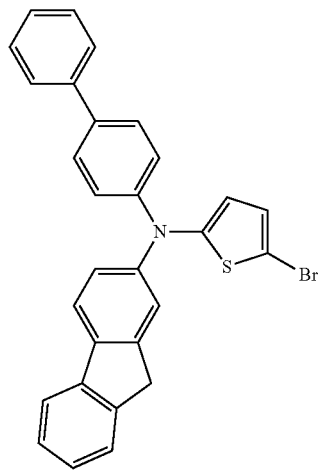

B-62

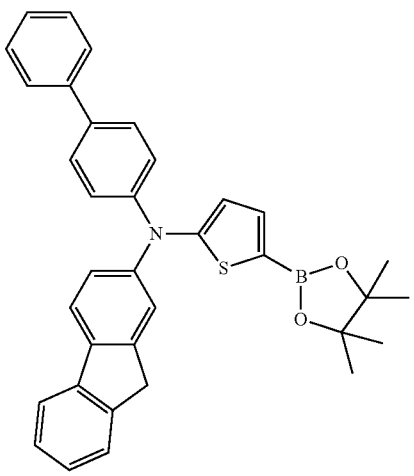

C-62

Synthesis of Intermediate B-62

Intermediate B-63 was synthesized in the same manner as the synthesis method of Intermediate B-5, except that Intermediate A-23 (refer to Synthesis Example 8) and 2-bromo-5-iodothiophene, instead of Intermediate A-5 and 4-bromoiodobenzene respectively, were used.

Synthesis of Intermediate C-62

Intermediate C-62 was synthesized in the same manner as the synthesis method of Intermediate C-5, except that Intermediate B-62, instead of Intermediate B-5, was used.

Synthesis of Compound 62

2.85 g of Compound 62 (Yield 79%) was synthesized in the same manner as the synthesis method of Compound 5, except that Intermediate 3-16 (refer to Synthesis Example 5) and Intermediate C-62, instead of Intermediate 3-5 and Intermediate C-5 respectively, were used in the synthesis of Compound 5. Compound 62 was identified using MS/FAB and NMR.

$C_{58}H_{40}N_2S$: calc. 808.29, found 808.33.

$^1$H NMR (CDCl$_3$, 400 MHz) δ(ppm) 8.52-8.48 (m, 2H), 8.15-8.12 (m, 3H), 8.08-7.99 (m, 4H), 7.82-7.70 (m, 3H), 7.64-7.30 (m, 14H), 7.18-7.10 (m, 3H), 6.99-6.97 (m, 1H), 6.85-6.78 (m, 4H), 1.61 (s, 6H)

Synthesis Example 26: Synthesis of Compound 63

A-23

B-63

C-63

Synthesis of Intermediate B-63

Intermediate B-63 was synthesized in the same manner as the synthesis method of Intermediate B-5, except that Intermediate A-23 (refer to Synthesis Example 8) and 2-bromo-5-iodofuran, instead of Intermediate A-5 and 4-bromoiodobenzene respectively, were used.

Synthesis of Intermediate C-63

Intermediate C-63 was synthesized in the same manner as the synthesis method of Intermediate C-5, except that Intermediate B-63, instead of Intermediate B-5, was used.

Synthesis of Compound 63

3.04 g of Compound 63 (Yield 80%) was synthesized in the same manner as the synthesis method of Compound 5, except that Intermediate 3-16 (refer to Synthesis Example 5) and Intermediate C-63, instead of Intermediate 3-5 and Intermediate C-5 respectively, were used in the synthesis of Compound 5. Compound 63 was identified using MS/FAB and NMR.

$C_{58}H_{40}N_2O$: calc. 792.31, found 792.35.

$^1$H NMR (CDCl$_3$, 400 MHz) δ(ppm) 8.52-8.48 (m, 2H), 8.25-7.96 (m, 10H), 7.64-7.30 (m, 14H), 7.11-7.08 (m, 2H), 6.87-6.80 (m, 2H), 6.61-6.58 (m, 3H), 5.11-5.09 (m, 1H), 1.61 (s, 6H)

Synthesis Example 27: Synthesis of Compound 64

D-64

Synthesis of Intermediate D-64

Intermediate D-64 was synthesized in the same manner as the synthesis method of Intermediate 1-5 of Synthesis Example 1, except that 2,4-dibromo-6-fluoro-phenylamine instead of 2,5-dibromonitrobenzene and phenyl boronic acid instead of pyrene boronic acid, were used.

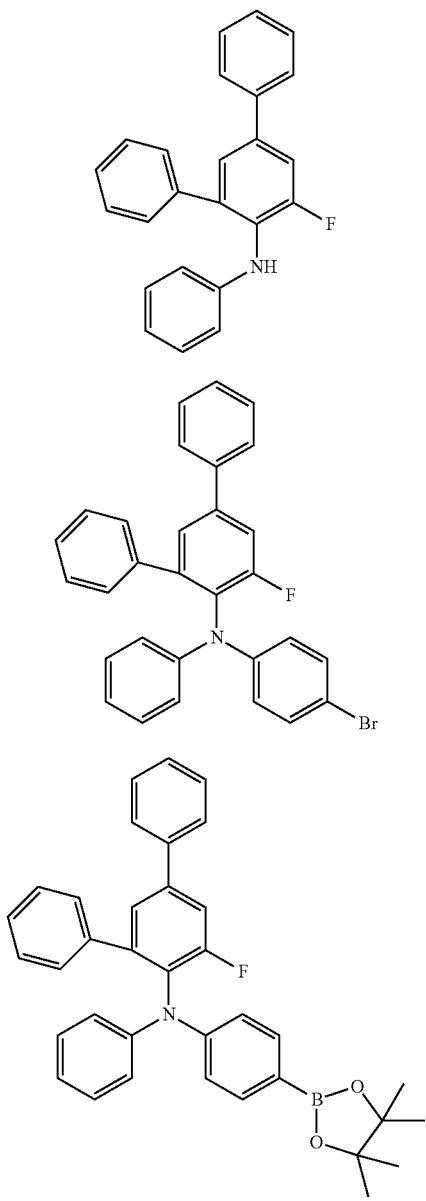

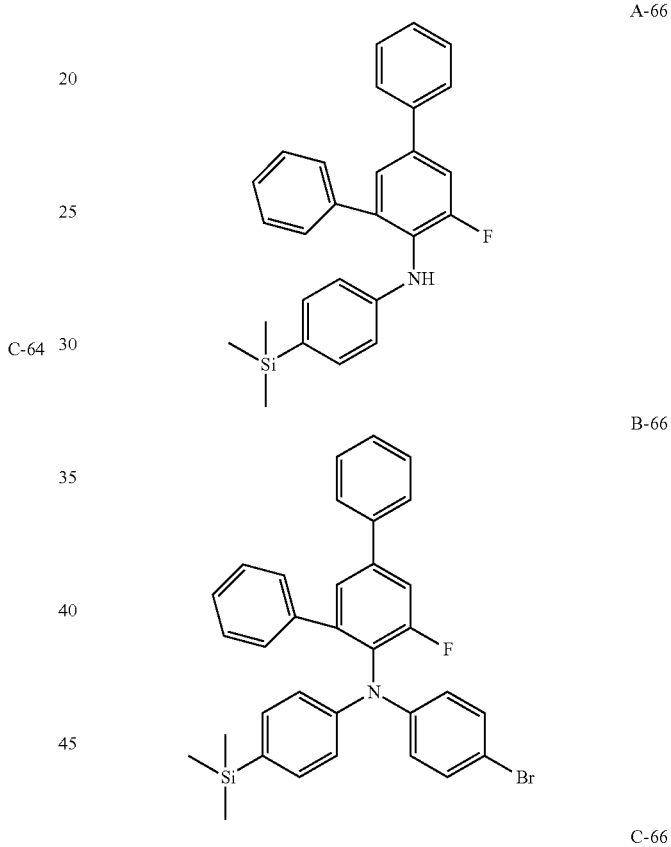

Synthesis of Intermediate A-64

Intermediate A-64 was synthesized in the same manner as the synthesis method of Intermediate A-5, except that bromobenzene and Intermediate D-64, instead of 4-bromobiphenyl and 4-phenylaniline respectively, were used.

Synthesis of Intermediate B-64

Intermediate B-64 was synthesized in the same manner as the synthesis method of Intermediate B-5, except that Intermediate A-64, instead of Intermediate A-5, was used.

Synthesis of Intermediate C-64

Intermediate C-64 was synthesized in the same manner as the synthesis method of Intermediate C-5, except that Intermediate B-64, instead of Intermediate B-5, was used.

Synthesis of Compound 64

3.09 g of Compound 64 (Yield 79%) was synthesized in the same manner as the synthesis method of Compound 5, except that Intermediate 3-16 (refer to Synthesis Example 5) and Intermediate C-64, instead of Intermediate 3-5 and Intermediate C-5 respectively, were used in the synthesis of Compound 5. Compound 64 was identified using MS/FAB and NMR.

$C_{58}H_{37}N_2F$: calc. 780.29, found 780.32.

$^1$H NMR (CDCl$_3$, 400 MHz) δ(ppm) 8.52-8.48 (m, 2H), 8.15-7.99 (m, 7H), 7.80-7.35 (m, 20H), 7.13-7.03 (m, 3H), 6.93-6.91 (m, 2H), 6.83-6.80 (m, 1H), 6.77-6.74 (m, 2H)

Synthesis Example 28: Synthesis of Compound 66

Synthesis of Intermediate A-66

Intermediate A-66 was synthesized in the same manner as the synthesis method of Intermediate A-5, except that bromotrimethylsilylbenzene and Intermediate D-64 (refer to Synthesis Example 27), instead of 4-bromobiphenyl and 4-phenylaniline respectively, were used.

Synthesis of Intermediate B-66

Intermediate B-66 was synthesized in the same manner as the synthesis method of Intermediate B-5, except that Intermediate A-66, instead of Intermediate A-5, was used.

Synthesis of Intermediate C-66

Intermediate C-66 was synthesized in the same manner as the synthesis method of Intermediate C-5, except that Intermediate B-66, instead of Intermediate B-5, was used.

Synthesis of Compound 66

2.45 g of Compound 66 (Yield 71%) was synthesized in the same manner as the synthesis method of Compound 5, except that Intermediate 3-16 (refer to Synthesis Example 5) and Intermediate C-66, instead of Intermediate 3-5 and Intermediate C-5 respectively, were used in the synthesis of Compound 5. Compound 66 was identified using MS/FAB and NMR.

$C_{61}H_{45}N_2FSi$: calc. 852.33, found 852.37.

$^1$H NMR (CDCl$_3$, 400 MHz) δ(ppm) 8.52-8.48 (m, 2H), 8.15-7.99 (m, 7H), 7.80-7.70 (m, 4H), 7.65-7.35 (m, 18H), 7.13-7.11 (m, 1H), 6.83-6.76 (m, 4H), 0.24 (s, 9H)

Synthesis Example 29: Synthesis of Compound 67

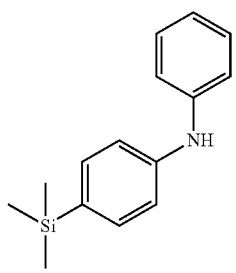

A-67

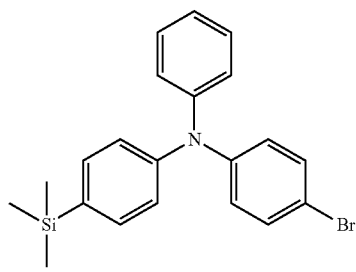

B-67

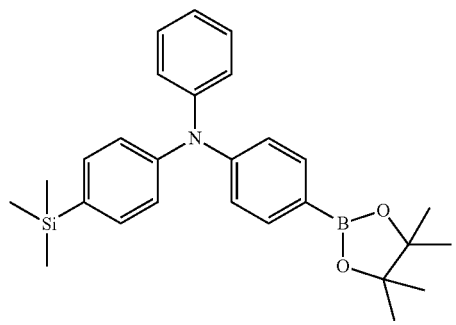

C-67

Synthesis of Intermediate A-67

Intermediate A-67 was synthesized in the same manner as the synthesis method of Intermediate A-5, except that bromotrimethylsilylbenzene instead of 4-bromobiphenyl, was used.

Synthesis of Intermediate B-67

Intermediate B-67 was synthesized in the same manner as the synthesis method of Intermediate B-5, except that Intermediate A-67, instead of Intermediate A-5, was used.

Synthesis of Intermediate C-67

Intermediate C-67 was synthesized in the same manner as the synthesis method of Intermediate C-5, except that Intermediate B-67, instead of Intermediate B-5, was used.

Synthesis of Compound 67

2.33 g of Compound 67 (Yield 78%) was synthesized in the same manner as the synthesis method of Compound 5, except that Intermediate 3-16 (refer to Synthesis Example 5) and Intermediate C-67, instead of Intermediate 3-5 and Intermediate C-5 respectively, were used in the synthesis of Compound 5. Compound 67 was identified using MS/FAB and NMR.

$C_{49}H_{38}N_2Si$: calc. 682.28, found 682.31.

$^1$H NMR (CDCl$_3$, 400 MHz) δ(ppm) 8.52-8.48 (m, 2H), 8.15-7.99 (m, 6H), 7.80-7.72 (m, 2H), 7.57-7.36 (m, 10H), 7.18-7.13 (m, 2H), 6.94-6.83 (m, 3H), 6.88-7.83 (m, 2H), 6.77-6.72 (m, 2H), 0.24 (s, 9H)

Synthesis Example 30: Synthesis of Compound 68

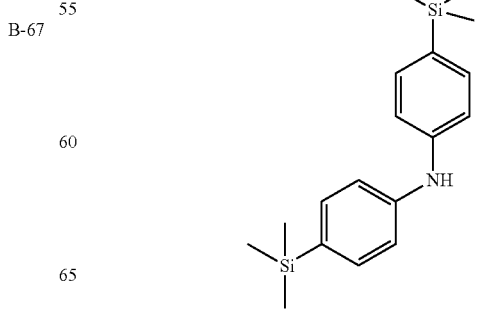

A-68

145

-continued

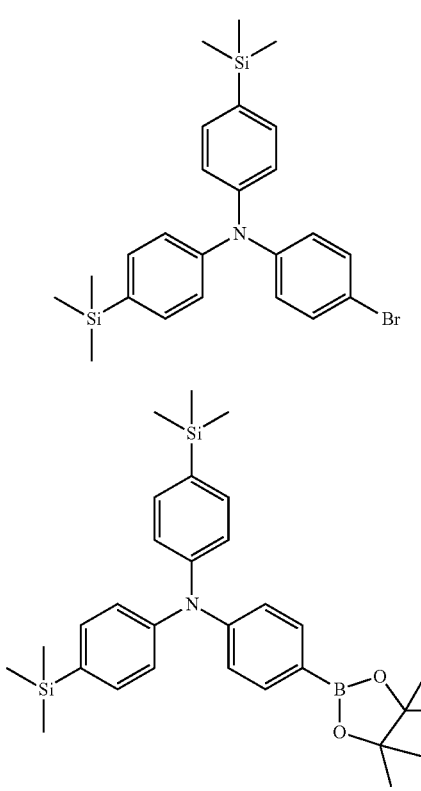

Synthesis of Intermediate A-68

Intermediate A-68 was synthesized in the same manner as the synthesis method of Intermediate A-5, except that bromotrimethylsilylbenzene and 4-(trimethylsilyl)aniline, instead of 4-bromobiphenyl and 4-phenylaniline respectively, were used.

Synthesis of Intermediate B-68

Intermediate B-58 was synthesized in the same manner as the synthesis method of Intermediate B-5, except that Intermediate A-68, instead of Intermediate A-5, was used.

Synthesis of Intermediate C-68

Intermediate C-68 was synthesized in the same manner as the synthesis method of Intermediate C-5, except that Intermediate B-68, instead of Intermediate B-5, was used.

Synthesis of Compound 68

2.88 g of Compound 68 (Yield 74%) was synthesized in the same manner as the synthesis method of Compound 5, except that Intermediate 3-12 (refer to Synthesis Example 2) and Intermediate C-68, instead of Intermediate 3-5 and Intermediate C-5 respectively, were used in the synthesis of Compound 5. Compound 68 was identified using MS/FAB and NMR.

$C_{56}H_{48}N_2Si_2$: calc. 804.33, found 804.38.

$^1$H NMR (CDCl$_3$, 400 MHz) δ(ppm) 8.52-8.48 (m, 2H), 8.15-7.94 (m, 8H), 7.85-7.78 (m, 2H), 7.70-7.61 (m, 3H), 7.54-7.36 (m, 9H), 6.98-6.90 (m, 2H), 6.80-6.70 (m, 4H), 0.24 (s, 18H)

146

Synthesis Example 31: Synthesis of Compound 69

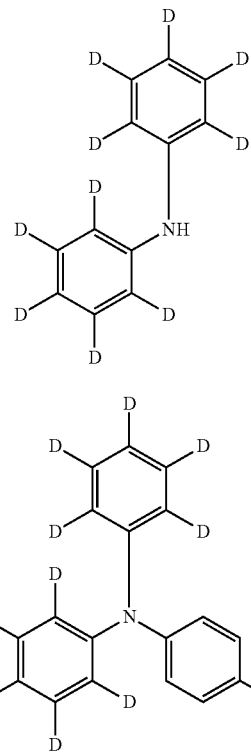

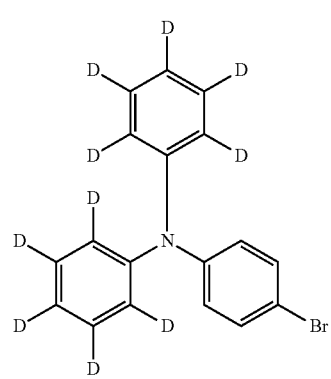

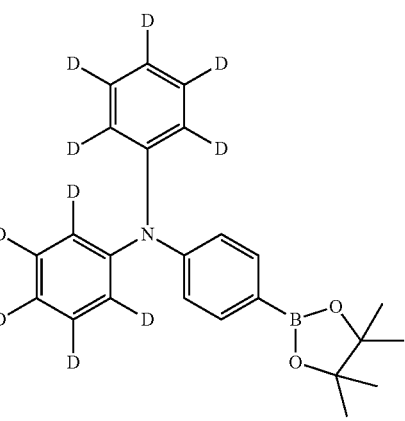

Synthesis of Intermediate A-69

Intermediate A-69 was synthesized in the same manner as the synthesis method of Intermediate A-5, except that bromobenzene-d5 and aniline-d5, instead of 4-bromobiphenyl and 4-phenylaniline respectively, were used.

Synthesis of Intermediate B-69

Intermediate B-69 was synthesized in the same manner as the synthesis method of Intermediate B-5, except that Intermediate A-69, instead of Intermediate A-5, was used.

Synthesis of Intermediate C-69

Intermediate C-69 was synthesized in the same manner as the synthesis method of Intermediate C-5, except that Intermediate B-69, instead of Intermediate B-5, was used.

Synthesis of Compound 69

2.79 g of Compound 69 (Yield 81%) was synthesized in the same manner as the synthesis method of Compound 5, except that Intermediate 3-16 (refer to Synthesis Example 5) and Intermediate C-69, instead of Intermediate 3-5 and Intermediate C-5 respectively, were used. Compound 69 was identified using MS/FAB and NMR.

$C_{45}H_{20}D_{10}N_2$: calc. 620.30, found 620.34.

$^1$H NMR (CDCl$_3$, 400 MHz) δ(ppm) 8.52-8.48 (m, 2H), 8.15-7.94 (m, 7H), 7.80-7.72 (m, 2H), 7.57-7.45 (m, 6H), 7.40-7.35 (m, 1H), 7.18-7.10 (m, 2H)

Example 1

15 Ω/cm$^2$ (1200 Å) ITO glass substrate (Corning) as an anode and substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

2-TNATA was deposited on the ITO layer to form an HIL having a thickness of about 600 Å, and then NPB was deposited on the HIL to form a HTL having a thickness of about 300 Å.

9,10-di-naphthalene-2-yl-anthracene (AND, host) and Compound 5 (dopant) were co-deposited on the HTL in a weight ratio of about 98:2 to form an EML having a thickness of about 300 Å.

Subsequently, Alq$_3$ was deposited on the EML to form an ETL having a thickness of about 300 Å, and then LiF was deposited on the ETL to form an EIL having a thickness of about 10 Å. Then, Al was deposited on the EIL to form a second electrode (cathode) having a thickness of about 3000 Å, thereby completing the manufacture of an organic light-emitting diode.

Example 2

An organic light-emitting diode was manufactured in the same manner as in Example 1, except that Compound 12, instead of Compound 5, was used as a dopant in forming the EML.

Example 3

An organic light-emitting diode was manufactured in the same manner as in Example 1, except that Compound 16, instead of NPB, was used in forming the HTL, and 4-bis-(2,2-diphenylvinyl)biphenyl (DPVBi), instead of Compound 5, was used as a dopant in forming the EML.

Example 4

An organic light-emitting diode was manufactured in the same manner as in Example 1, except that Compound 27, instead of NPB, was used in forming the HTL, and 4-bis-(2,2-diphenylvinyl)biphenyl (DPVBi), instead of Compound 5, was used as a dopant in forming the EML.

Example 5

An organic light-emitting diode was manufactured in the same manner as in Example 1, except that Compound 31, instead of Compound 5, was used as a dopant in forming the EML.

Example 6

An organic light-emitting diode was manufactured in the same manner as in Example 1, except that Compound 56, instead of Compound 5, was used as a dopant in forming the EML.

Example 7

An organic light-emitting diode was manufactured in the same manner as in Example 1, except that Compound 64, instead of Compound 5, was used as a dopant in forming the EML.

Example 8

An organic light-emitting diode was manufactured in the same manner as in Example 1, except that Compound 67, instead of Compound 5, was used as a dopant in forming the EML.

Example 9

An organic light-emitting diode was manufactured in the same manner as in Example 1, except that Compound 69, instead of Compound 5, was used as a dopant in forming the EML.

Example 10

An organic light-emitting diode was manufactured in the same manner as in Example 1, except that Compound 27, instead of NPB, was used in forming the HTL, and Compound 64, instead of Compound 5, was used as a dopant in forming the EML.

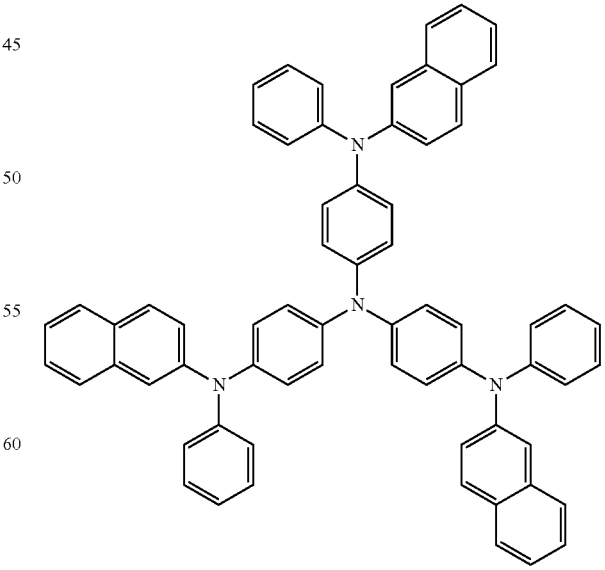

2-TNATA

-continued

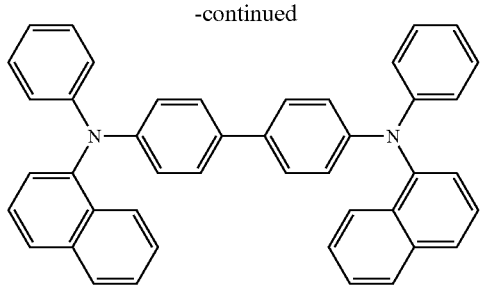

NPB

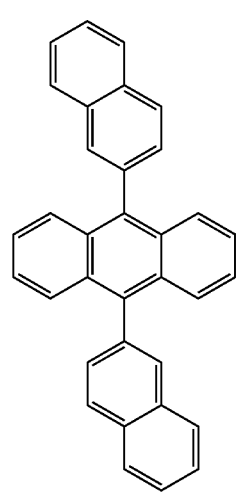

DNA

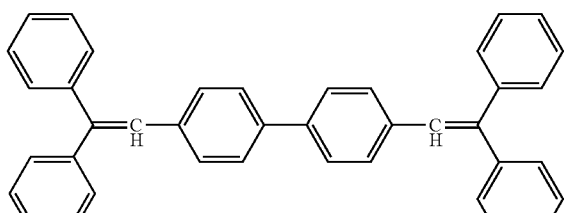

DPVBi

Comparative Example 1

An organic light-emitting diode was manufactured in the same manner as in Example 1, except that 4-bis-(2,2-diphenylvinyl)biphenyl (DPVBi), instead of Compound 5, was used as a dopant in forming the EML.

Comparative Example 2

An organic light-emitting diode was manufactured in the same manner as in Example 1, except that Compound A below, instead of Compound 5, was used as a dopant in forming the EML.

<Compound A>

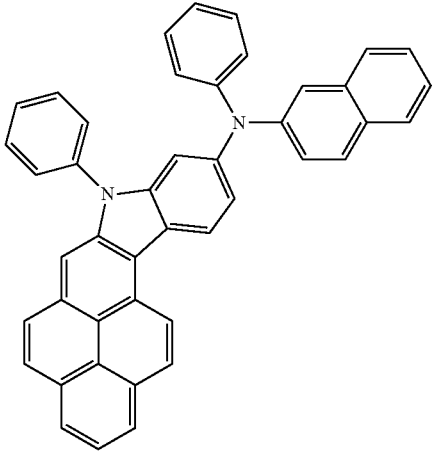

Comparative Example 3

An organic light-emitting diode was manufactured in the same manner as in Example 1, except that Compound B below, instead of Compound 5, was used as a dopant in forming the EML.

<Compound B>

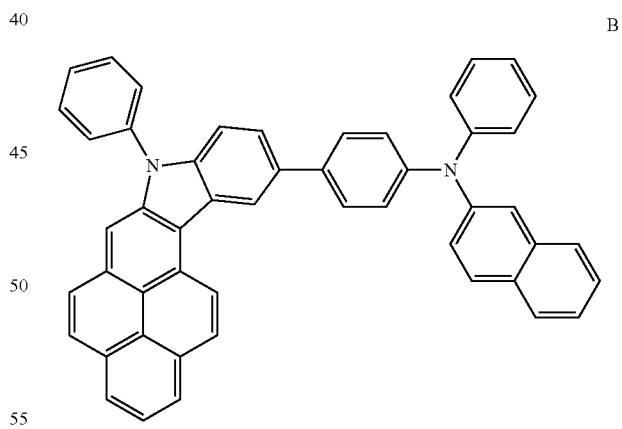

Evaluation Example 1

Driving voltages, current densities, luminances, emission colors, efficiencies, and half-life spans (@50 mA/cm$^2$) of the organic light-emitting diodes of Examples 1 to 10 and Comparative Examples 1 to 3 were measured using a PR650 Spectroscan Source Measurement Unit (available from Photo Research, Inc.). The results are shown in Table 1 below.

TABLE 1

| | HTL material | Dopant | Driving voltage (V) | Current density (mA/cm$^2$) | Luminance (cd/m$^2$) | Efficiency (cd/A) | Emission color | Half-lifespan (hr) |
|---|---|---|---|---|---|---|---|---|
| Example 1 | NPB | Cmpd 5 | 6.75 | 50 | 2,653 | 5.30 | Blue | 212 |
| Example 2 | Cmpd 12 | NPB | 6.50 | 50 | 2,253 | 4.51 | Blue | 233 |
| Example 3 | Cmpd 16 | DPVBi | 6.34 | 50 | 2,312 | 4.62 | Blue | 240 |
| Example 4 | Cmpd 27 | DPVBi | 6.30 | 50 | 2,248 | 4.50 | Blue | 245 |
| Example 5 | NPB | Cmpd 31 | 6.64 | 50 | 2,557 | 5.11 | Blue | 265 |
| Example 6 | NPB | Cmpd 56 | 6.55 | 50 | 2,548 | 5.10 | Blue | 260 |
| Example 7 | NPB | Cmpd 64 | 6.40 | 50 | 2,981 | 5.96 | Blue | 315 |
| Example 8 | NPB | Cmpd 67 | 6.50 | 50 | 2,942 | 5.88 | Blue | 365 |
| Example 9 | NPB | Cmpd 69 | 6.35 | 50 | 2,815 | 5.63 | Blue | 352 |
| Example 10 | Cmpd 27 | Cmpd 64 | 6.18 | 50 | 3,015 | 6.03 | Blue | 370 |
| Comparative Example 1 | NPB | DPVBi | 7.35 | 50 | 2,065 | 4.13 | Blue | 145 |
| Comparative Example 2 | NPB | Cmpd A | 6.95 | 50 | 2,105 | 4.21 | Bluish green | 167 |
| Comparative Example 3 | NPN | Cmpd B | 7.05 | 50 | 1,075 | 2.15 | Bluish green | 180 |

Referring to Table 1, the organic light-emitting diodes of Examples 1 to 10 (using the compound of Formula 1 as a HTL material and/or an EML material) were found to have lower driving voltages, improved efficiencies, and improved lifetime characteristics as compared with those of the organic light-emitting diodes of Comparative Examples 1 to 3.

As described above, according to the one or more example embodiments, an organic light-emitting diode including any of the amine-based compounds of Formula 1 above may have a low driving voltage, a high luminance, a high efficiency, and a long lifetime.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:
1. An organic light-emitting diode, comprising: a first electrode; a second electrode disposed opposite to the first electrode; and an organic layer disposed between the first electrode and the second electrode and including an emission layer, wherein the organic layer includes at least one amine-based compound represented by Formula 1 below:

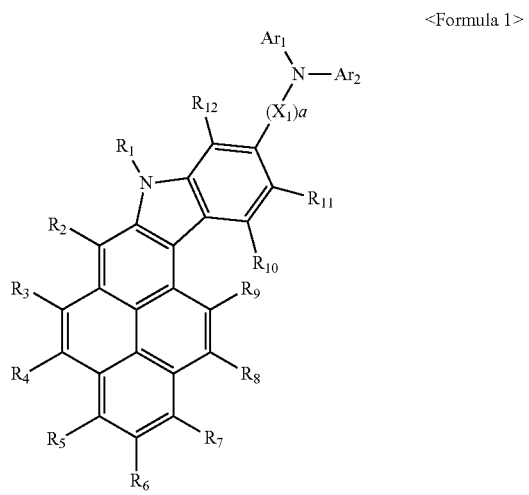

<Formula 1> wherein, in Formula 1, $X_1$ is selected from among a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

a is an integer of 1 to 5, wherein, when a is 2 or greater, the $X_1$s in a are identical to or differ from each other;

$Ar_1$, $Ar_2$, and $R_1$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group;

$R_2$ to $R_{12}$ are each independently selected from among
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —Si($Q_{11}$)($Q_{12}$)($Q_{13}$) (where $Q_{11}$ to $Q_{13}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, and the substituted $C_2$-$C_{60}$ heteroaryl group being selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group).

2. The organic light-emitting diode of claim 1, wherein $X_1$ is selected from among a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group.

3. The organic light-emitting diode of claim 1, wherein $X_1$ is a group represented by one of Formulae 2-1 to 2-27 below:

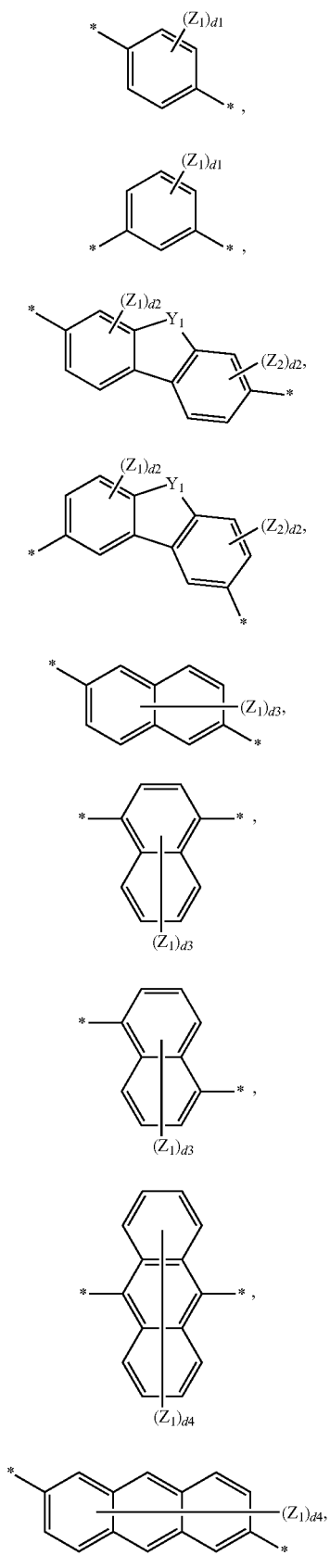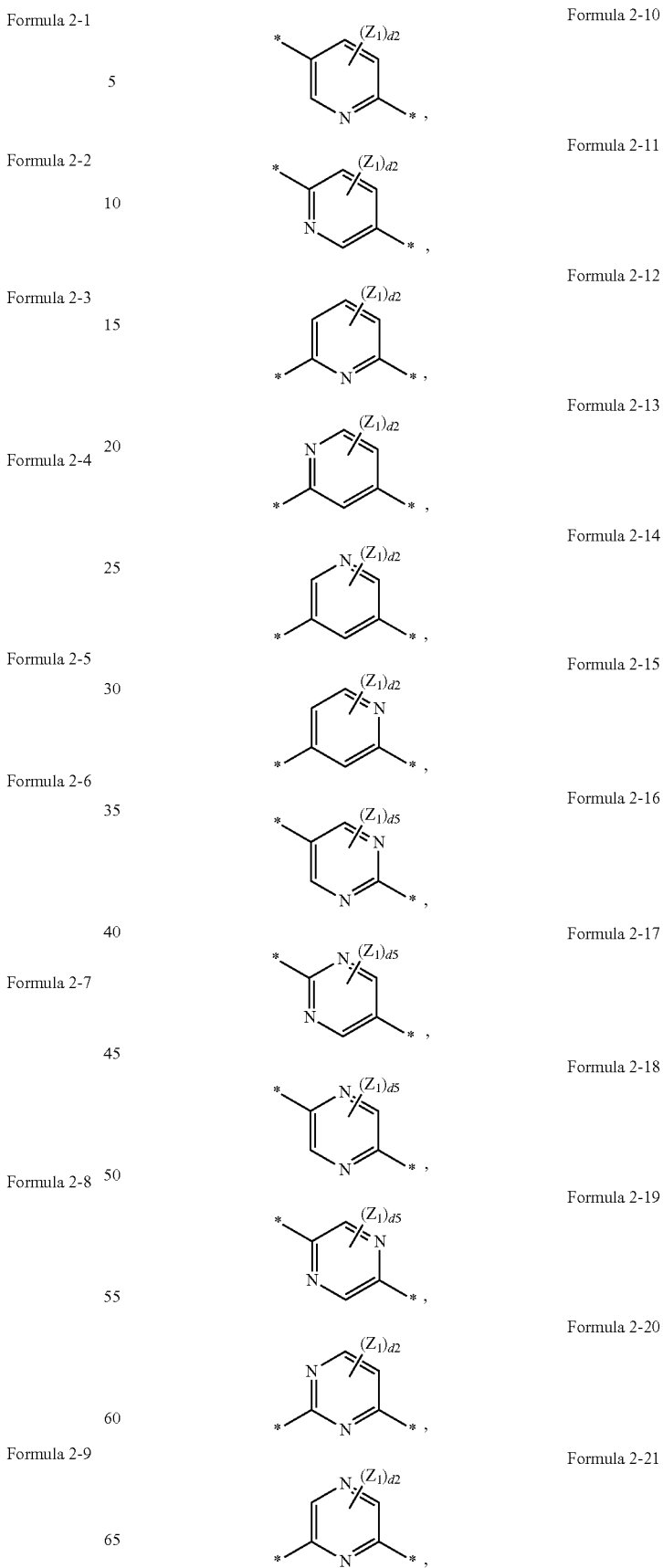

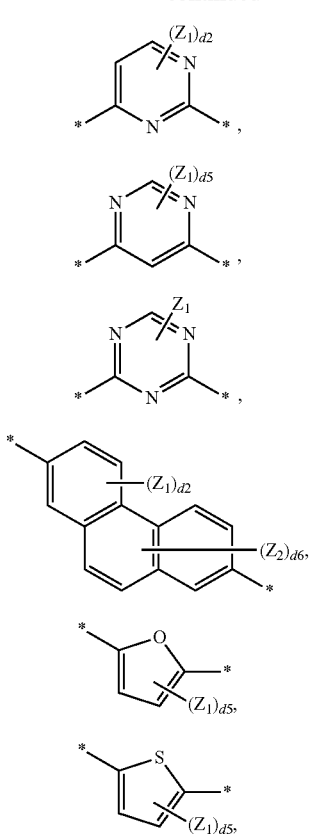

wherein, in Formulae 2-1 to 2-27, $Y_1$ is O, S, a $C(R_{21})(R_{22})$, or $N(R_{23})$;

$Z_1$, $Z_2$, and $R_{21}$ to $R_{23}$ are each independently selected from among, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group, and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$Si(Q_{16})(Q_{17})(Q_{18})$ (where $Q_{16}$ to $Q_{18}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group;

d1 is an integer of 1 to 4;

d2 is an integer of 1 to 3;

d3 is an integer of 1 to 6;

d4 is an integer of 1 to 8;

d5 is 1 or 2;

\* indicates a binding site of a pyrene-based core of Formula 1, or a binding site of adjacent $X_1$ of Formula 1; and \*' indicates a binding site of "N" of Formula 1 or an adjacent $X_1$ of Formula 1.

4. The organic light-emitting diode of claim 3, wherein $Z_1$, $Z_2$, and $R_{21}$ to $R_{23}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$Si(Q_{16})(Q_{17})(Q_{18})$ (where $Q_{16}$ to $Q_{18}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

5. The organic light-emitting diode of claim 1, wherein $X_1$ is a group represented by one of Formulae 3-1 to 3-12 below:

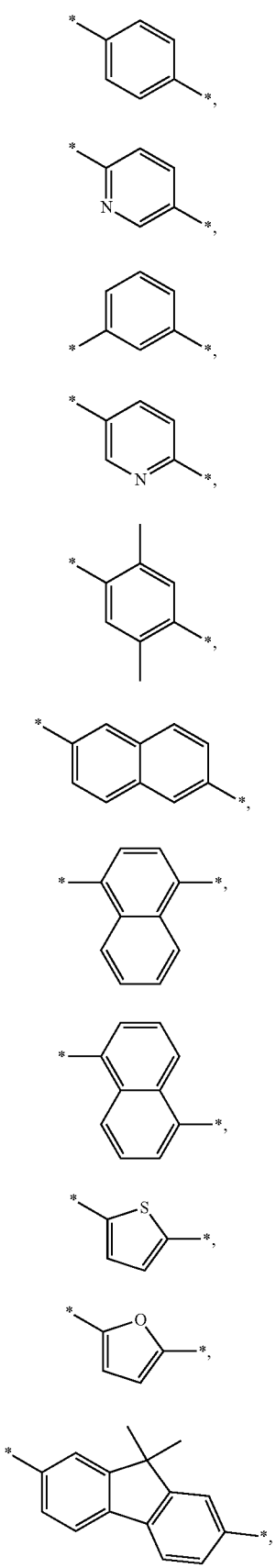

wherein, in Formulae 3-1 to 3-12, * indicates a binding site of a pyrene-based core of Formula 1 or a binding site of an adjacent $X_1$ of Formula 1, and
*' indicates a binding site of "N" of Formula 1 or a binding site of an adjacent $X_1$ of Formula 1.

6. The organic light-emitting diode of claim 1, wherein a is 1 or 2.

7. The organic light-emitting diode of claim 1, wherein $Ar_1$, $Ar_2$, and $R_1$ are each independently selected from among a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spirofluorenyl group, a substituted or unsubstituted phenalenyl group, a substituted or unsubstituted phenanthrenyl group, a substituted or unsubstituted anthryl group, substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, and a substituted or unsubstituted benzocarbazolyl group.

8. The organic light-emitting diode of claim 1, wherein $Ar_1$ and $Ar_2$ are each independently a group represented by one of Formulae 4-1 to 4-9 below:

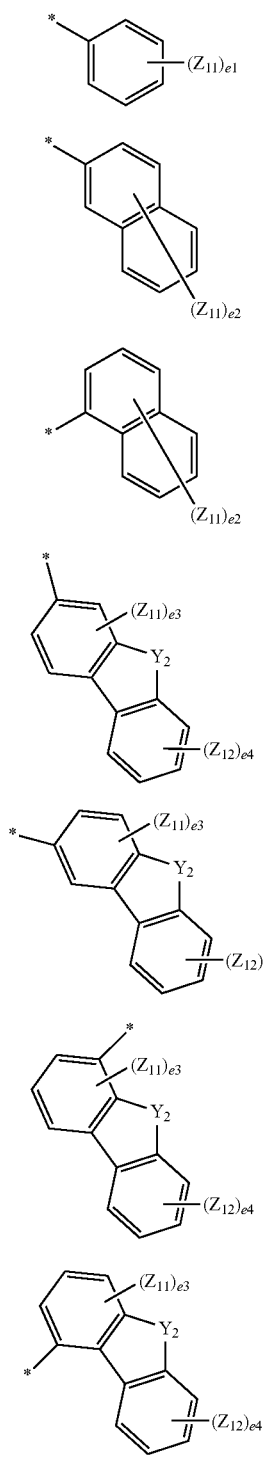

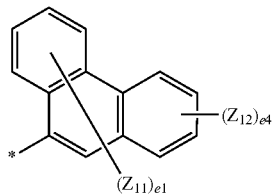

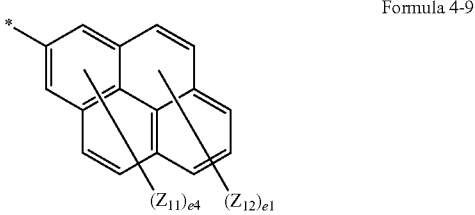

wherein, in Formulae 4-1 to 4-9, $Y_2$ is O, S, a $C(R_{25})(R_{26})$, or $N(R_{27})$;

$Z_{11}$, $Z_{12}$, and $R_{25}$ to $R_{27}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a $C_6$-$C_{20}$ aryl group and a $C_2$-$C_{20}$ heteroaryl group, a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —$N(Q_{14})(Q_{15})$, and —$Si(Q_{16})(Q_{17})(Q_{18})$ (where $Q_{14}$ to $Q_{18}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

e1 is an integer of 1 to 5;
e2 is an integer of 1 to 7;
e3 is an integer of 1 to 3;
e4 is an integer of 1 to 4; and
* indicates a binding site of "N" of Formula 1.

9. The organic light-emitting diode of claim 8, wherein $Z_{11}$, $Z_{12}$, and $R_{25}$ to $R_{27}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group).

10. The organic light-emitting diode of claim 1, wherein $Ar_1$ and $Ar_2$ are each independently a group represented by one of Formulae 5-1 to 5-7 below:

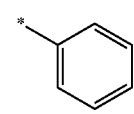

Formula 5-1

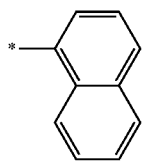

Formula 5-2

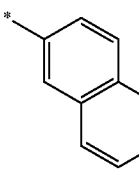

Formula 5-3

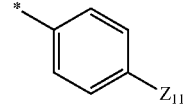

Formula 5-4

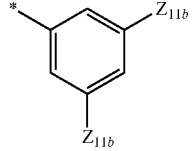

Formula 5-5

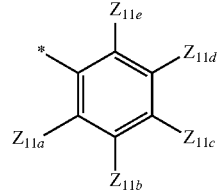

Formula 5-6

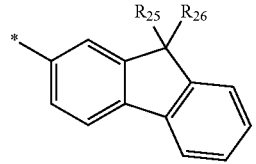

Formula 5-7 wherein, in Formulae 5-1 to 5-7, $Z_{11}$ and $Z_{11a}$ to $Z_{11e}$ are each independently selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group, and —N($Q_{14}$)($Q_{15}$), and —Si($Q_{16}$)($Q_{17}$)($Q_{18}$) (where $Q_{14}$ to $Q_{18}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group); and $R_{25}$ and $R_{26}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

11. The organic light-emitting diode of claim 1, wherein $R_1$ is selected from among a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, and a hexacenyl group, and a phenyl group, a pentalenyl group, an indenylene group, a naphthyl group, an azulenyl group, a heptalenyl group, an indacenyl group, an acenaphthyl group, a fluorenyl group, a spiro-a fluorenyl group, a phenalenyl group, a phenanthrenyl group, an anthryl group, a fluoranthenyl group, a triphenylenyl group, a pyrenylene group, a chrysenyl group, a naphthacenyl group, a picenyl group, a perylenyl group, a pentaphenyl group, and a hexacenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group.

12. The organic light-emitting diode of claim 1, wherein $R_2$ to $R_{12}$ are each independently selected from among a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof, a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

13. The organic light-emitting diode of claim 1, wherein the amine-based compound is represented by Formula 1A below:

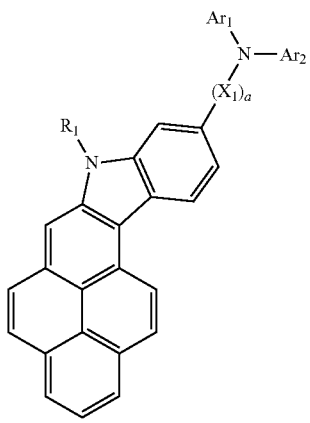

<Formula 1A> wherein, in Formula 1A, $X_1$, a, $Ar_1$, $Ar_2$, and $R_1$ are the same as those defined in claim 1.
14. The organic light-emitting diode of claim 1, wherein the amine-based compound is one of Compounds 1 to 70 below:
1
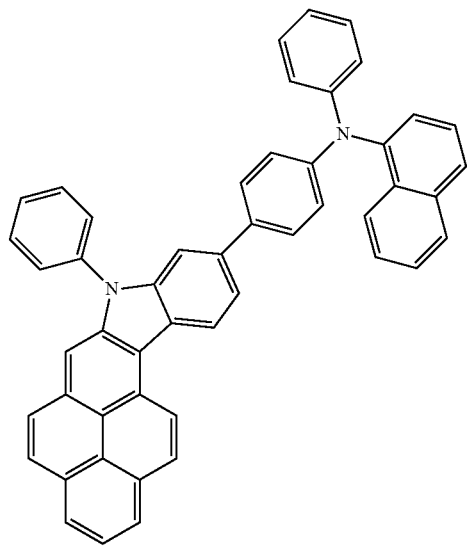
2
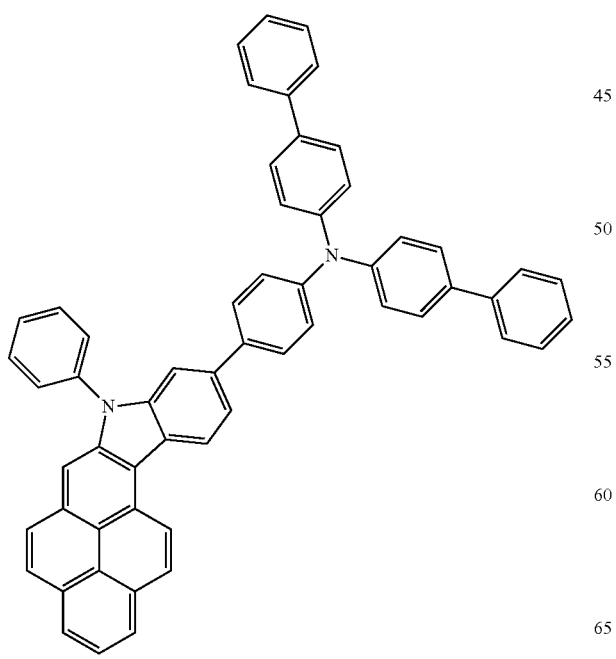
-continued
3
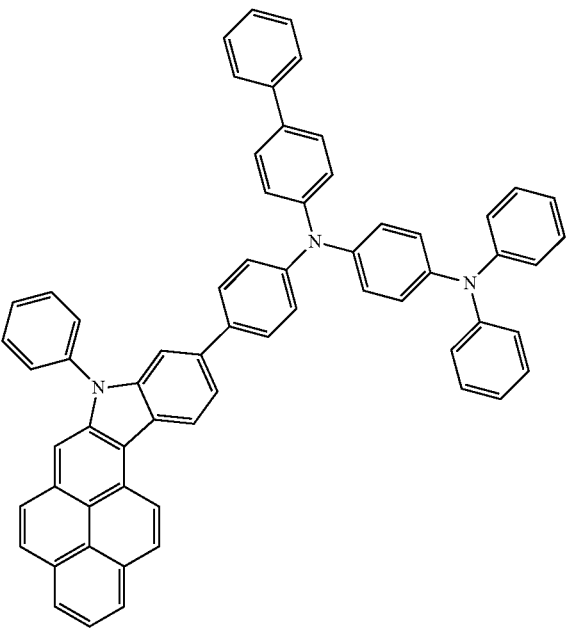
4
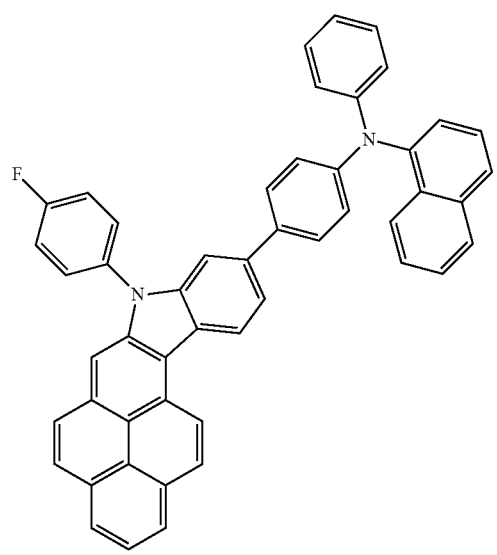

5
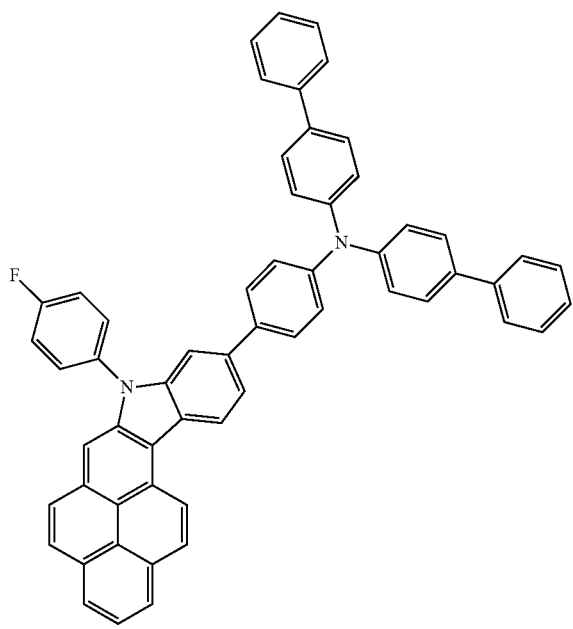
7
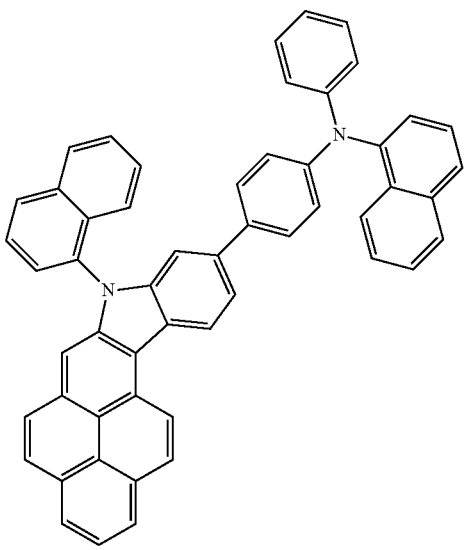
6
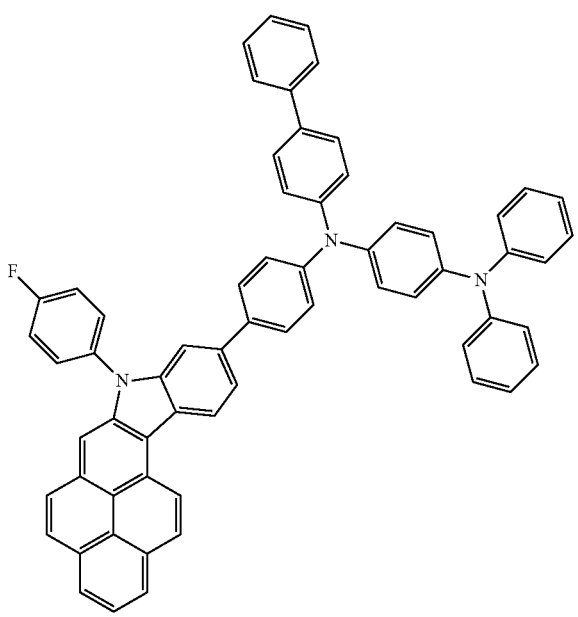
8
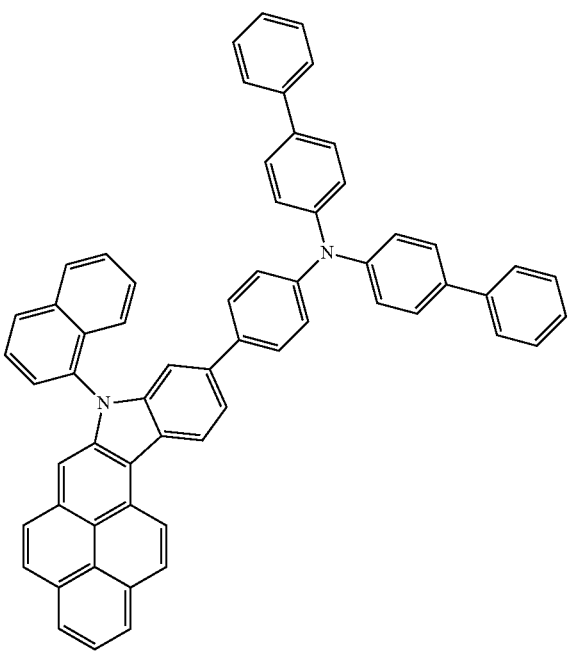

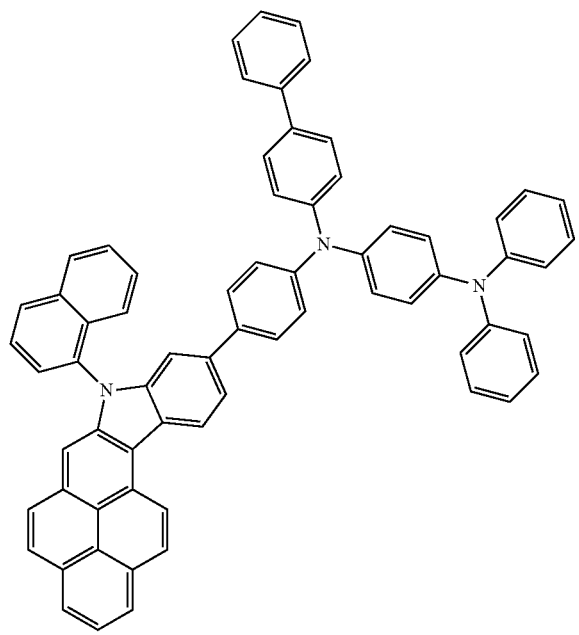
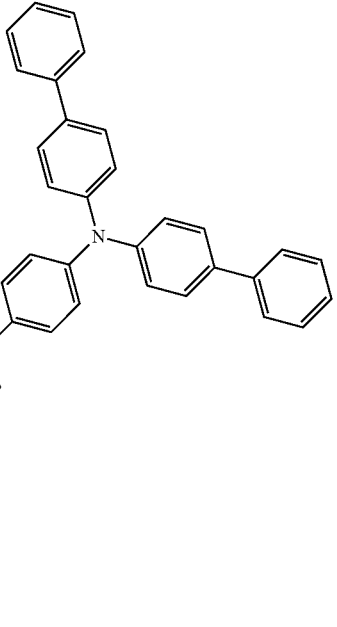

13
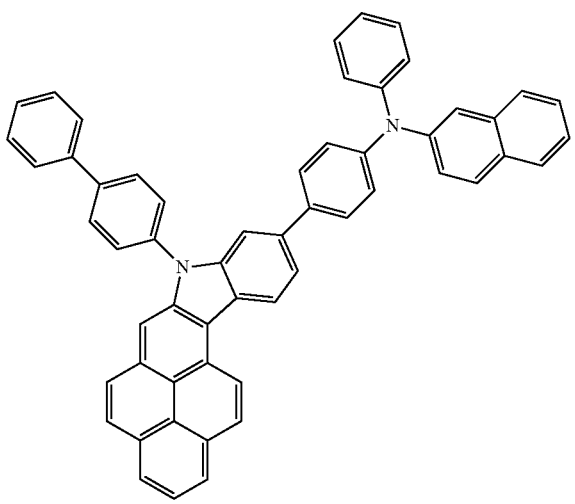
14
16
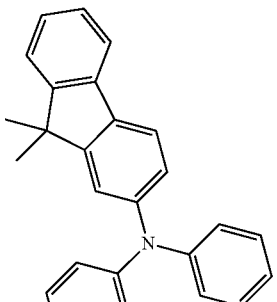
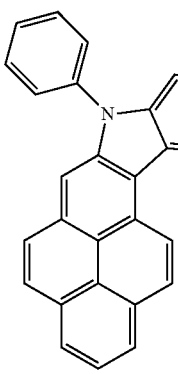
17
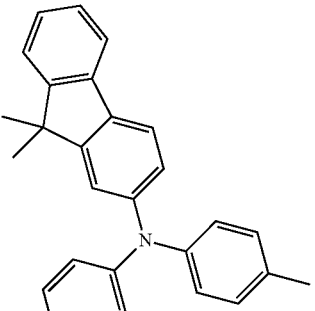
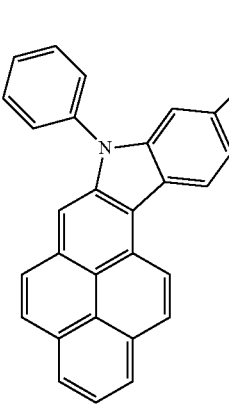

18
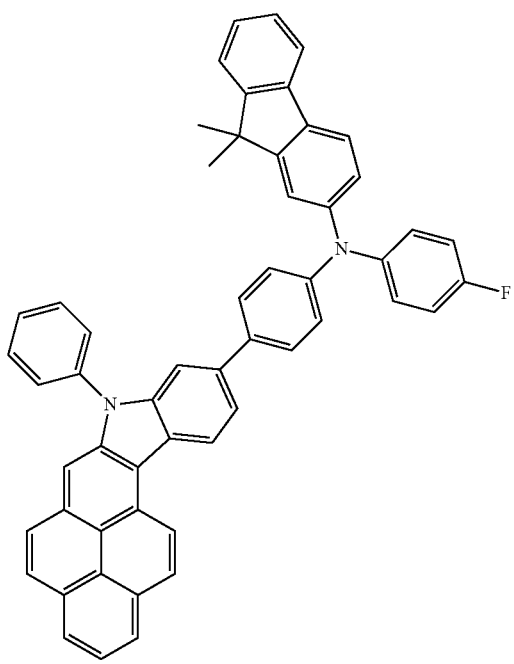
19
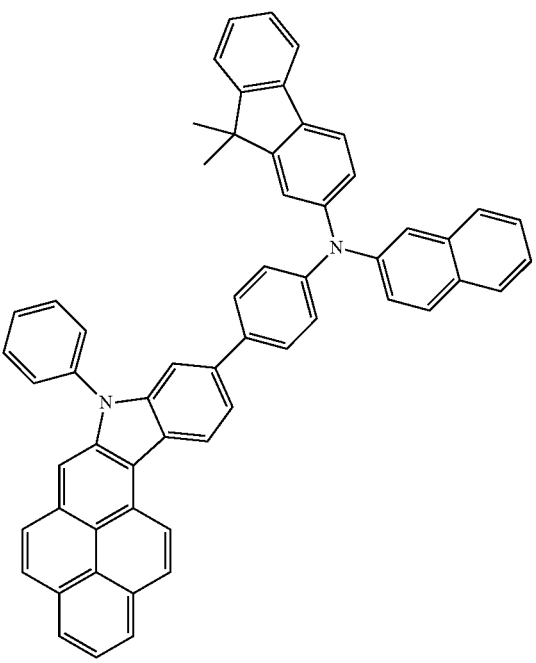
20
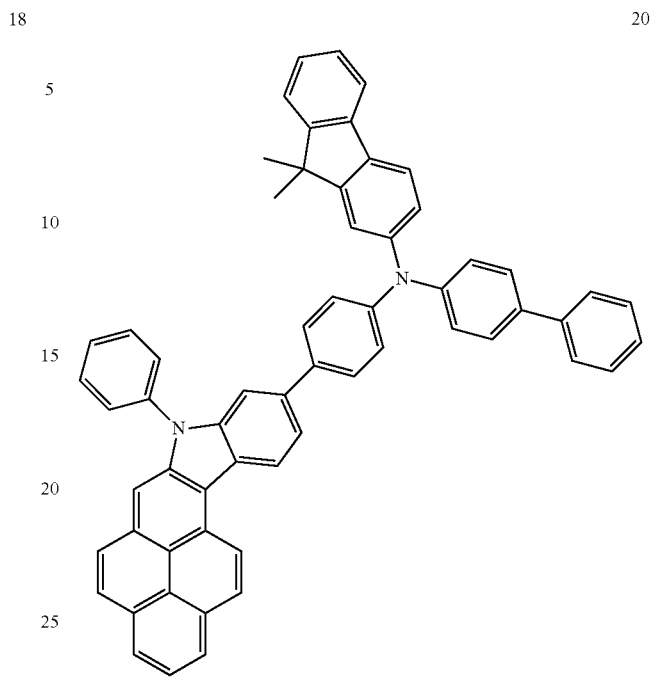
21
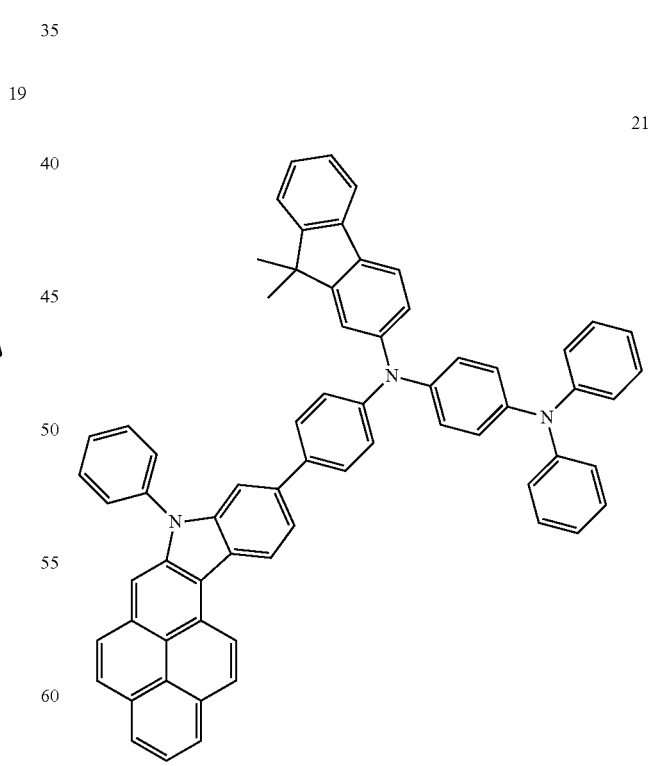

-continued
22
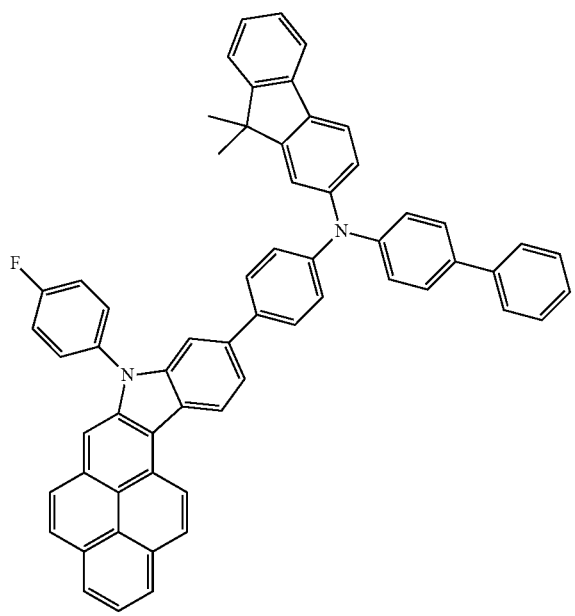
23
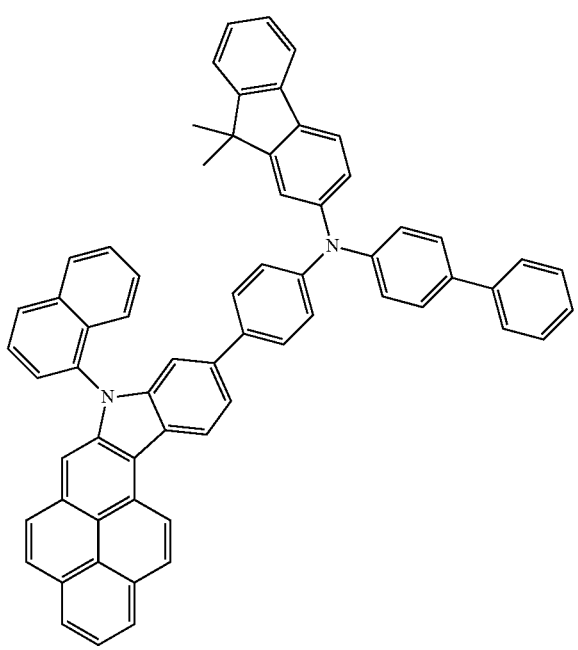
-continued
24
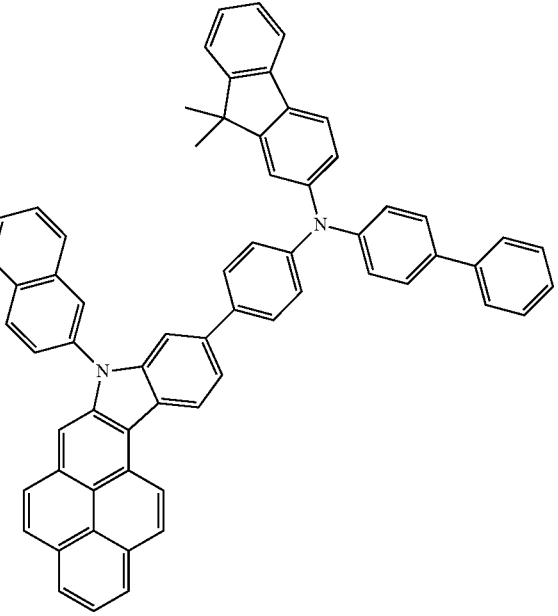
25
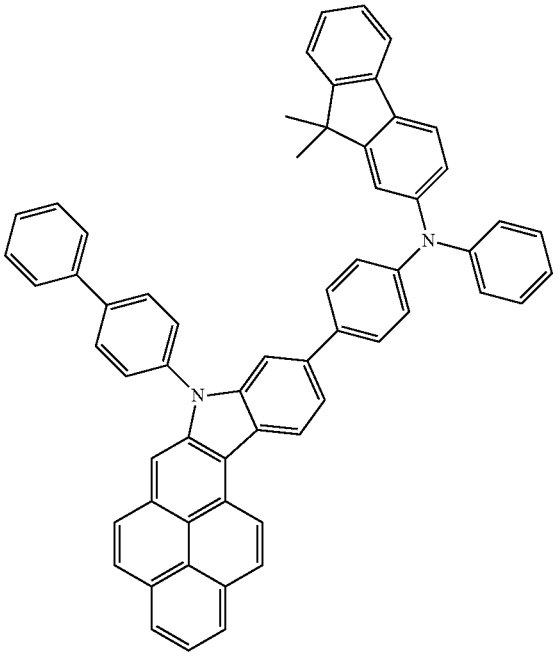

179
-continued
26
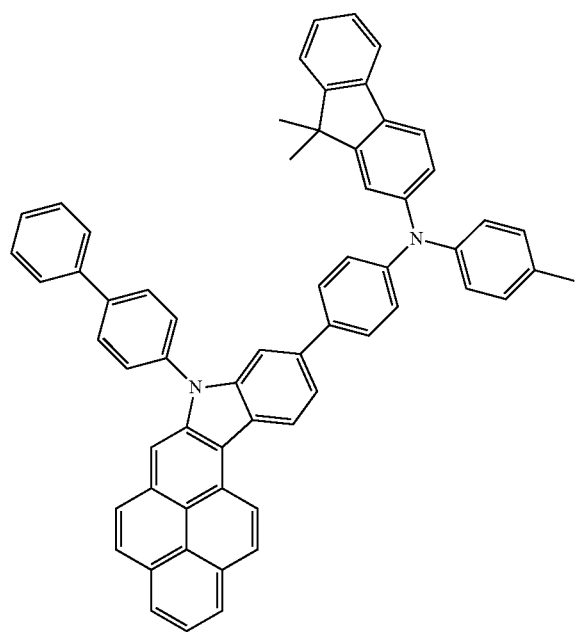
28
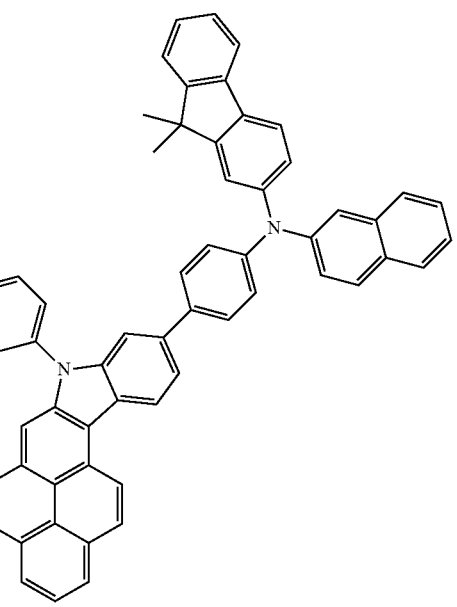
27
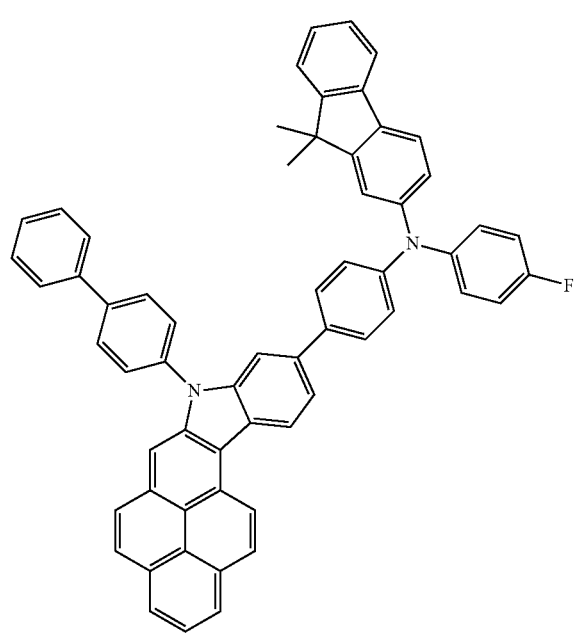
180
-continued
29
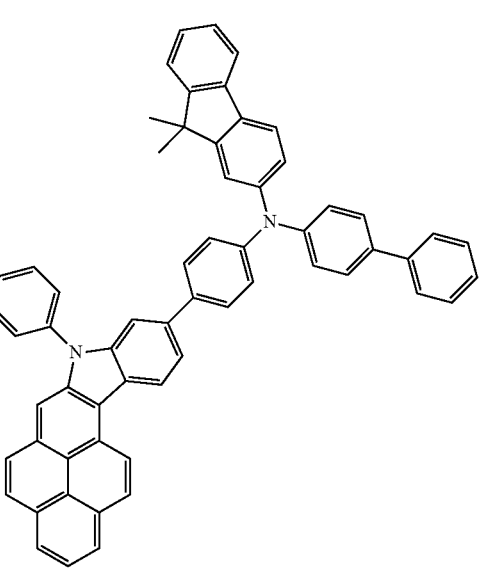

-continued
30
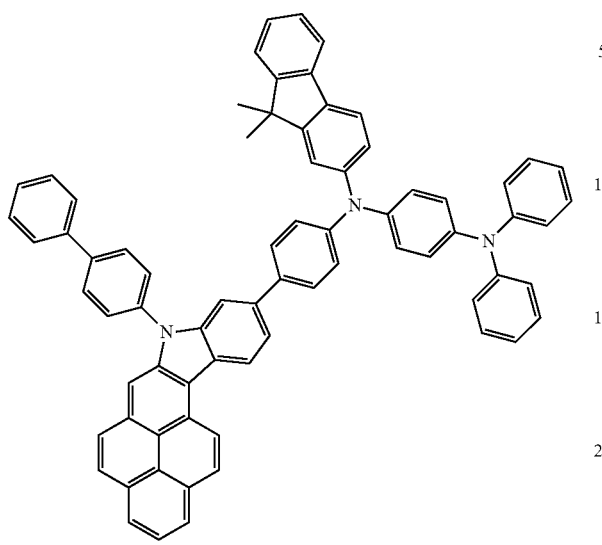
31
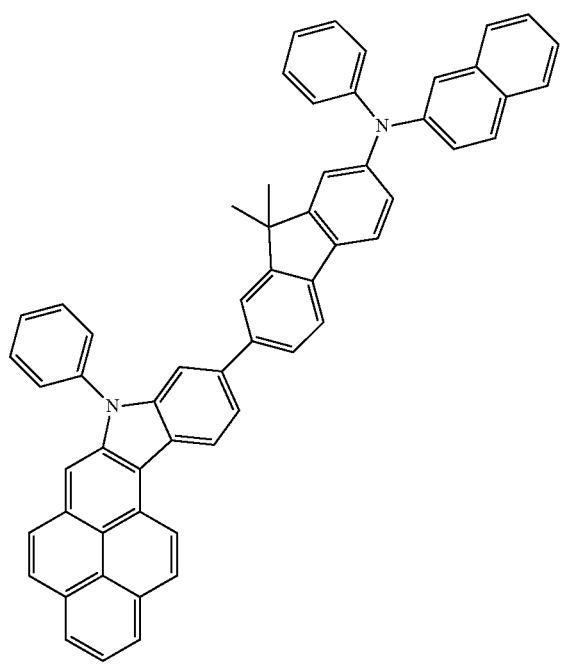
32
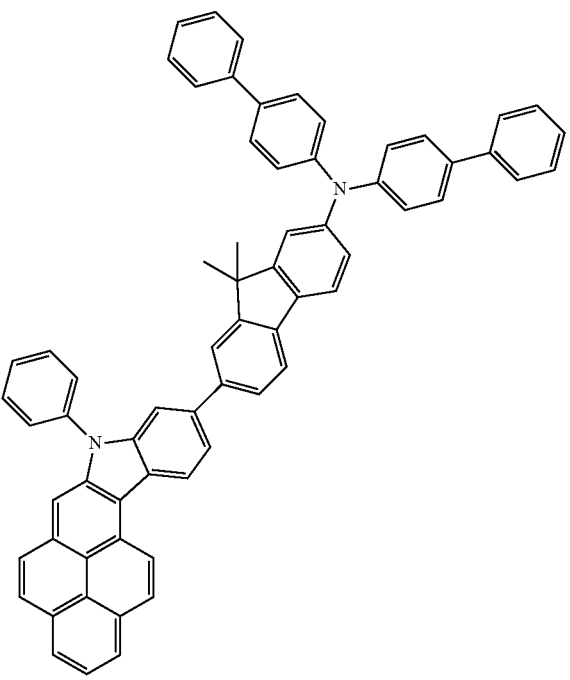
33
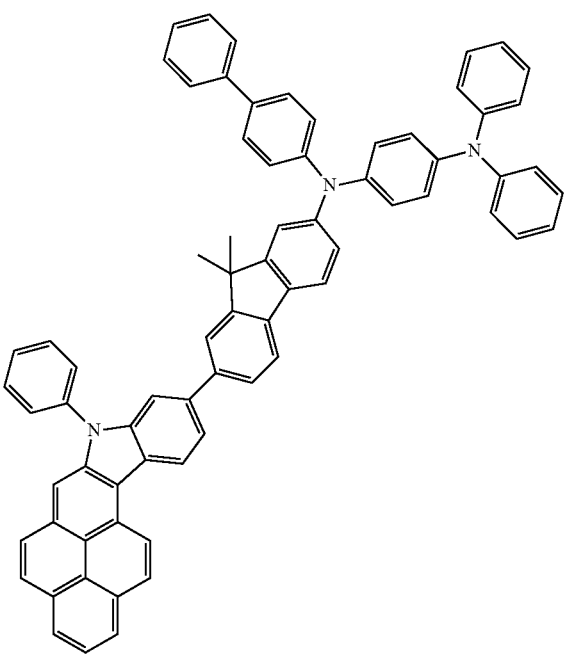

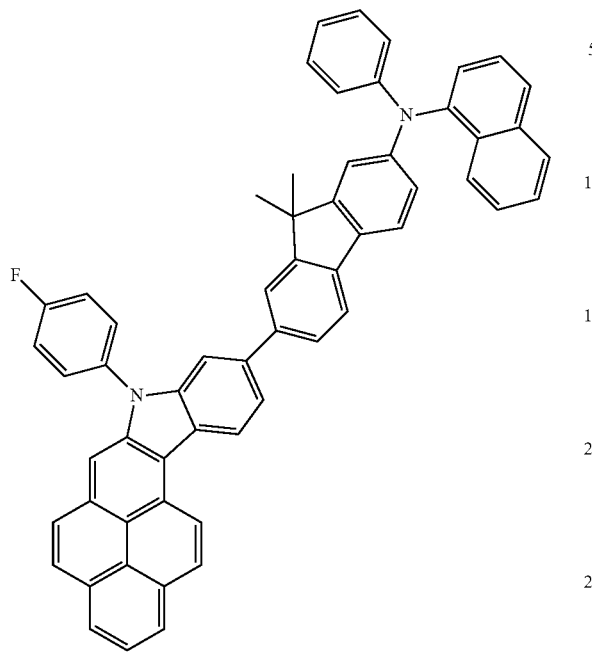
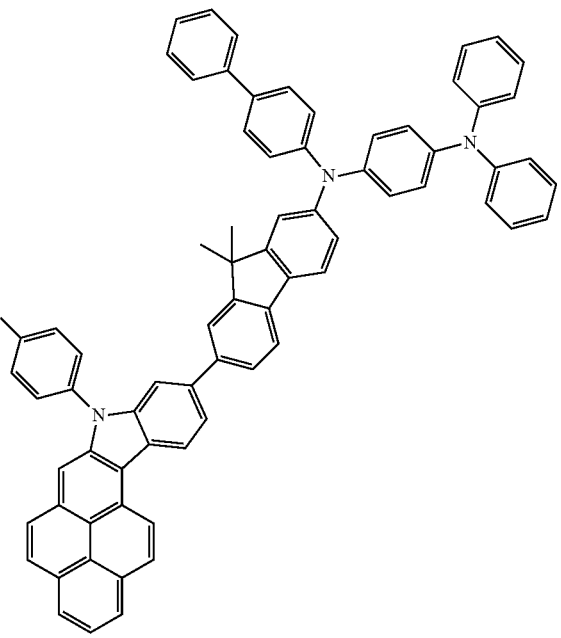
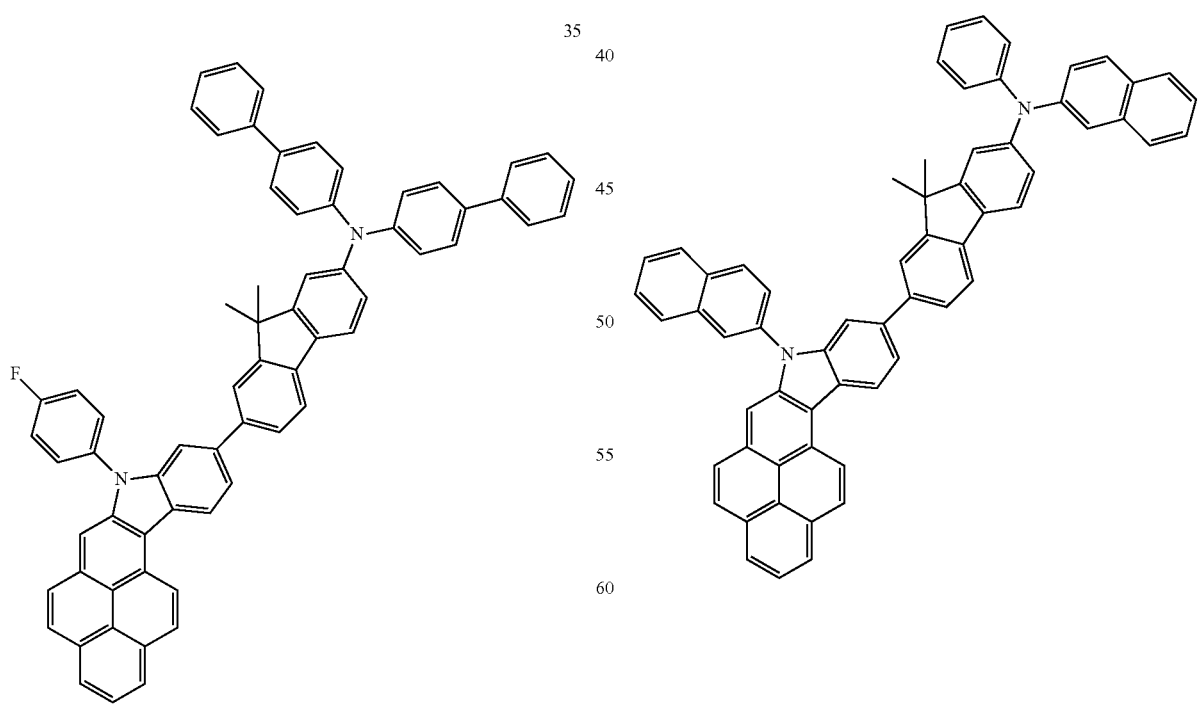

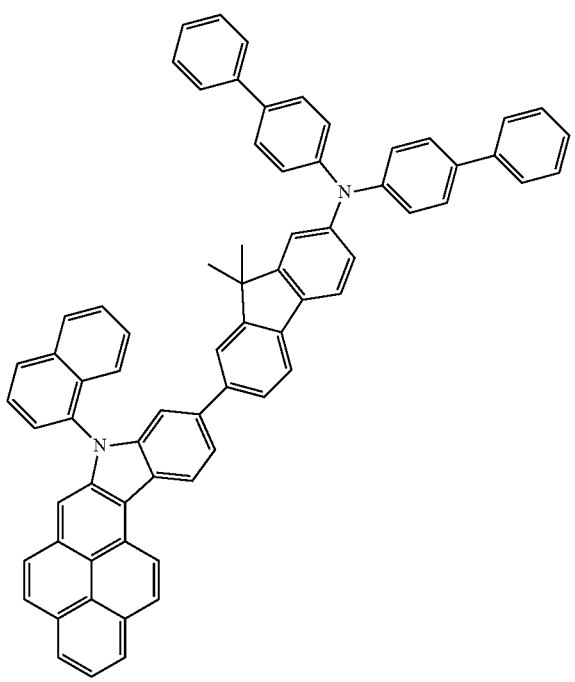
38
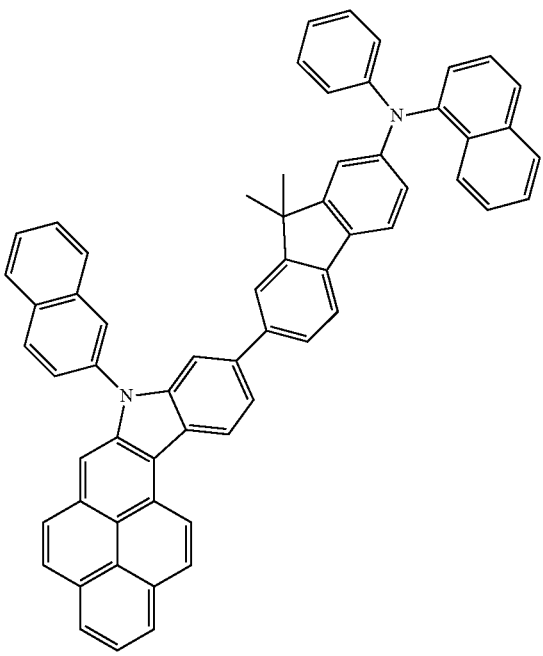
40
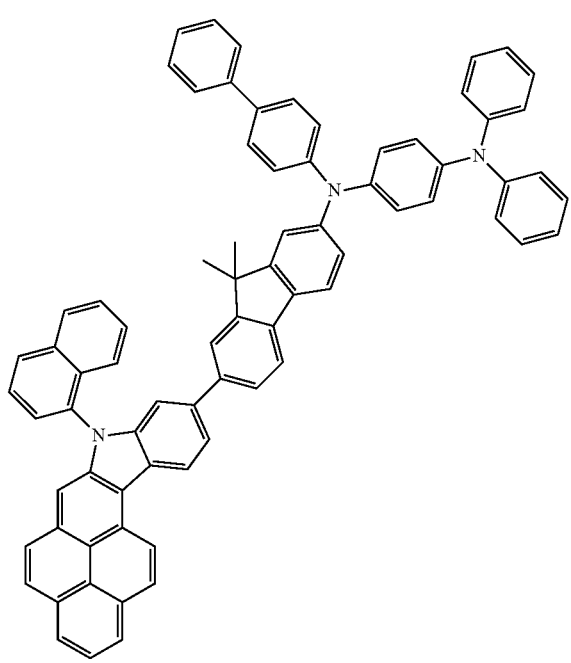
39
40
41

-continued

42

44

43

45

46
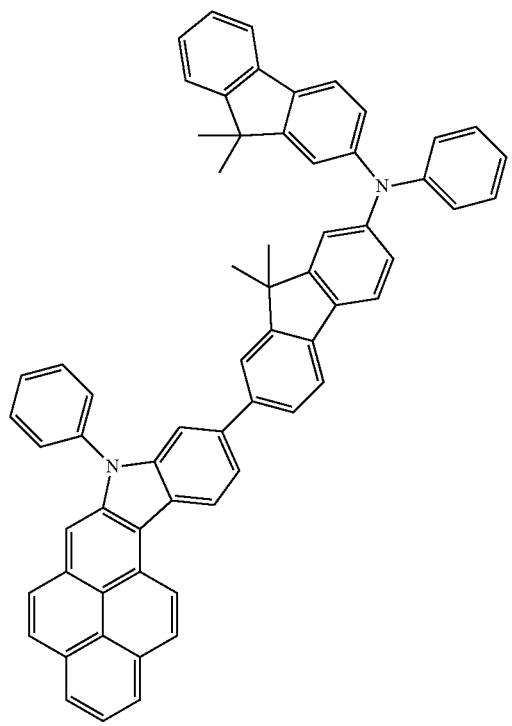
47
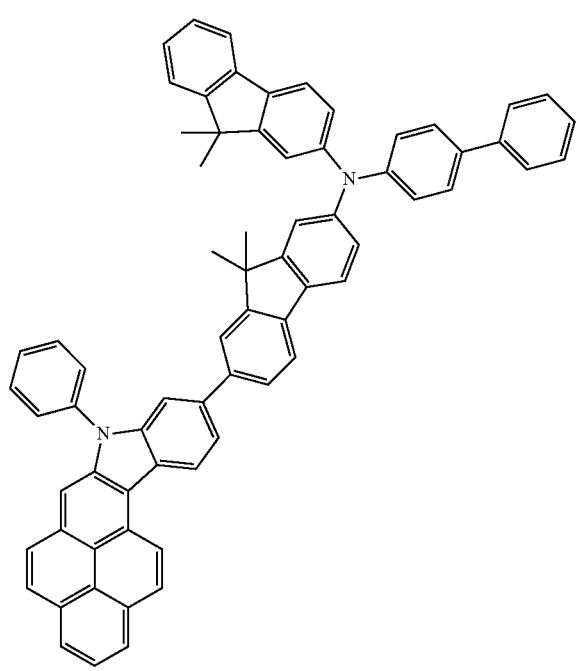
48
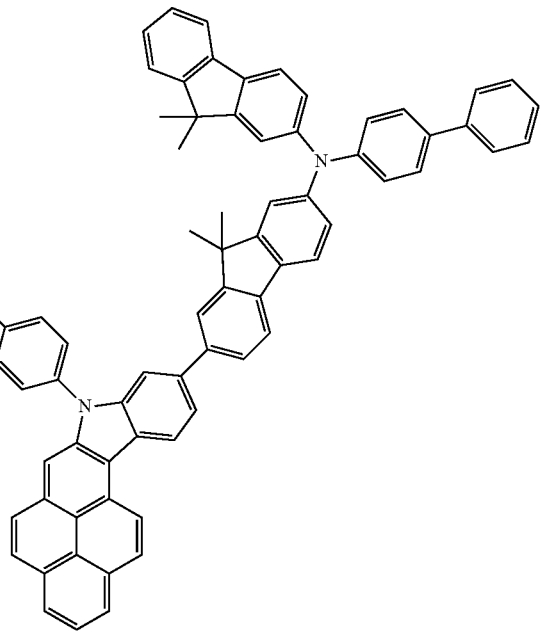
49
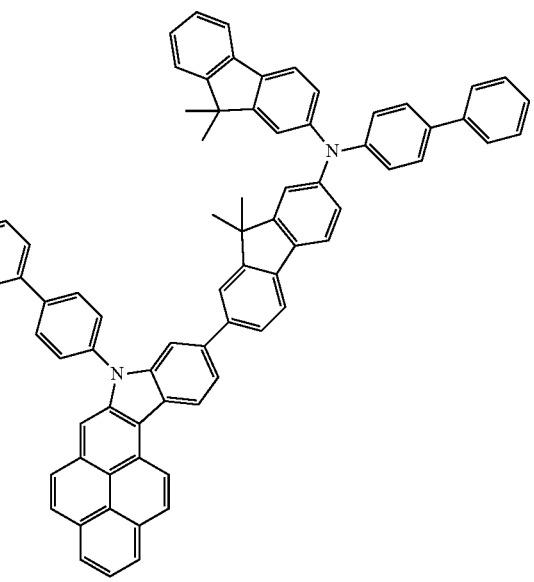

US 9,741,949 B2
191
-continued
192
-continued
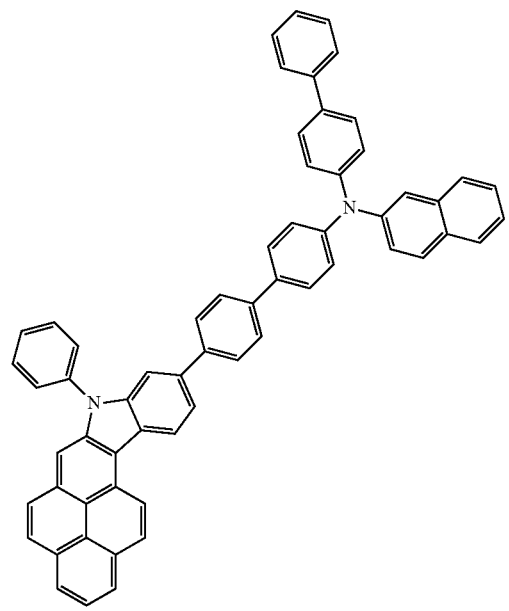
50
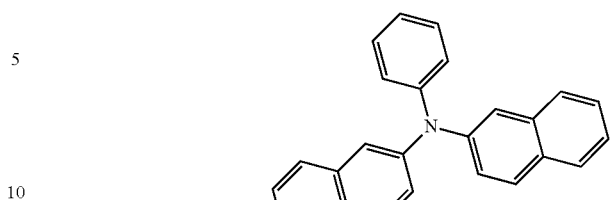
52
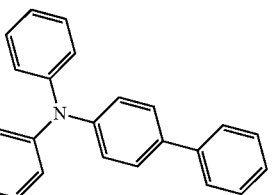
53
51
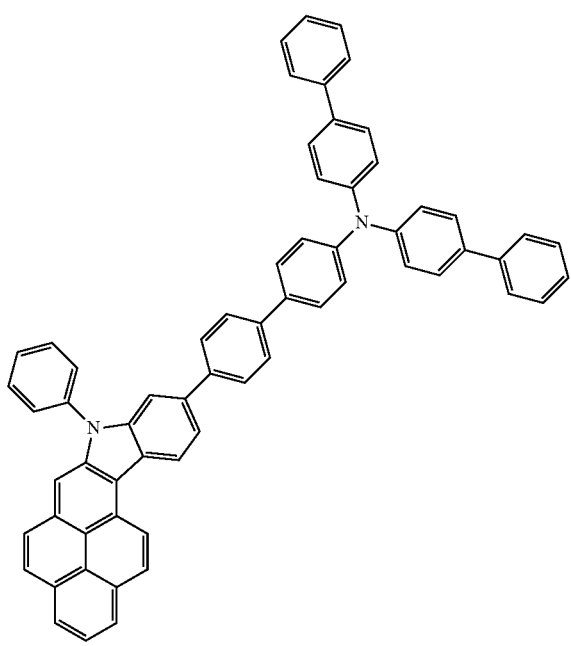
54

193
-continued
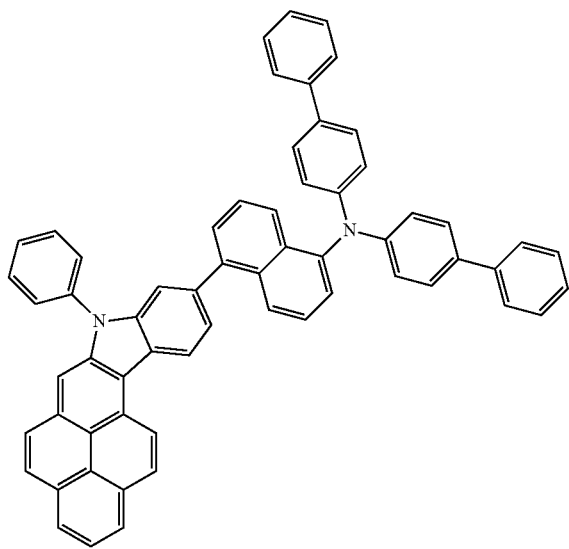
194
-continued
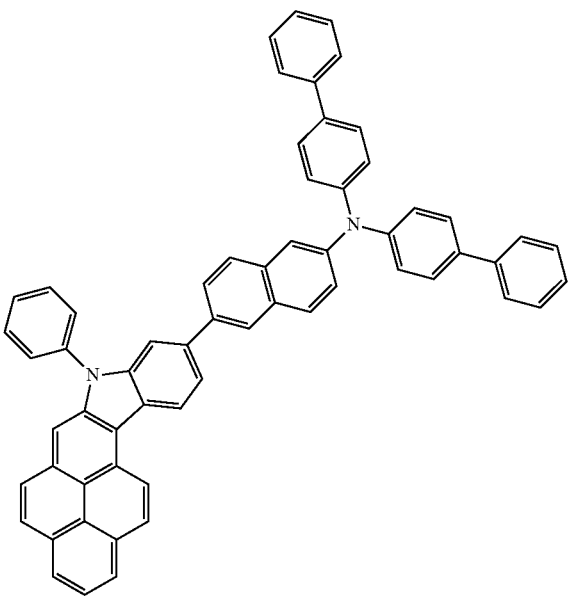
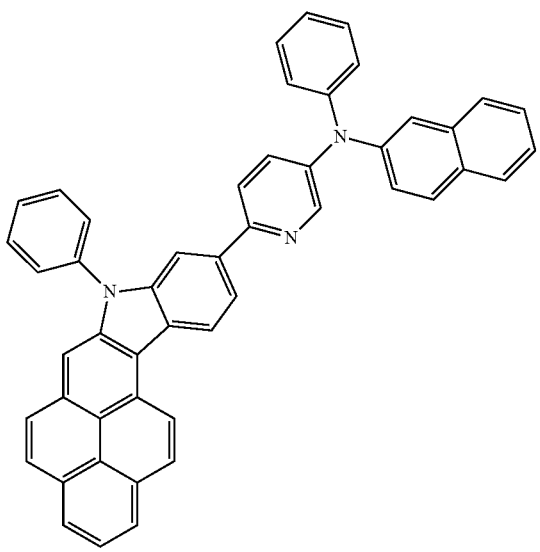
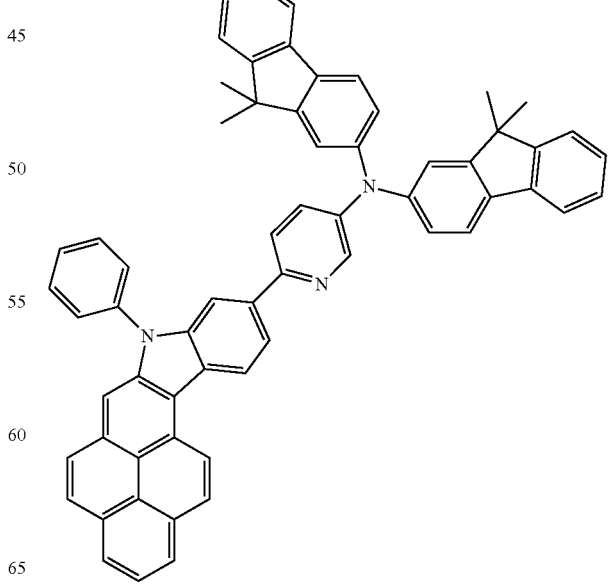

59
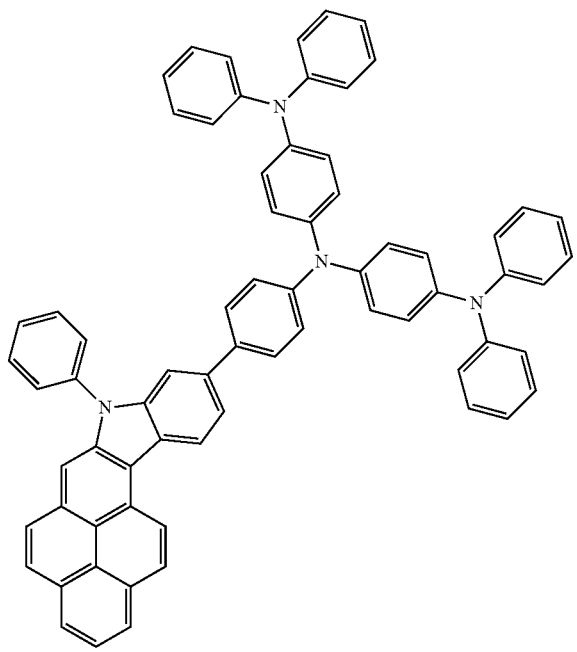
61
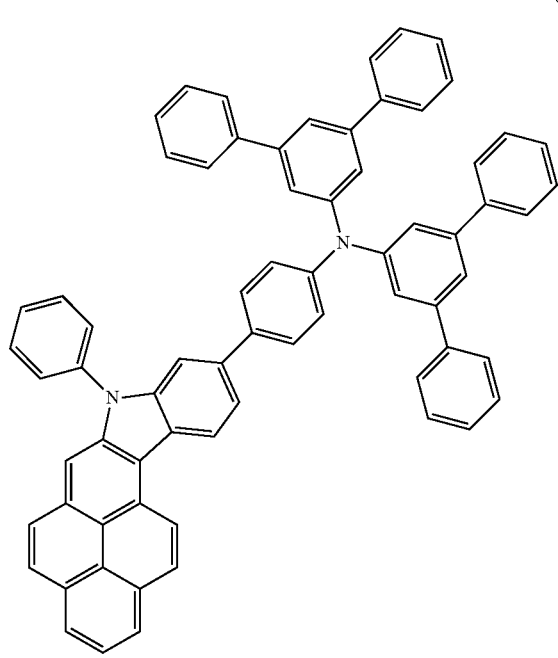
60
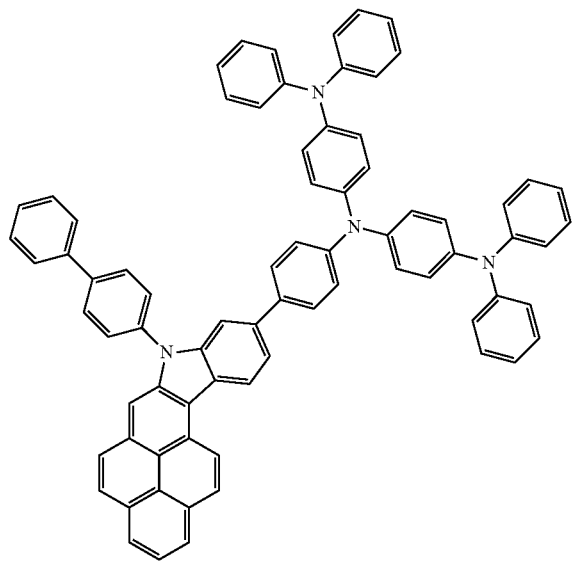
62
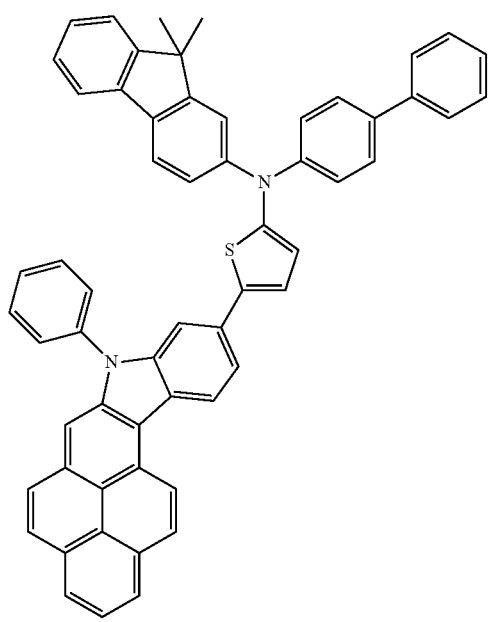

63
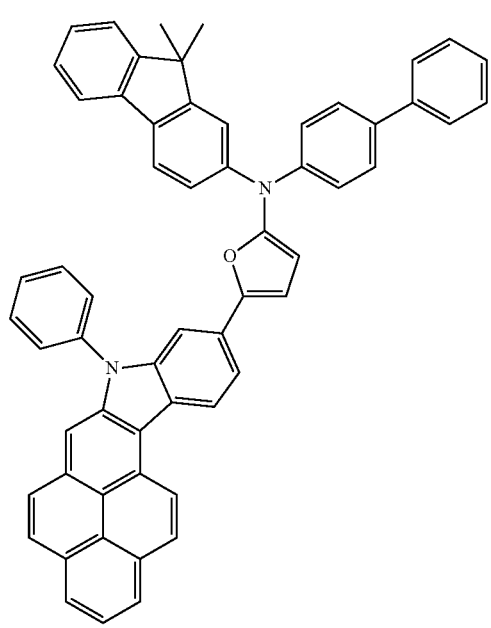
64
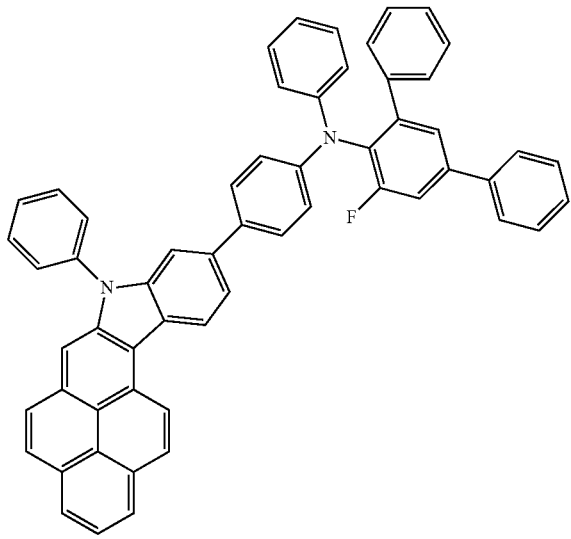
65
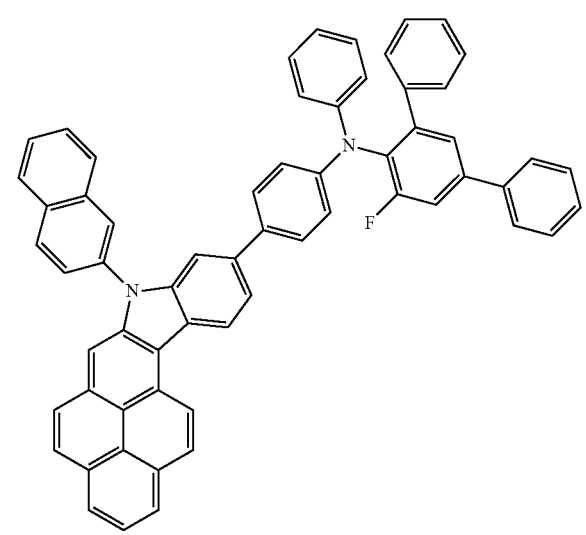
66
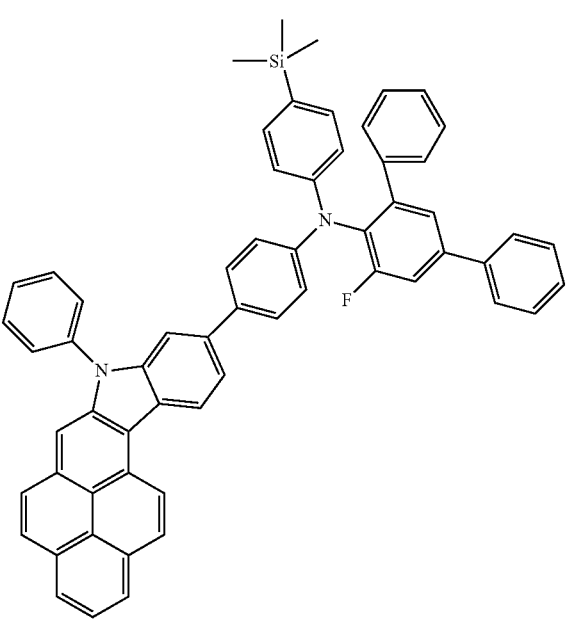

-continued

67
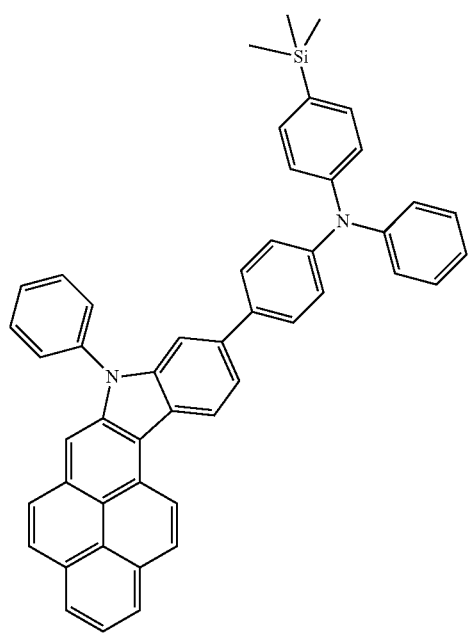

68
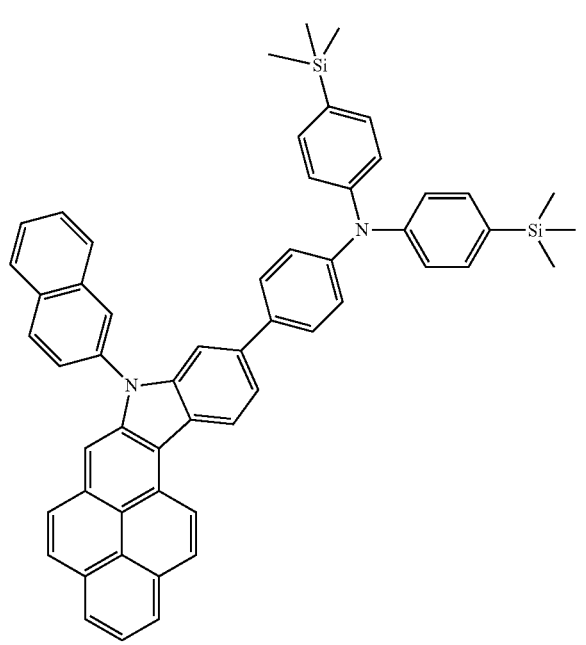

-continued

69
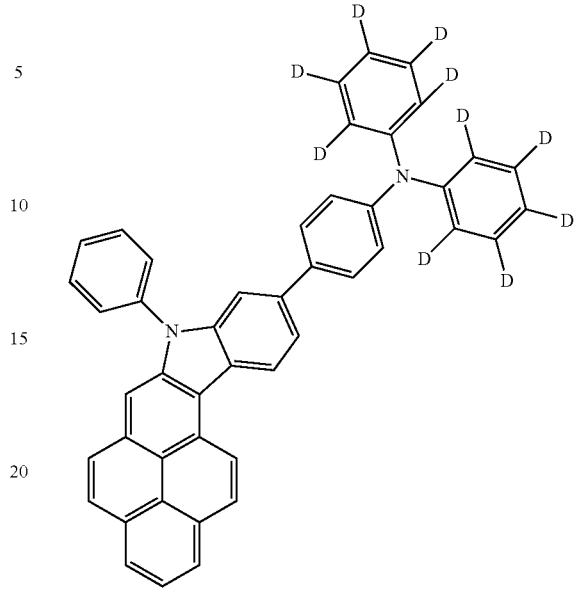

70
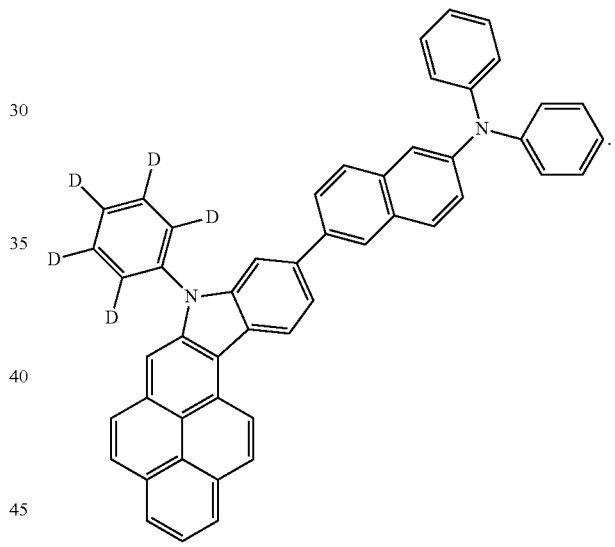

15. The organic light-emitting diode of claim 1, wherein the organic layer includes i) a hole transport region between the first electrode and the emission layer, and ii) an electron transport region between the emission layer and the second electrode, the hole transport region including at least one of a hole injection layer, a hole transport layer, a functional layer having both hole injection and hole transport capabilities, a buffer layer, and an electron blocking layer and the electron transport region including at least one of a hole blocking layer, an electron transport layer, and an electron injection layer.

16. The organic light-emitting diode of claim 1, wherein the amine-based compound is present in the emission layer.

17. The organic light-emitting diode of claim 16, wherein the amine-based compound in the emission layer acts as a dopant, and the emission layer further includes a host.

18. The organic light-emitting diode of claim 15, wherein the amine-based compound is present in the hole transport region.

19. The organic light-emitting diode of claim 15, wherein the amine-based compound is present in both the hole transport region and the emission layer, and the amine-based compound in the hole transport region differs from that in the emission layer.

* * * * *